US010261232B2

(12) United States Patent
Rodgers et al.

(10) Patent No.: US 10,261,232 B2
(45) Date of Patent: Apr. 16, 2019

(54) OPTICAL DEVICES AND SYSTEMS HAVING A CONVERGING LENS WITH AN INPUT CAVITY HAVING GROOVES FOLLOWING A SPLINE AND A FRUSTO-CONICAL REFLECTION SIDE SURFACE EXTENDING BETWEEN AN INPUT AND OUTPUT SURFACE OF THE CONVERGING LENS

(71) Applicant: EcoSense Lighting Inc., Los Angeles, CA (US)

(72) Inventors: Elizabeth Rodgers, Long Beach, CA (US); Paul Pickard, Acton, CA (US); Raghuram L. V. Petluri, Cerritos, CA (US); Robert Fletcher, Pasadena, CA (US)

(73) Assignee: ECOSENSE LIGHTING INC., Los Angeles, CA (US)

( * ) Notice: Subject to any disclaimer, the term of this patent is extended or adjusted under 35 U.S.C. 154(b) by 0 days.

(21) Appl. No.: 15/542,608

(22) PCT Filed: Aug. 10, 2016

(86) PCT No.: PCT/US2016/046245
§ 371 (c)(1),
(2) Date: Jul. 10, 2017

(87) PCT Pub. No.: WO2017/027540
PCT Pub. Date: Feb. 16, 2017

(65) Prior Publication Data
US 2018/0267223 A1 Sep. 20, 2018

Related U.S. Application Data

(60) Provisional application No. 62/202,936, filed on Aug. 10, 2015.

(51) Int. Cl.
F21V 8/00 (2006.01)
G02B 5/02 (2006.01)
(Continued)

(52) U.S. Cl.
CPC .............. *G02B 6/003* (2013.01); *F21K 9/68* (2016.08); *F21V 5/005* (2013.01); *F21V 5/007* (2013.01);
(Continued)

(58) Field of Classification Search
CPC .......... F21V 5/04; F21V 5/045; F21V 7/0091; F21V 13/04; G02B 6/003; F21Y 2115/10; F21K 9/68
See application file for complete search history.

(56) References Cited

U.S. PATENT DOCUMENTS 9,010,967 B2    4/2015  Jensen
9,255,688 B2 *  2/2016  Zollers .................... F21V 13/04
(Continued)

FOREIGN PATENT DOCUMENTS

EP      2383509 A1    11/2011
WO   2017027540 A1     2/2017

OTHER PUBLICATIONS

Rodgers, Elizabeth, et al., International Search Report and Written Opinion of the International Searching Authority, PCT/US2016/046245, dated Oct. 31, 2016, 9 pp.
(Continued)

Primary Examiner — Robert J May
(74) Attorney, Agent, or Firm — Jay M. Brown

(57) ABSTRACT

Lens device that includes converging lens having light output surface being spaced apart along lens axis from light input surface. Converging lens has total internal reflection side surface being spaced apart around lens axis and having frusto-conical shape extending between light input and
(Continued)

output surfaces of the converging lens. Portion of light input surface of converging lens includes light input cavity being bounded by perimeter and having central axis and being generally shaped as portion of spheroid. Light input cavity has plurality of grooves each respectively following spline along light input surface that intersects with central axis of light input cavity and with respective point on perimeter, wherein each of respective points are mutually spaced apart around perimeter of light input cavity. Lighting system including lens device.

77 Claims, 45 Drawing Sheets

(51) Int. Cl.

| | | |
|---|---|---|
| *H01L 33/58* | (2010.01) | |
| *F21V 5/00* | (2018.01) | |
| *F21V 5/04* | (2006.01) | |
| *F21V 7/00* | (2006.01) | |
| *F21K 9/68* | (2016.01) | |
| *H01L 33/54* | (2010.01) | |
| *F21Y 103/10* | (2016.01) | |
| *F21Y 115/10* | (2016.01) | |

(52) U.S. Cl.
CPC ............... *F21V 5/008* (2013.01); *F21V 5/04* (2013.01); *F21V 5/045* (2013.01); *F21V 7/0091* (2013.01); *G02B 5/0231* (2013.01); *G02B 6/0016* (2013.01); *G02B 6/0018* (2013.01); *G02B 6/0028* (2013.01); *H01L 33/54* (2013.01); *H01L 33/58* (2013.01); *F21Y 2103/10* (2016.08); *F21Y 2115/10* (2016.08)

(56) References Cited

U.S. PATENT DOCUMENTS

| | | |
|---|---|---|
| 9,500,323 B2 | 11/2016 | Wu |
| 9,632,295 B2 | 4/2017 | Castillo |
| 9,890,926 B2 | 2/2018 | Preston |
| 2009/0016057 A1 | 1/2009 | Rinko |
| 2011/0051394 A1 | 3/2011 | Bailey |

OTHER PUBLICATIONS

Elizabeth Rodgers et al., PCT/US2016/046245, "Optical Devices and Systems Having a Converging Lens With Grooves," International Preliminary Report on Patentability dated Feb. 22, 2018, 6pp.
Robert Dunlop, "Introduction to Catmull-Rom Splines," downloaded on Aug. 7, 2015 from http://www.mvps.org/directx/articles/catmull/, 2pp.

* cited by examiner

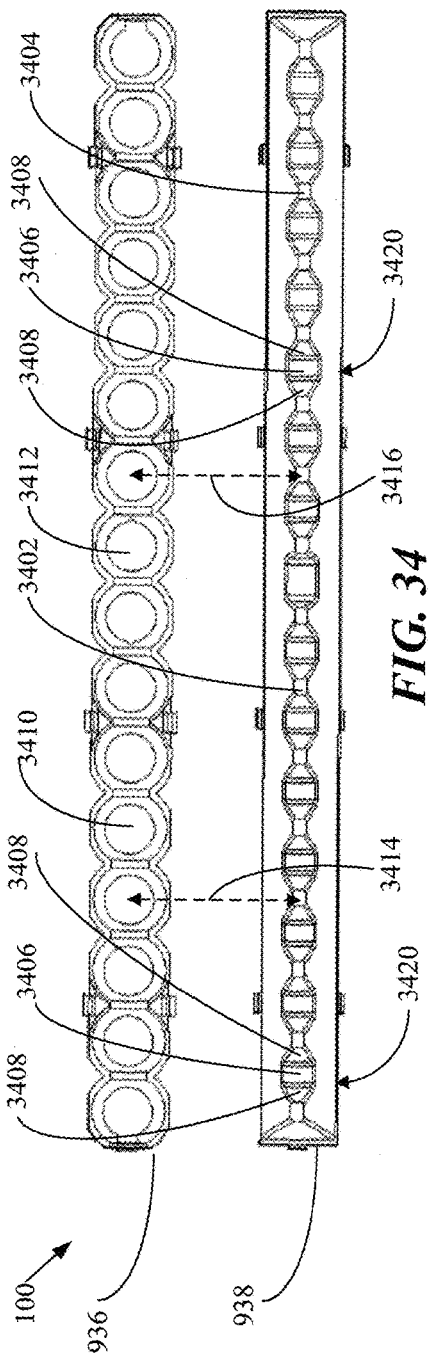
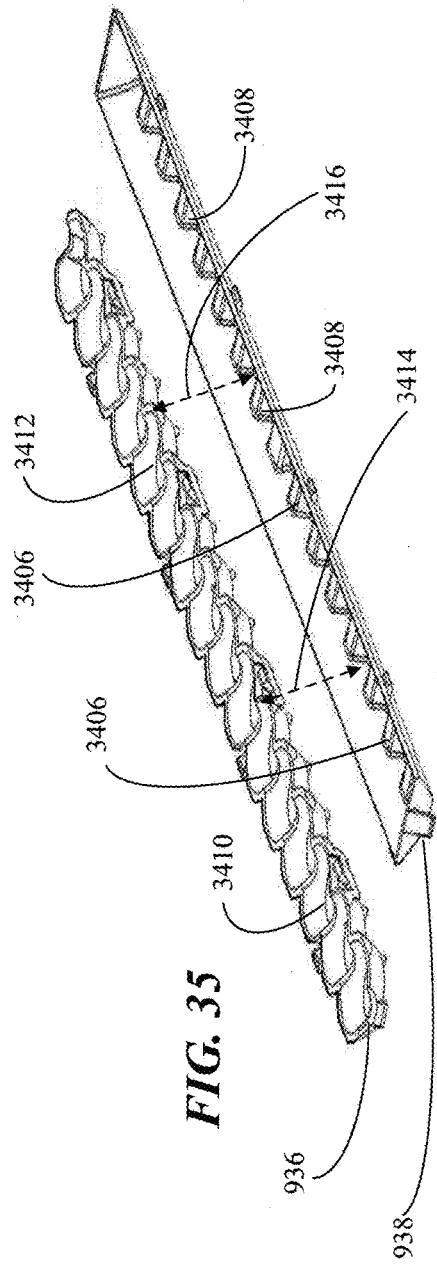
FIG. 34
FIG. 35

OPTICAL DEVICES AND SYSTEMS HAVING A CONVERGING LENS WITH AN INPUT CAVITY HAVING GROOVES FOLLOWING A SPLINE AND A FRUSTO-CONICAL REFLECTION SIDE SURFACE EXTENDING BETWEEN AN INPUT AND OUTPUT SURFACE OF THE CONVERGING LENS

BACKGROUND OF THE INVENTION

1. Field of the Invention

The present invention relates to: the field of lens devices; and the field of systems that include semiconductor light-emitting devices and lens devices.

2. Background of the Invention

Numerous lighting systems that include semiconductor light-emitting devices and lens devices have been developed. As examples, some of such lighting systems may include lens devices for controlling directions of propagation of light emitted by the semiconductor light-emitting devices. Despite the existence of these lighting systems and lens devices, further improvements are still needed in lens devices and in lighting systems that include semiconductor light-emitting devices and lens devices.

SUMMARY

In an example of an implementation, a lens device is provided that includes a converging lens having a light output surface being spaced apart along a lens axis from a light input surface, the converging lens further having a total internal reflection side surface being spaced apart around the lens axis and having a frusto-conical shape extending between the light input and output surfaces of the converging lens. In the example of a lens device, a portion of the light input surface of the converging lens includes a light input cavity being bounded by a perimeter, the light input cavity having a central axis and being generally shaped as a portion of a spheroid. Further in the lens device, the light input cavity has a plurality of grooves each respectively following a spline along the light input surface that intersects with the central axis of the light input cavity and with a respective point on the perimeter. Also in the example of the lens device, each of the respective points are mutually spaced apart around the perimeter of the light input cavity.

In some examples of the lens device, the plurality of the grooves may include at least four of the grooves that respectively may intersect with four of the plurality of the points being mutually spaced apart around the perimeter of the light input cavity.

In further examples of the lens device, the plurality of the grooves may include at least five of the grooves that respectively may intersect with five of the plurality of the points being mutually spaced apart around the perimeter of the light input cavity.

In additional examples of the lens device, the plurality of the grooves may include at least eight of the grooves that respectively may intersect with eight of the plurality of the points being mutually spaced apart around the perimeter of the light input cavity.

In other examples of the lens device, the plurality of the grooves may include: a first groove following a first spline that intersects with the central axis of the light input cavity and with a first point on the perimeter; and a second groove following a second spline that intersects with the central axis of the light input cavity and with a second point on the perimeter; and a third groove following a third spline that intersects with the central axis of the light input cavity and with a third point on the perimeter; and a fourth groove following a fourth spline that intersects with the central axis of the light input cavity and with a fourth point on the perimeter.

In some examples of the lens device, the same spline may be followed by each one of the plurality of the grooves.

In further examples of the lens device, the spline may include four control points.

In additional examples of the lens device, the spline may pass through each one of the four control points.

In other examples of the lens device, a first one of the four control points may be located at a one of the respective points on the perimeter; and a fourth one of the four control points may be located at the central axis of the light input cavity; and a second one of the four control points may be adjacent to the first control point; and a third one of the four control points may be adjacent to the fourth control point.

In some examples of the lens device, the spline may include a first inflection point and a second inflection point.

In further examples of the lens device, the first inflection point may be located at the second control point; and the second inflection point may be located at the third control point.

In additional examples of the lens device, the spline may span a spline axis extending between the first control point and the fourth control point; and the first inflection point may be located on one side of the spline axis; and the second inflection point may be located on an opposite side of the spline axis.

In other examples of the lens device, a straight arrow originating at the first control point and passing through the second control point may extend away from the spline axis at an angle being within a range of about 10 degrees and about 20 degrees.

In some examples of the lens device, a straight arrow originating at the second control point and passing through the third control point may extend away from the spline axis at an angle being within a range of about 55 degrees and about 45 degrees.

In further examples of the lens device, the spline may be a Catmull-Rom spline.

In additional examples of the lens device, the plurality of the grooves may be mutually spaced apart around the perimeter.

In other examples of the lens device, each one of the plurality of the grooves may intersect with the central axis of the light input cavity and with the perimeter.

In some examples of the lens device, the light input cavity may include a plurality of un-grooved regions being mutually spaced apart around the perimeter; and each one of the plurality of the grooves may be interposed between two of the plurality of the un-grooved regions of the light input cavity.

In further examples of the lens device, the light input cavity may include a plurality of raised regions being mutually spaced apart around the perimeter; and each one of the plurality of the grooves may be interposed between two of the plurality of the raised regions of the light input cavity.

In additional examples of the lens device, each one of the plurality of the raised regions may intersect with the central axis and with the perimeter.

In other examples of the lens device, each one of the plurality of the grooves may form a respective concave surface of the light input cavity, each of the respective concave surfaces being generally shaped as a portion of an ellipse having an ellipse axis being extended along the spline.

In some examples of the lens device, each one of the plurality of the grooves may form a respective concave surface of the light input cavity, each of the respective concave surfaces being generally shaped as a portion of a circle having a circle axis being extended along the spline.

In further examples of the lens device, each of the respective concave surfaces may have a respective radius, and the respective radii may have lengths that vary along the spline.

In additional examples of the lens device, a length of each of the respective radii at the intersection of the spline with the perimeter may be greater than another length of each of the respective radii at the intersection of the spline with the central axis of the light input cavity.

In other examples of the lens device, the lengths of each of the respective radii may gradually decrease from the intersection of the spline with the perimeter to the intersection of the spline with the central axis of the light input cavity.

In some examples of the lens device, the length of each of the respective radii at the intersection of the spline with the perimeter may be within a range of between about 2 millimeters and about 1.5 millimeters; and the another length of each of the respective radii at the intersection of the spline with the central axis of the light input cavity may be within a range of between about 0.75 millimeter and about 0.25 millimeter.

In further examples of the lens device, the light output surface of the converging lens may include a bowl-shaped cavity.

In additional examples of the lens device, the light output surface of the converging lens may include the bowl-shaped cavity as surrounding a central mound shaped as a portion of a spheroid.

In other examples, the lens device may be configured for emitting light having a full width half maximum beam width being within a range of between about 13 degrees and about 16 degrees.

In some examples, the lens device may be configured for emitting light having a full width half maximum beam width being about 15 degrees.

As another example of an implementation, a lighting system is provided, that includes a lighting module having a first lens module. In the example of the lighting system, the lighting module includes a semiconductor light-emitting device configured for emitting light emissions along a central light emission axis. The first lens module in the example of the lighting system includes a first converging lens having a light output surface being spaced apart along a lens axis from a light input surface, the converging lens further having a total internal reflection side surface being spaced apart around the lens axis and having a frusto-conical shape extending between the light input and output surfaces of the converging lens. Also in the converging lens of the example lighting system, a portion of the light input surface includes a light input cavity being bounded by a perimeter, the light input cavity having a central axis and being generally shaped as a portion of a spheroid. In addition in this example of the lighting system, the light input cavity has a plurality of grooves each respectively following a spline along the light input surface that intersects with the central axis of the light input cavity and with a respective point on the perimeter; and each of the respective points are mutually spaced apart around the perimeter of the light input cavity. Further, this example of the lighting system is configured for aligning the lens axis with the central light emission axis.

In some examples, the lighting system may include another lighting module including another semiconductor light-emitting device configured for emitting light emissions along another central light emission axis. Further in those examples, the lighting system may include a second lens module including a second converging lens having another light output surface being spaced apart along another lens axis from a light input surface, the second converging lens further having a total internal reflection side surface being spaced apart around the another lens axis and having a frusto-conical shape extending between the light input and output surfaces of the second converging lens. As examples of the lighting system, a portion of the light input surface of the second converging lens may include a second light input cavity being bounded by a perimeter, the second light input cavity having a central axis and being generally shaped as a portion of a spheroid. Further in the example of the lighting system, the light input cavity may have a plurality of grooves each respectively following a spline along the light input surface that intersects with the central axis of the second light input cavity and with a respective point on the perimeter; and each of the respective points may be mutually spaced apart around the perimeter of the second light input cavity. Also in the example, the lighting system may be configured for aligning the another lens axis with the another central light emission axis.

In another example of an implementation, a lighting system is provided that includes: a lighting module including a semiconductor light-emitting device ("SLED"); a first lens module; a second lens module; and a third lens module. In this example of the lighting system, the SLED is configured for emitting light emissions along a central light emission axis; and the first, second and third lens modules respectively have first, second and third lens axes. Further in this example of an implementation, the lighting system is configured: for detachably installing the first lens module or the second lens module in the lighting module between the semiconductor light-emitting device and the third lens module; and for aligning the first or second lens axis with the central light emission axis and the third lens axis. The first lens module in this example of the lighting system includes a first converging lens being configured for causing convergence of some of the light emissions of the semiconductor light-emitting device to form converged light emissions along the central light emission axis having a first half-width-half-maximum (HWHM), the first converging lens having a first light output surface being spaced apart along the first lens axis from a first light input surface, the first converging lens further having a first total internal reflection side surface being spaced apart around the first lens axis and having a first frusto-conical shape extending between the first light input and output surfaces of the first converging lens. The second lens module in this example of the lighting system includes a second converging lens being configured for causing convergence of some of the light emissions of the semiconductor light-emitting device to form converged light emissions along the central light emission axis having a second HWHM being different than the first HWHM, the second converging lens having a second light output surface being spaced apart along the second lens axis from a second light input surface, the second converging lens further having a second total internal reflection side surface being spaced apart around the second lens axis and having a second frusto-conical shape extending between the second light input and output surfaces of the second converging lens. The third lens module in this example of the lighting system includes a first diverging lens having a third lens axis, the first diverging lens being configured for causing divergence of some of the converged light emissions away from the third lens axis by a third HWHM to form diverged light emissions that diverge away from the central light emission axis, the first diverging lens having a third light output surface being spaced apart along the third lens axis from a third light input surface, the third light input surface including a first lens screen having lenticular or microprismatic features.

In some examples, the lighting system may further include an additional lens module including an additional diverging lens having an additional lens axis, the additional diverging lens being configured for causing divergence of some of the converged light emissions away from the additional lens axis by an additional HWHM being different than the third HWHM to form additional diverged light emissions that diverge away from the central light emission axis, the additional diverging lens having an additional light output surface being spaced apart along the additional lens axis from an additional light input surface, the additional light input surface including an additional lens screen having lenticular or microprismatic features; and the lighting system may be configured for detachably installing the first lens module or the second lens module in the lighting module between the semiconductor light-emitting device and the additional lens module; and the lighting system may be configured for aligning the first or second lens axis with the central light emission axis and the additional lens axis.

In further examples, the lighting system may be configured for interchangeably installing either the first lens module or the second lens module in the lighting module between the semiconductor light-emitting device and either the third lens module or the additional lens module.

In additional examples of the lighting system, the lighting module may include another semiconductor light-emitting device being configured for emitting light emissions along the central light emission axis.

In other examples of the lighting system, the lighting module may include a plurality of additional semiconductor light-emitting devices, and the semiconductor light-emitting device and the plurality of the additional semiconductor light-emitting devices may be collectively arranged around and configured for emitting light emissions along the central light emission axis.

In some examples of the lighting system, the first converging lens may be configured for causing convergence of some of the light emissions of the semiconductor light-emitting device to form the converged light emissions as having the first HWHM being about 3.5 degrees, and the first light input surface of the first converging lens may include a central cavity being shaped as a portion of a spheroid, and the first light output surface of the first converging lens may include a bowl-shaped cavity surrounding a central mound shaped as a portion of a spheroid.

In further examples of the lighting system, the first converging lens may be configured for causing convergence of some of the light emissions of the semiconductor light-emitting device to form the converged light emissions as having the first HWHM being about 7.5 degrees, and the first light input surface of the first converging lens may include a central cavity being shaped as a portion of a spheroid, and the first light output surface of the first converging lens may include a bowl-shaped cavity surrounding a central mound shaped as a portion of a spheroid.

In additional examples of the lighting system, the first converging lens may be configured for causing convergence of some of the light emissions of the semiconductor light-emitting device to form the converged light emissions as having the first HWHM being about 12.5 degrees, and the first light input surface of the first converging lens may include a central disk-shaped cavity, and the first light output surface of the first converging lens may include a bowl-shaped cavity surrounding a central mound shaped as a portion of a spheroid.

In other examples of the lighting system, the first converging lens may be configured for causing convergence of some of the light emissions of the semiconductor light-emitting device to form the converged light emissions as having the first HWHM being about 20 degrees, and the first light input surface of the first converging lens may include a central compound parabolic concentrator, and the first light output surface of the first converging lens may include a bowl-shaped cavity surrounding a central flat region.

In some examples of the lighting system, the first diverging lens may be configured for causing divergence of some of the converged light emissions away from the third lens axis by a third HWHM being about 4 degrees.

In further examples of the lighting system, the first diverging lens may be configured for causing divergence of some of the converged light emissions away from the third lens axis by a third HWHM being about 10 degrees.

In additional examples of the lighting system, the first diverging lens may be configured for causing divergence of some of the converged light emissions away from the third lens axis by a third HWHM being about 15 degrees.

In other examples of the lighting system, the first diverging lens may be configured for causing divergence of some of the converged light emissions away from the third lens axis by a third HWHM being about 25 degrees.

In some examples of the lighting system, the first diverging lens may be configured for causing divergence of some of the converged light emissions away from the third lens axis by a third HWHM being about 30 degrees.

In further examples of the lighting system, the first diverging lens may have the first lens screen as including an array of lenticular toroidal lenses.

In other examples of the lighting system, the first converging lens may have a first diameter transverse to the first lens axis at the first light input surface, and the first converging lens may have a second diameter transverse to the first lens axis at the first light output surface, and the first diameter may be smaller than the second diameter.

In some examples, the lighting system may further include a housing being configured for positioning the lighting module for emission of the light emissions from the semiconductor light-emitting device along the central light emission axis.

In further examples, the lighting system may further include a carrier being configured for positioning the first or second lens module in the housing with the first or second lens axis being aligned with the central light emission axis.

In other examples, the lighting system may further include a primary visible light reflector configured for being positioned between the housing and the carrier, and the primary visible light reflector may be configured for redirecting some of the light emissions of the semiconductor light-emitting device along the central light emission axis.

In some examples, the lighting system may include: a second lighting module; and fourth, fifth, and sixth lens modules. The second lighting module may include a second semiconductor light-emitting device configured for emitting further light emissions along a second central light emission axis. The fourth lens module may include a third converging lens, the third converging lens being configured for causing convergence of some of the light emissions of the second semiconductor light-emitting device to form further converged light emissions along the second central light emission axis having a fourth HWHM, the third converging lens having a fourth light output surface being spaced apart along a fourth lens axis from a fourth light input surface, the third converging lens further having a third total internal reflection side surface being spaced apart around the fourth lens axis and having a third frusto-conical shape extending between the fourth light input and output surfaces of the third converging lens. The fifth lens module may include a fourth converging lens, the fourth converging lens being configured for causing convergence of some of the light emissions of the second semiconductor light-emitting device to form further converged light emissions along the second central light emission axis having a fifth HWHM being different than the fourth HWHM, the fourth converging lens having a fifth light output surface being spaced apart along a fifth lens axis from a fifth light input surface, the fourth converging lens further having a fourth total internal reflection side surface being spaced apart around the fifth lens axis and having a fourth frusto-conical shape extending between the fifth light input and output surfaces of the fourth converging lens. The sixth lens module may include a second diverging lens having a sixth lens axis, the second diverging lens being configured for causing divergence of some of the converged light emissions away from the sixth lens axis by a sixth HWHM to form diverged light emissions, the second diverging lens having a sixth light output surface being spaced apart along the sixth lens axis from a sixth light input surface, the sixth light input surface may include a second lens screen having lenticular or microprismatic features. The lighting system may be configured for detachably installing the fourth lens module or the fifth lens module in the second lighting module between the second semiconductor light-emitting device and the sixth lens module; and the lighting system may be configured for aligning the fourth or fifth lens axis with the second central light emission axis and the sixth lens axis.

In further examples of the lighting system, the second lighting module may include another semiconductor light-emitting device being configured for emitting light emissions along the second central light emission axis.

In additional examples of the lighting system, the second lighting module may include a plurality of additional semiconductor light-emitting devices, and the second semiconductor light-emitting device and the plurality of the additional semiconductor light-emitting devices may be collectively arranged around and configured for emitting light emissions along the second central light emission axis.

In other examples of the lighting system, the third converging lens may be configured for causing convergence of some of the light emissions of the second semiconductor light-emitting device to form the further converged light emissions as having the fourth HWHM being about 3.5 degrees, and the fourth light input surface of the third converging lens may include a second central cavity being shaped as a portion of a spheroid, and the fourth light output surface of the third converging lens may include a second bowl-shaped cavity surrounding a second central mound shaped as a portion of a spheroid.

In some examples of the lighting system, the third converging lens may be configured for causing convergence of some of the light emissions of the second semiconductor light-emitting device to form the further converged light emissions as having the fourth HWHM being about 7.5 degrees, and the fourth light input surface of the third converging lens may include a second central cavity being shaped as a portion of a spheroid, and the fourth light output surface of the third converging lens may include a second bowl-shaped cavity surrounding a second central mound shaped as a portion of a spheroid.

In further examples of the lighting system, the third converging lens may be configured for causing convergence of some of the light emissions of the second semiconductor light-emitting device to form the further converged light emissions as having the fourth HWHM being about 12.5 degrees, and the fourth light input surface of the third converging lens may include a second central disk-shaped cavity, and the fourth light output surface of the third converging lens may include a second bowl-shaped cavity surrounding a second central mound shaped as a portion of a spheroid.

In additional examples of the lighting system, the third converging lens may be configured for causing convergence of some of the light emissions of the second semiconductor light-emitting device to form the further converged light emissions as having the fourth HWHM being about 20 degrees, and the fourth light input surface of the third converging lens may include a second central compound parabolic concentrator, and the fourth light output surface of the third converging lens may include a second bowl-shaped cavity surrounding a second central flat region.

In other examples of the lighting system, the third converging lens may have a third diameter transverse to the fourth lens axis at the fourth light input surface, and the third converging lens may have a fourth diameter transverse to the fourth lens axis at the fourth light output surface, and the fourth diameter may be smaller than the fifth diameter.

In some examples of the lighting system, the second diverging lens may have the second screen as including an array of lenticular toroidal lenses.

In further examples, the lighting system may be configured for positioning the semiconductor light-emitting device as being spaced apart on a longitudinal axis away from the second semiconductor light-emitting device for causing the central light emission axis to be spaced apart from the second central light emission axis.

In additional examples, the lighting system may be configured for positioning the semiconductor light-emitting device as being spaced apart on the longitudinal axis away from the second semiconductor light-emitting device for causing the central light emission axis to be substantially parallel with the second central light emission axis.

In other examples, the lighting system may further include a housing, the housing may be configured for positioning the lighting module for emission of the light emissions from the semiconductor light-emitting device along the central light emission axis, and the housing may be configured for positioning the second lighting module for emission of the further light emissions from the second semiconductor light-emitting device along the second central light emission axis.

In some examples, the lighting system may further include a carrier, the carrier may be configured for positioning the first or second lens module in the housing with the first or second lens axis being aligned with the central light emission axis, and the carrier may be configured for positioning the fourth or fifth lens module in the housing with the fourth or fifth lens axis being aligned with the second central light emission axis.

In further examples, the lighting system may further include a primary visible light reflector configured for being positioned between the housing and the carrier, the primary visible light reflector may be configured for redirecting some of the light emissions of the semiconductor light-emitting device along the central light emission axis, and the primary visible light reflector may be configured for redirecting some of the further light emissions of the second semiconductor light-emitting device along the second central light emission axis.

In some examples, the lighting system may be configured for interchangeably installing either: the first lens module in the lighting module and the fourth lens module in the second lighting module; or the second lens module in the lighting module and the fifth lens module in the second lighting module.

In further examples of the lighting system, the first lens module may be integral with the fourth lens module, and the second lens module may be integral with the fifth lens module.

In additional examples, the lighting system may further include a seventh lens module that may include a third diverging lens having a seventh lens axis, the third diverging lens being configured for causing divergence of some of the converged light emissions away from the seventh lens axis by a seventh HWHM, being different than the third HWHM, to form additional diverged light emissions, the third diverging lens having a seventh light output surface being spaced apart along the seventh lens axis from a seventh light input surface, the seventh light input surface including a third lens screen having lenticular or microprismatic features; and the lighting system may be configured for detachably installing the first lens module or the second lens module in the lighting module between the semiconductor light-emitting device and the seventh lens module; and the lighting system may be configured for aligning the first or second lens axis with the central light emission axis and the seventh lens axis.

In other examples, the lighting system may include an eighth lens module that may include a fourth diverging lens having an eighth lens axis, the fourth diverging lens being configured for causing divergence of some of the further converged light emissions away from the eighth lens axis by an eighth HWHM, being different than the sixth HWHM, to form additional diverged light emissions, the fourth diverging lens having an eighth light output surface being spaced apart along the eighth lens axis from an eighth light input surface, the eighth light input surface including a fourth lens screen having lenticular or microprismatic features; and the lighting system may be configured for detachably installing the fourth lens module or the fifth lens module in the second lighting module between the second semiconductor light-emitting device and the eighth lens module; and the lighting system may be configured for aligning the fourth or fifth lens axis with the second central light emission axis and the eighth lens axis.

In some examples, the lighting system may be configured for interchangeably installing either: the third lens module in the lighting module and the sixth lens module in the second lighting module; or the seventh lens module in the lighting module and the eighth lens module in the second lighting module.

In further examples of the lighting system, the third lens module may be integral with the sixth lens module, and the seventh lens module may be integral with the eighth lens module.

In other examples of the lighting system, the third HWHM may be the same as the sixth HWHM, and the seventh HWHM may be the same as the eighth HWHM.

In some examples, the lighting system may be configured for interchangeably installing either: the first lens module in the lighting module and the fourth lens module in the second lighting module; or the second lens module in the lighting module and the fifth lens module in the second lighting module.

In further examples of the lighting system, the first lens module may be integral with the fourth lens module, and the second lens module may be integral with the fifth lens module.

In other examples of the lighting system, the first diverging lens may be integral with the second diverging lens, and the lighting system may be configured for positioning the semiconductor light-emitting device as being spaced apart on a longitudinal axis away from the second semiconductor light-emitting device, and the first and second diverging lenses may be integrally configured for causing divergence of some of the converged light emissions in directions that are spaced apart from directions along the longitudinal axis.

In some examples of the lighting system, each of the first and second diverging lenses may be configured for causing divergence of some of the converged light emissions in directions that are spaced apart from directions along the longitudinal axis by an HWHM being about 4 degrees.

In further examples of the lighting system, each of the first and second diverging lenses may be configured for causing divergence of some of the converged light emissions in directions that are spaced apart from directions along the longitudinal axis by an HWHM being about 10 degrees.

In other examples of the lighting system, each of the first and second diverging lenses may be configured for causing divergence of some of the converged light emissions in directions that are spaced apart from directions along the longitudinal axis by an HWHM being about 15 degrees.

In some examples of the lighting system, each of the first and second diverging lenses may be configured for causing divergence of some of the converged light emissions in directions that are spaced apart from directions along the longitudinal axis by an HWHM being about 25 degrees.

In further examples of the lighting system, each of the first and second diverging lenses may be configured for causing divergence of some of the converged light emissions in directions that are spaced apart from directions along the longitudinal axis by an HWHM being about 30 degrees.

In additional examples of the lighting system, the first, second, third and fourth converging lenses may be configured for forming the converged light emissions as respectively having the first, second, fourth, and fifth HWHM being within a range of between about 2 degrees and about 5 degrees; and the first and second diverging lenses may be configured for causing divergence of some of the converged light emissions away from the central light emission axes in directions that are spaced apart from directions along the longitudinal axis by an HWHM being within a range of between about 2 degrees and about 6 degrees.

In further examples of the lighting system, the diverged light emissions may have a cumulative HWHM away from the central light emission axes in directions that are spaced apart from directions along the longitudinal axis being within a range of between about 4 degrees and about 11 degrees.

In additional examples of the lighting system, the first, second, third and fourth converging lenses may be configured for forming the converged light emissions as respectively having the first, second, fourth, and fifth HWHM being within a range of between about 15 degrees and about 25 degrees; and the first and second diverging lenses may be configured for causing divergence of some of the converged light emissions away from the central light emission axes in directions that are spaced apart from directions along the longitudinal axis by an HWHM being within a range of between about 25 degrees and about 35 degrees.

In other examples of the lighting system, the diverged light emissions may have a cumulative HWHM away from the central light emission axes in directions that are spaced apart from directions along the longitudinal axis being within a range of between about 40 degrees and about 60 degrees.

In some examples of the lighting system, the first, second, third and fourth converging lenses may be configured for forming the converged light emissions as respectively having the first, second, fourth, and fifth HWHM being within a range of between about 15 degrees and about 25 degrees; and the first and second diverging lenses may be configured for causing divergence of some of the converged light emissions away from the central light emission axes in directions that are spaced apart from directions along the longitudinal axis by an HWHM being within a range of between about 2 degrees and about 6 degrees.

In further examples of the lighting system, the diverged light emissions may have a cumulative HWHM away from the central light emission axes in directions that are spaced apart from directions along the longitudinal axis being within a range of between about 17 degrees and about 31 degrees.

In additional examples of the lighting system, the first, second, third and fourth converging lenses may be configured for forming the converged light emissions as respectively having the first, second, fourth, and fifth HWHM being within a range of between about 2 degrees and about 5 degrees; and the first and second diverging lenses may be configured for causing divergence of some of the converged light emissions away from the central light emission axes in directions that are spaced apart from directions along the longitudinal axis by an HWHM being within a range of between about 25 degrees and about 35 degrees.

In other examples of the lighting system, the diverged light emissions may have a cumulative HWHM away from the central light emission axes in directions that are spaced apart from directions along the longitudinal axis being within a range of between about 27 degrees and about 40 degrees.

In additional examples of the lighting system, the first diverging lens may be integral with the second diverging lens, and the lighting system may be configured for positioning the semiconductor light-emitting device as being spaced apart on a longitudinal axis away from the second semiconductor light-emitting device, and the first and second diverging lenses may be integrally configured for causing divergence of some of the converged light emissions in directions that are spaced apart from directions transverse to the longitudinal axis.

In other examples of the lighting system, each of the first and second diverging lenses may be configured for causing divergence of some of the converged light emissions in directions that are spaced apart from directions transverse to the longitudinal axis by an HWHM being about 4 degrees.

In some examples of the lighting system, each of the first and second diverging lenses may be configured for causing divergence of some of the converged light emissions in directions that are spaced apart from directions transverse to the longitudinal axis by an HWHM being about 10 degrees.

In further examples of the lighting system, each of the first and second diverging lenses may be configured for causing divergence of some of the converged light emissions in directions that are spaced apart from directions transverse to the longitudinal axis by an HWHM being about 15 degrees.

In additional examples of the lighting system, each of the first and second diverging lenses may be configured for causing divergence of some of the converged light emissions in directions that are spaced apart from directions transverse to the longitudinal axis by an HWHM being about 25 degrees.

In other examples of the lighting system, each of the first and second diverging lenses may be configured for causing divergence of some of the converged light emissions in directions that are spaced apart from directions transverse to the longitudinal axis by an HWHM being about 30 degrees.

In some examples of the lighting system, the third converging lens may be configured for forming the converged light emissions as having the fourth HWHM being within a range of between about 2 degrees and about 25 degrees, and the fourth converging lens may be configured for forming the further converged light emissions as having the fifth HWHM being within a range of between about 2 degrees and about 25 degrees, and each of the first and second diverging lenses may be configured for causing divergence of some of the converged light emissions in directions that are spaced apart from directions transverse to the longitudinal axis by an HWHM being within a range of between about 4 degrees and about 30 degrees.

In further examples of the lighting system, the diverged light emissions may have a cumulative HWHM away from the central light emission axes in directions that are spaced apart from directions transverse to the longitudinal axis being within a range of between about 6 degrees and about 55 degrees.

In some examples, the lighting system may further include a ninth lens module that may include a fifth diverging lens, the fifth diverging lens having a ninth light output surface being spaced apart along a ninth lens axis from a ninth light input surface, the fifth diverging lens having a fifth total internal reflection side surface being spaced apart around the ninth lens axis and having a fifth frusto-conical shape extending between the ninth light input and output surfaces of the fifth diverging lens; and the ninth light input surface of the fifth diverging lens may include a third central cavity being shaped as a portion of a spheroid; and the ninth light output surface of the fifth diverging lens may include a first raised region being shaped as a sliced torus having a fourth central cavity; and the lighting system may be configured for detachably installing the ninth lens module in the lighting module between the semiconductor light-emitting device and the third lens module; and the lighting system may be configured for aligning the ninth lens axis with the central light emission axis and the third lens axis.

In further examples of the lighting system, the first raised region of the fifth diverging lens that may be shaped as a sliced torus may be configured for causing some of the converged light emissions to pass through the third light output surface at a plurality of spaced-apart points.

In additional examples, the lighting system may further include a tenth lens module that may include a sixth diverging lens, the sixth diverging lens having a tenth light output surface being spaced apart along a tenth lens axis from a tenth light input surface, the sixth diverging lens having a sixth total internal reflection side surface being spaced apart around the tenth lens axis and having a sixth frusto-conical shape extending between the tenth light input and output surfaces of the sixth diverging lens; and the tenth light input surface of the sixth diverging lens may include a fifth central cavity being shaped as a portion of a spheroid; and the tenth light output surface of the sixth diverging lens may include a second raised region being shaped as a sliced torus having a sixth central cavity; and the lighting system may be configured for detachably installing the tenth lens module in the second lighting module between the second semiconductor light-emitting device and the sixth lens module; and the lighting system may be configured for aligning the tenth lens axis with the second central light emission axis and the sixth lens axis.

In other examples of the lighting system, the second raised region of the sixth diverging lens that may be shaped as a sliced torus may be configured for causing some of the further converged light emissions to pass through the sixth light output surface at a plurality of spaced-apart points.

In some examples, the lighting system may be configured for positioning the semiconductor light-emitting device as being spaced apart on a longitudinal axis away from the second semiconductor light-emitting device for causing the central light emission axis to be spaced apart from the second central light emission axis.

In further examples of the lighting system, the fifth diverging lens may be integral with the sixth diverging lens, and the fifth and sixth diverging lenses may be integrally configured for causing some of the converged light emissions to pass through the third and sixth light output surfaces at a plurality of spaced-apart points.

In additional examples of the lighting system, the first diverging lens, the second diverging lens, the fifth diverging lens, and the sixth diverging lens may be collectively configured for causing the third and sixth light output surfaces to emit a perceived line of light.

In other examples, the lighting system may further include another lens module having another diverging lens, the another diverging lens having one lens axis being spaced apart from another lens axis, the lighting system being configured for detachably installing the another diverging lens with the one lens axis being aligned with the central light emission axis and with the another lens axis being aligned with the second central light emission axis, the another diverging lens having another total internal reflection side surface extending between another light input surface and another light output surface, the another light output surface may include a contoured lens screen having lenticular or microprismatic features.

In some examples of the lighting system, the another diverging lens may have the contoured lens screen as including an array of lenticular toroidal lenses.

In further examples of the lighting system, the another light input surface may include one cavity aligned with the one lens axis and shaped as a portion of a spheroid, and the another light input surface may include another cavity aligned with the another lens axis and shaped as a portion of a spheroid.

In additional examples, the lighting system may be configured for positioning the semiconductor light-emitting device as being spaced apart on a longitudinal axis away from the second semiconductor light-emitting device for causing the central light emission axis to be spaced apart from the second central light emission axis.

In other examples of the lighting system, the contoured lens screen may have a central concave surface having a lens screen axis that extends in directions being similar to and spaced apart from the longitudinal axis.

In some examples of the lighting system, the lens screen axis may intersect the one lens axis and the another lens axis.

In further examples of the lighting system, the contoured lens screen may have one convex surface extending in directions along the lens screen axis, and one edge of the central concave region may extend adjacent to the one convex surface in directions along the lens screen axis.

In other examples of the lighting system, the contoured lens screen may have another convex surface extending in directions along the lens screen axis, and another edge of the central concave region may extend adjacent to the another convex surface in directions along the lens screen axis.

In some examples of the lighting system, the contoured lens screen may be configured for causing divergence of some of the converged light emissions away from the lens screen axis.

In further examples of the lighting system, the another lens module may be configured for causing some of the light emissions to pass through the contoured lens screen at a plurality of spaced-apart points.

In additional examples of the lighting system, the first diverging lens, the second diverging lens, and the another diverging lens may be collectively configured for causing the third and sixth light output surfaces to emit a perceived line of light.

In other examples, the lighting system may further include a housing, and the housing may be configured for positioning the lighting module for emission of the light emissions from the semiconductor light-emitting device along the central light emission axis, and the housing may be configured for positioning the second lighting module for emission of the further light emissions from the second semiconductor light-emitting device along the second central light emission axis.

In some examples, the lighting system may further include a carrier, and the carrier may be configured for positioning the another lens module in the housing with the one lens axis being aligned with the central light emission axis and with the another lens axis being aligned with the second central light emission axis.

In further examples, the lighting system may further include a primary visible light reflector configured for being positioned between the housing and the carrier, and the primary visible light reflector may be configured for redirecting some of the light emissions of the semiconductor light-emitting device along the central light emission axis, and the primary visible light reflector may be configured for redirecting some of the further light emissions of the second semiconductor light-emitting device along the second central light emission axis.

In another example of an implementation, a lighting system is provided that includes: a lighting module; a first lens module; a second lens module; and a third lens module. In this example of the lighting system, the lighting module may include a semiconductor light-emitting device configured for emitting light emissions along a first central light emission axis, and may include a second semiconductor light-emitting device configured for emitting light emissions along a second central light emission axis being spaced apart from the first central light emission axis. In this example of the lighting system, the first lens module may include a first diverging lens being configured for causing divergence of some of the light emissions away from the first central light emission axis, the first diverging lens having a first light output surface being spaced apart along a first lens axis from a first light input surface, the first diverging lens having a first total internal reflection side surface being spaced apart around the first lens axis and having a first frusto-conical shape extending between the first light input and output surfaces, and the first light input surface may include a first central cavity being shaped as a portion of a spheroid, and the first light output surface may include a first raised region being shaped as a sliced torus having a second central cavity. Also in this example of the lighting system, the second lens module may include a second diverging lens being configured for causing divergence of some of the light emissions away from the second central light emission axis, the second diverging lens having a second light output surface being spaced apart along a second lens axis from a second light input surface, the second diverging lens having a second total internal reflection side surface being spaced apart around the second lens axis and having a second frusto-conical shape extending between the second light input and output surfaces, and the second light input surface may include a third central cavity being shaped as a portion of a spheroid, and the second light output surface may include a second raised region being shaped as a sliced torus having a fourth central cavity. In this example of the lighting system, the third lens module may include a third diverging lens being configured for causing further divergence of some of the light emissions away from the first and second central light emission axes, the third diverging lens having a third light output surface being spaced apart from a third light input surface, and the third light input surface may include a first lens screen having lenticular or microprismatic features. In this example, the lighting system may be configured for aligning the first and second lens modules between the third lens module and the lighting module, with first lens axis being aligned with the first central light emission axis and with the second lens axis being aligned with the second central light emission axis.

In some examples of the lighting system, the raised regions of the first and second diverging lenses may be configured for causing some of the light emissions to pass through the third light output surface at a plurality of spaced-apart points.

In further examples of the lighting system, the first diverging lens may be integral with the second diverging lens.

In additional examples of the lighting system, the first, second and third diverging lenses may be collectively configured for causing the third light output surface to emit a perceived line of light.

In other examples of the lighting system the first diverging lens may have the contoured lens screen as including an array of lenticular toroidal lenses.

In some examples, the lighting system may be configured for positioning the semiconductor light-emitting device as being spaced apart on a longitudinal axis away from the second semiconductor light-emitting device for causing the central light emission axis to be spaced apart from the second central light emission axis.

In further examples, the lighting system may further include a housing, and the housing may be configured for positioning the lighting module for emission of the light emissions from the semiconductor light-emitting device along the central light emission axis, and the housing may be configured for positioning the second lighting module for emission of the further light emissions from the second semiconductor light-emitting device along the second central light emission axis.

In additional examples, the lighting system may further include a carrier, and the carrier may be configured for positioning the first lens module in the housing with the one lens axis being aligned with the central light emission axis, and may be configured for positioning the second lens module in the housing with the another lens axis being aligned with the second central light emission axis.

In other examples, the lighting system may further include a primary visible light reflector configured for being positioned between the housing and the carrier, and the primary visible light reflector may be configured for redirecting some of the light emissions of the semiconductor light-emitting device along the central light emission axis, and the primary visible light reflector may be configured for redirecting some of the further light emissions of the second semiconductor light-emitting device along the second central light emission axis.

In a further example of an implementation, a lighting system is provided that includes: a lighting module; a first lens module; and a second lens module. In this example of the lighting system, the lighting module may include a semiconductor light-emitting device configured for emitting light emissions along a first central light emission axis, and may include a second semiconductor light-emitting device configured for emitting light emissions along a second central light emission axis being spaced apart from the first central light emission axis. In this example of the lighting system, the first lens module may have a first diverging lens being configured for causing divergence of some of the light emissions away from the first and second central light emission axes, the first diverging lens having one lens axis being aligned with the central light emission axis and another lens axis being aligned with the second central light emission axis, the first diverging lens having a total internal reflection side surface extending between a first light input surface and a first light output surface, and the first light output surface may include a contoured lens screen having lenticular or microprismatic features. In this example of the lighting system, the second lens module may include a second diverging lens being configured for causing further divergence of some of the light emissions away from the first and second central light emission axes, the second diverging lens having a second light output surface being spaced apart from a second light input surface, the second light input surface may include a first lens screen having lenticular or microprismatic features. In this example, the lighting system may be configured for aligning the first lens module between the second lens module and the lighting module, with first lens axis being aligned with the first central light emission axis and with the second lens axis being aligned with the second central light emission axis.

In some examples of the lighting system, the first diverging lens may have the contoured lens screen as including an array of lenticular toroidal lenses.

In further examples of the lighting system, the first light input surface may include one cavity aligned with the one lens axis and shaped as a portion of a spheroid, and the first light input surface may include another cavity aligned with the another lens axis and shaped as a portion of a spheroid.

In additional examples, the lighting system may be configured for positioning the semiconductor light-emitting device as being spaced apart on a longitudinal axis away from the second semiconductor light-emitting device for causing the central light emission axis to be spaced apart from the second central light emission axis.

In other examples of the lighting system, the contoured lens screen may have a central concave surface having a lens screen axis that extends in directions being similar to and spaced apart from the longitudinal axis.

In some examples of the lighting system, the lens screen axis may intersect the one lens axis and the another lens axis.

In further examples of the lighting system, the contoured lens screen may have one convex surface extending in directions along the lens screen axis, and one edge of the central concave region may extend adjacent to the one convex surface in directions along the lens screen axis.

In additional examples of the lighting system, the contoured lens screen may have another convex surface extending in directions along the lens screen axis, and another edge of the central concave region may extend adjacent to the another convex surface in directions along the lens screen axis.

In other examples of the lighting system, the contoured lens screen may be configured for causing further divergence of some of the light emissions away from the lens screen axis.

In some examples of the lighting system, the another lens module may be configured for causing some of the light emissions to pass through the contoured lens screen at a plurality of spaced-apart points.

In further examples of the lighting system, the first diverging lens and the second diverging lens may be collectively configured for causing the second light output surface to emit a perceived line of light.

In additional examples, the lighting system may further include a housing, and the housing may be configured for positioning the lighting module for emission of the light emissions from the semiconductor light-emitting device along the central light emission axis, and the housing may be configured for positioning the second lighting module for emission of the further light emissions from the second semiconductor light-emitting device along the second central light emission axis.

In other examples, the lighting system may further include a carrier, and the carrier may be configured for positioning the first lens module in the housing with the one lens axis being aligned with the central light emission axis and with the another lens axis being aligned with the second central light emission axis.

In some examples, the lighting system may further include a primary visible light reflector configured for being positioned between the housing and the carrier, and the primary visible light reflector may be configured for redirecting some of the light emissions of the semiconductor light-emitting device along the central light emission axis, and the primary visible light reflector may be configured for redirecting some of the further light emissions of the second semiconductor light-emitting device along the second central light emission axis.

In further examples, the lighting system may have the third lens module as including a first diverging lens having a third lens axis, the first diverging lens being configured for causing divergence of some of the converged light emissions away from the third lens axis, and the third lens module may include: a lens body having a light output surface spaced apart along a light transmission axis from a light input surface, the lens body having a longitudinal axis and a lateral axis, the longitudinal and lateral axes being transverse to the light transmission axis; the light output surface having an asymmetric curvilinear contour being formed by a convex region overlapping in directions along the lateral axis with a concave region, the asymmetric curvilinear contour uniformly extending in directions along the longitudinal axis. As additional examples, the lighting system may have the light input surface of the third lens module as including an array of diverging lenses being configured for causing divergence of light away from the light transmission axis in directions along the longitudinal axis of the lens body.

As other examples, the lighting system may have the sixth lens module as including a second diverging lens having a sixth lens axis, the second diverging lens being configured for causing divergence of some of the converged light emissions away from the sixth lens axis, and the sixth lens module may include a lens body having a light output surface spaced apart along a light transmission axis from a light input surface, the lens body having a longitudinal axis and a lateral axis, the longitudinal and lateral axes being transverse to the light transmission axis; the light output surface having an asymmetric curvilinear contour being formed by a convex region overlapping in directions along the lateral axis with a concave region, the asymmetric curvilinear contour uniformly extending in directions along the longitudinal axis. In some examples, the lighting system may have the light input surface of the sixth lens module as including an array of diverging lenses being configured for causing divergence of light away from the light transmission axis in directions along the longitudinal axis of the lens body.

Other systems, processes, features and advantages of the invention will be or will become apparent to one with skill in the art upon examination of the following figures and detailed description. It is intended that all such additional systems, processes, features and advantages be included within this description, be within the scope of the invention, and be protected by the accompanying claims.

BRIEF DESCRIPTION OF THE FIGURES

The invention can be better understood with reference to the following figures. The components in the figures are not necessarily to scale, emphasis instead being placed upon illustrating the principles of the invention. Moreover, in the figures, like reference numerals designate corresponding parts throughout the different views.

FIG. 34 is a top view showing examples of the carrier and the primary visible light reflector that may be included in the example [100] of an implementation of a lighting system.

FIG. 35 is a perspective view showing the examples of the carrier and the primary visible light reflector as shown in FIG. 34.

DETAILED DESCRIPTION

Figure 1:
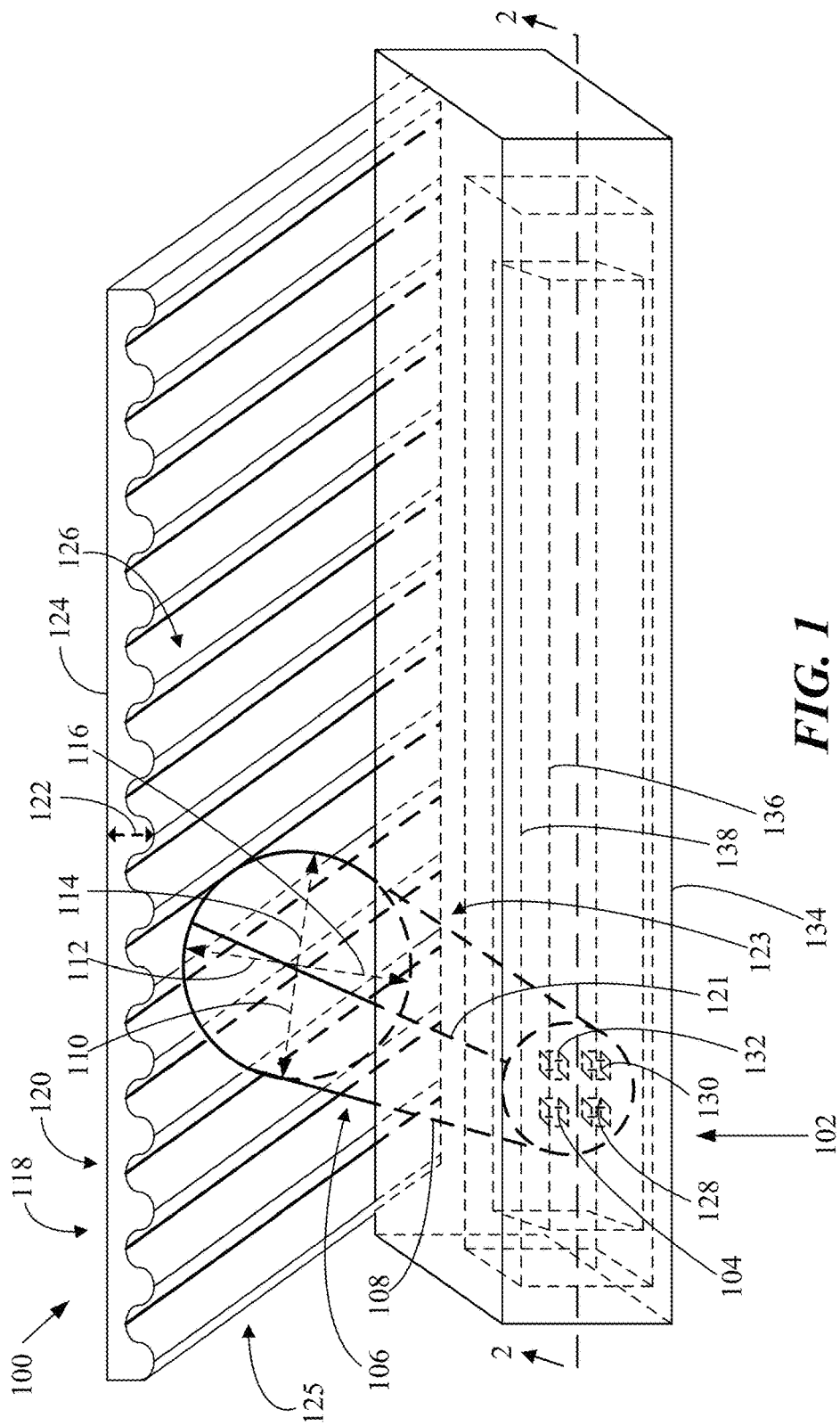
FIG. 1 is a perspective bottom view showing a portion of an example [100] of an implementation of a lighting system.

Various lighting systems that utilize semiconductor light-emitting devices have been designed. Many such lighting systems exist that include lenses for controlling directions of propagation of light emissions from the semiconductor light-emitting devices. However, existing lighting systems often have demonstrably failed to generate light using semiconductor light-emitting devices that has a uniform intensity distribution and an evenly-illuminated appearance, and that does not include projected images of the semiconductor light-emitting devices themselves. Furthermore, existing lighting systems often have demonstrably failed to generate light using semiconductor light-emitting devices that has such a uniform intensity distribution and an evenly-illuminated appearance without incurring significant beam spreading of the generated light due to the intentional light scattering utilized to blend the light and to blur the images of the semiconductor light-emitting devices.

In some examples, lens devices accordingly are provided that include a converging lens having a light output surface being spaced apart along a lens axis from a light input surface, the converging lens further having a total internal reflection side surface being spaced apart around the lens axis and having a frusto-conical shape extending between the light input and output surfaces of the converging lens. In these examples of a lens device, a portion of the light input surface of the converging lens includes a light input cavity being bounded by a perimeter, the light input cavity having a central axis and being generally shaped as a portion of a spheroid. Further in the lens device, the light input cavity has a plurality of grooves each respectively following a spline along the light input surface that intersects with the central axis of the light input cavity and with a respective point on the perimeter. Also in the example of the lens device, each of the respective points are mutually spaced apart around the perimeter of the light input cavity.

In additional examples, lighting systems accordingly are provided herein, that may include: a lighting module including a semiconductor light-emitting device ("SLED"); and a first lens module. These lighting systems may, as examples, further include: either or both of a second lens module and a third lens module. The SLED may be configured for emitting light emissions along a central light emission axis; and the first, second and third lens modules may respectively have first, second and third lens axes. The lighting system may be configured: for detachably installing the first lens module, the second lens module, and the third lens module; and for aligning the first or second lens axis with the central light emission axis and with the third lens axis. The first and second lens modules may respectively include first and second converging lenses being configured for causing convergence of some of the light emissions of the semiconductor light-emitting device to form converged light emissions along the central light emission axis having a half-width-half-maximum (HWHM). The first and second converging lenses may respectively have first and second light output surfaces being spaced apart along the first and second lens axes from first and second light input surfaces. The first and second converging lenses may further respectively have first and second total internal reflection side surfaces being spaced apart around the first and second lens axes and having first and second frusto-conical shapes extending between the first and second light input and output surfaces.

The following definitions of terms, being stated as applying "throughout this specification", are hereby deemed to be incorporated throughout this specification, including but not limited to the Summary, Brief Description of the Figures, Detailed Description, and Claims.

Throughout this specification, the term "semiconductor" means: a substance, examples including a solid chemical element or compound, that can conduct electricity under some conditions but not others, making the substance a good medium for the control of electrical current.

Throughout this specification, the term "semiconductor light-emitting device" (also being abbreviated as "SLED") means: a light-emitting diode; an organic light-emitting diode; a laser diode; or any other light-emitting device having one or more layers containing inorganic and/or organic semiconductor(s). Throughout this specification, the term "light-emitting diode" (herein also referred to as an "LED") means: a two-lead semiconductor light source having an active pn-junction. As examples, an LED may include a series of semiconductor layers that may be epitaxially grown on a substrate such as, for example, a substrate that includes sapphire, silicon, silicon carbide, gallium nitride or gallium arsenide. Further, for example, one or more semiconductor p-n junctions may be formed in these epitaxial layers. When a sufficient voltage is applied across the p-n junction, for example, electrons in the n-type semiconductor layers and holes in the p-type semiconductor layers may flow toward the p-n junction. As the electrons and holes flow toward each other, some of the electrons may recombine with corresponding holes, and emit photons. The energy release is called electroluminescence, and the color of the light, which corresponds to the energy of the photons, is determined by the energy band gap of the semiconductor. As examples, a spectral power distribution of the light generated by an LED may generally depend on the particular semiconductor materials used and on the structure of the thin epitaxial layers that make up the "active region" of the device, being the area where the light is generated. As examples, an LED may have a light-emissive electroluminescent layer including an inorganic semiconductor, such as a Group III-V semiconductor, examples including: gallium nitride; silicon; silicon carbide; and zinc oxide. Throughout this specification, the term "organic light-emitting diode" (herein also referred to as an "OLED") means: an LED having a light-emissive electroluminescent layer including an organic semiconductor, such as small organic molecules or an organic polymer. It is understood throughout this specification that a semiconductor light-emitting device may include: a non-semiconductor-substrate or a semiconductor-substrate; and may include one or more electrically-conductive contact layers. Further, it is understood throughout this specification that an LED may include a substrate formed of materials such as, for example: silicon carbide; sapphire; gallium nitride; or silicon. It is additionally understood throughout this specification that a semiconductor light-emitting device may have a cathode contact on one side and an anode contact on an opposite side, or may alternatively have both contacts on the same side of the device.

Further background information regarding semiconductor light-emitting devices is provided in the following documents, the entireties of all of which hereby are incorporated by reference herein: U.S. Pat. Nos. 7,564,180; 7,456,499; 7,213,940; 7,095,056; 6,958,497; 6,853,010; 6,791,119; 6,600,175; 6,201,262; 6,187,606; 6,120,600; 5,912,477;

5,739,554; 5,631,190; 5,604,135; 5,523,589; 5,416,342; 5,393,993; 5,359,345; 5,338,944; 5,210,051; 5,027,168; 5,027,168; 4,966,862; and 4,918,497; and U.S. Patent Application Publication Nos. 2014/0225511; 2014/0078715; 2013/0241392; 2009/0184616; 2009/0080185; 2009/0050908; 2009/0050907; 2008/0308825; 2008/0198112; 2008/0179611; 2008/0173884; 2008/0121921; 2008/0012036; 2007/0253209; 2007/0223219; 2007/0170447; 2007/0158668; 2007/0139923; and 2006/0221272.

Throughout this specification, the term "spectral power distribution" means: the emission spectrum of the one or more wavelengths of light emitted by a semiconductor light-emitting device. Throughout this specification, the term "peak wavelength" means: the wavelength where the spectral power distribution of a semiconductor light-emitting device reaches its maximum value as detected by a photo-detector. As an example, an LED may be a source of nearly monochromatic light and may appear to emit light having a single color. Thus, the spectral power distribution of the light emitted by such an LED may be centered about its peak wavelength. As examples, the "width" of the spectral power distribution of an LED may be within a range of between about 10 nanometers and about 30 nanometers, where the width is measured at half the maximum illumination on each side of the emission spectrum. Throughout this specification, the term "full-width-half-maximum" ("FWHM") means: the full width of the spectral power distribution of a semiconductor light-emitting device measured at half the maximum illumination on each side of its emission spectrum. Throughout this specification, the term "half-width-half-maximum" ("HWHM") means: half of the full width of a FWHM. Throughout this specification, the term "dominant wavelength" means: the wavelength of monochromatic light that has the same apparent color as the light emitted by a semiconductor light-emitting device, as perceived by the human eye. As an example, since the human eye perceives yellow and green light better than red and blue light, and because the light emitted by a semiconductor light-emitting device may extend across a range of wavelengths, the color perceived (i.e., the dominant wavelength) may differ from the peak wavelength.

Throughout this specification, the term "luminous flux", also referred to as "luminous power", means: the measure in lumens of the perceived power of light, being adjusted to reflect the varying sensitivity of the human eye to different wavelengths of light. Throughout this specification, the term "radiant flux" means: the measure of the total power of electromagnetic radiation without being so adjusted. Throughout this specification, the term "central light emission axis" means a direction along which the light emissions of a semiconductor light-emitting device have a greatest radiant flux. It is understood throughout this specification that light emissions "along a central light emission axis" means light emissions that: include light emissions in the directions of the central light emission axis; and may further include light emissions in a plurality of other generally similar directions.

It is understood throughout this specification that light emissions "along the longitudinal axis" means light emissions that: include light emissions in the directions of the longitudinal axis; and may further include light emissions in a plurality of other generally similar directions. It is understood throughout this specification that light emissions "in directions transverse to the longitudinal axis" means light emissions that: include light emissions in the directions being orthogonal to the longitudinal axis; and may further include light emissions in a plurality of other generally similar directions. It is understood throughout this specification that light emissions "in directions spaced apart from directions along the longitudinal axis" means light emissions in directions being similar to and spaced apart from the directions along the longitudinal axis. It is understood throughout this specification that light emissions "in directions spaced apart from directions transverse to the longitudinal axis" means light emissions in directions being similar to and spaced apart from the directions being transverse to the longitudinal axis.

Throughout this specification, the term "luminescent" means: characterized by absorption of electromagnetic radiation (e.g., visible light, UV light or infrared light) causing the emission of light by, as examples: fluorescence; and phosphorescence.

Throughout this specification, the term "object" means a material article or device. Throughout this specification, the term "surface" means an exterior boundary of an object. Throughout this specification, the term "incident visible light" means visible light that propagates in one or more directions towards a surface. Throughout this specification, the term "reflective surface" means a surface of an object that causes incident visible light, upon reaching the surface, to then propagate in one or more different directions away from the surface without passing through the object. Throughout this specification, the term "planar reflective surface" means a generally flat reflective surface.

Throughout this specification, the term "reflectance" means a fraction of a radiant flux of incident visible light having a specified wavelength that is caused by a reflective surface of an object to propagate in one or more different directions away from the surface without passing through the object. Throughout this specification, the term "reflected light" means the incident visible light that is caused by a reflective surface to propagate in one or more different directions away from the surface without passing through the object. Throughout this specification, the term "Lambertian reflectance" means diffuse reflectance of visible light from a surface, in which the reflected light has uniform radiant flux in all of the propagation directions. Throughout this specification, the term "specular reflectance" means mirror-like reflection of visible light from a surface, in which light from a single incident direction is reflected into a single propagation direction. Throughout this specification, the term "spectrum of reflectance values" means a spectrum of values of fractions of radiant flux of incident visible light, the values corresponding to a spectrum of wavelength values of visible light, that are caused by a reflective surface to propagate in one or more different directions away from the surface without passing through the object. Throughout this specification, the term "transmittance" means a fraction of a radiant flux of incident visible light having a specified wavelength that is permitted by a reflective surface to pass through the object having the reflective surface. Throughout this specification, the term "transmitted light" means the incident visible light that is permitted by a reflective surface to pass through the object having the reflective surface. Throughout this specification, the term "spectrum of transmittance values" means a spectrum of values of fractions of radiant flux of incident visible light, the values corresponding to a spectrum of wavelength values of visible light, that are permitted by a reflective surface to pass through the object having the reflective surface. Throughout this specification, the term "absorbance" means a fraction of a radiant flux of incident visible light having a specified wavelength that is permitted by a reflective surface to pass through the reflective surface and is absorbed by the object having the reflective surface. Throughout this specification, the term "spectrum of absorbance values" means a spectrum of values of fractions of radiant flux of incident visible light, the values corresponding to a spectrum of wavelength values of visible light, that are permitted by a reflective surface to pass through the reflective surface and are absorbed by the object having the reflective surface. Throughout this specification, it is understood that a reflective surface, or an object, may have a spectrum of reflectance values, and a spectrum of transmittance values, and a spectrum of absorbance values. The spectra of reflectance values, absorbance values, and transmittance values of a reflective surface or of an object may be measured, for example, utilizing an ultraviolet-visible-near infrared (UV-VIS-NIR) spectrophotometer. Throughout this specification, the term "visible light reflector" means an object having a reflective surface. In examples, a visible light reflector may be selected as having a reflective surface characterized by light reflections that are more Lambertian than specular.

Throughout this specification, the term "lumiphor" means: a medium that includes one or more luminescent materials being positioned to absorb light that is emitted at a first spectral power distribution by a semiconductor light-emitting device, and to re-emit light at a second spectral power distribution in the visible or ultra violet spectrum being different than the first spectral power distribution, regardless of the delay between absorption and re-emission. Lumiphors may be categorized as being down-converting, i.e., a material that converts photons to a lower energy level (longer wavelength); or up-converting, i.e., a material that converts photons to a higher energy level (shorter wavelength). As examples, a luminescent material may include: a phosphor; a quantum dot; a quantum wire; a quantum well; a photonic nanocrystal; a semiconducting nanoparticle; a scintillator; a lumiphoric ink; a lumiphoric organic dye; a day glow tape; a phosphorescent material; or a fluorescent material. Throughout this specification, the term "quantum material" means any luminescent material that includes: a quantum dot; a quantum wire; or a quantum well. Some quantum materials may absorb and emit light at spectral power distributions having narrow wavelength ranges, for example, wavelength ranges having spectral widths being within ranges of between about 25 nanometers and about 50 nanometers. In examples, two or more different quantum materials may be included in a lumiphor, such that each of the quantum materials may have a spectral power distribution for light emissions that may not overlap with a spectral power distribution for light absorption of any of the one or more other quantum materials. In these examples, cross-absorption of light emissions among the quantum materials of the lumiphor may be minimized. As examples, a lumiphor may include one or more layers or bodies that may contain one or more luminescent materials that each may be: (1) coated or sprayed directly onto an semiconductor light-emitting device; (2) coated or sprayed onto surfaces of a lens or other elements of packaging for an semiconductor light-emitting device; (3) dispersed in a matrix medium; or (4) included within a clear encapsulant (e.g., an epoxy-based or silicone-based curable resin or glass or ceramic) that may be positioned on or over an semiconductor light-emitting device. A lumiphor may include one or multiple types of luminescent materials. Other materials may also be included with a lumiphor such as, for example, fillers, diffusants, colorants, or other materials that may as examples improve the performance of or reduce the overall cost of the lumiphor. In examples where multiple types of luminescent materials may be included in a lumiphor, such materials may, as examples, be mixed together in a single layer or deposited sequentially in successive layers.

Throughout this specification, the term "volumetric lumiphor" means a lumiphor being distributed in an object having a shape including defined exterior surfaces. In some examples, a volumetric lumiphor may be formed by dispersing a lumiphor in a volume of a matrix medium having suitable spectra of visible light transmittance values and visible light absorbance values. As examples, such spectra may be affected by a thickness of the volume of the matrix medium, and by a concentration of the lumiphor being distributed in the volume of the matrix medium. In examples, the matrix medium may have a composition that includes polymers or oligomers of: a polycarbonate; a silicone; an acrylic; a glass; a polystyrene; or a polyester such as polyethylene terephthalate. Throughout this specification, the term "remotely-located lumiphor" means a lumiphor being spaced apart at a distance from and positioned to receive light that is emitted by a semiconductor light-emitting device.

Throughout this specification, the term "light-scattering particles" means small particles formed of a non-luminescent, non-wavelength-converting material. In some examples, a volumetric lumiphor may include light-scattering particles being dispersed in the volume of the matrix medium for causing some of the light emissions having the first spectral power distribution to be scattered within the volumetric lumiphor. As an example, causing some of the light emissions to be so scattered within the matrix medium may cause the luminescent materials in the volumetric lumiphor to absorb more of the light emissions having the first spectral power distribution. In examples, the light-scattering particles may include: rutile titanium dioxide; anatase titanium dioxide; barium sulfate; diamond; alumina; magnesium oxide; calcium titanate; barium titanate; strontium titanate; or barium strontium titanate. In examples, light-scattering particles may have particle sizes being within a range of about 0.01 micron (10 nanometers) and about 2.0 microns (2,000 nanometers).

In some examples, a visible light reflector may be formed by dispersing light-scattering particles having a first index of refraction in a volume of a matrix medium having a second index of refraction being suitably different from the first index of refraction for causing the volume of the matrix medium with the dispersed light-scattering particles to have suitable spectra of reflectance values, transmittance values, and absorbance values for functioning as a visible light reflector. As examples, such spectra may be affected by a thickness of the volume of the matrix medium, and by a concentration of the light-scattering particles being distributed in the volume of the matrix medium, and by physical characteristics of the light-scattering particles such as the particle sizes and shapes, and smoothness or roughness of exterior surfaces of the particles. In an example, the smaller the difference between the first and second indices of refraction, the more light-scattering particles may need to be dispersed in the volume of the matrix medium to achieve a given amount of light-scattering. As examples, the matrix medium for forming a visible light reflector may have a composition that includes polymers or oligomers of: a polycarbonate; a silicone; an acrylic; a glass; a polystyrene; or a polyester such as polyethylene terephthalate. In further examples, the light-scattering particles may include: rutile titanium dioxide; anatase titanium dioxide; barium sulfate; diamond; alumina; magnesium oxide; calcium titanate; barium titanate; strontium titanate; or barium strontium titanate. In other examples, a visible light reflector may include a reflective polymeric or metallized surface formed on a visible light-transmissive polymeric or metallic object such as, for example, a volume of a matrix medium. Additional examples of visible light reflectors may include microcellular foamed polyethylene terephthalate sheets ("MCPET"). Suitable visible light reflectors may be commercially available under the trade names White Optics® and MIRO® from WhiteOptics LLC, 243-G Quigley Blvd., New Castle, Del. 19720 USA. Suitable MCPET visible light reflectors may be commercially available from the Furukawa Electric Co., Ltd., Foamed Products Division, Tokyo, Japan. Additional suitable visible light reflectors may be commercially available from CVI Laser Optics, 200 Dorado Place SE, Albuquerque, N. Mex. 87123 USA.

In some examples, a converging or diverging lens may be formed as a volume of a matrix medium having a suitable shape for functioning as a lens. In further examples, forming a diverging lens may include dispersing light-scattering particles having a first index of refraction in a volume of a matrix medium having a second index of refraction being suitably different from the first index of refraction for causing the volume of the matrix medium with the dispersed light-scattering particles to have suitable light-scattering value for functioning as a diverging lens. As examples, the matrix medium for forming a lens may have a composition that includes polymers or oligomers of: a polycarbonate; a silicone; an acrylic; a glass; a polystyrene; or a polyester such as polyethylene terephthalate. In further examples, the light-scattering particles may include: rutile titanium dioxide; anatase titanium dioxide; barium sulfate; diamond; alumina; magnesium oxide; calcium titanate; barium titanate; strontium titanate; or barium strontium titanate.

In further examples, a volumetric lumiphor and a visible light reflector may be integrally formed. As examples, a volumetric lumiphor and a visible light reflector may be integrally formed in respective layers of a volume of a matrix medium, including a layer of the matrix medium having a dispersed lumiphor, and including another layer of the same or a different matrix medium having light-scattering particles being suitably dispersed for causing the another layer to have suitable spectra of reflectance values, transmittance values, and absorbance values for functioning as the visible light reflector. In other examples, an integrally-formed volumetric lumiphor and visible light reflector may incorporate any of the further examples of variations discussed above as to separately-formed volumetric lumiphors and visible light reflectors.

Throughout this specification, the term "phosphor" means: a material that exhibits luminescence when struck by photons. Examples of phosphors that may be utilized include: $CaAlSiN_3$:Eu, $SrAlSiN_3$:Eu, $CaAlSiN_3$:Eu, $Ba_3Si_6O_{12}N_2$:Eu, $Ba_2SiO_4$:Eu, $Sr_2SiO_4$:Eu, $Ca_2SiO_4$:Eu, $Ca_3Sc_2Si_3O_{12}$:Ce, $Ca_3Mg_2Si_3O_{12}$:Ce, $CaSc_2O_4$:Ce, $CaSi_2O_2N_2$:Eu, $SrSi_2O_2N_2$:Eu, $BaSi_2O_2N_2$:Eu, $Ca_5(PO_4)_3Cl$:Eu, $Ba_5(PO_4)_3Cl$:Eu, $Cs_2CaP_2O_7$, $Cs_2SrP_2O_7$, $SrGa_2S_4$:Eu, $Lu_3Al_5O_{12}$:Ce, $Ca_8Mg(SiO_4)_4Cl_2$:Eu, $Sr_8Mg(SiO_4)_4Cl_2$:Eu, $La_3Si_6N_{11}$:Ce, $Y_3Al_5O_{12}$:Ce, $Y_3Ga_5O_{12}$:Ce, $Gd_3Al_5O_{12}$:Ce, $Gd_3Ga_5O_{12}$:Ce, $Tb_3Al_5O_{12}$:Ce, $Tb_3Ga_5O_{12}$:Ce, $Lu_3Ga_5O_{12}$:Ce, $(SrCa)AlSiN_3$:Eu, LuAG:Ce, $(Y,Gd)_2Al_5)_{12}$:Ce, CaS:Eu, SrS:Eu, $SrGa_2S_4$:$E_4$, $Ca_2(Sc,Mg)_2SiO_{12}$:Ce, $Ca_2Sc_2Si_2)_{12}$:C2, $Ca_2Sc_2O_4$:Ce, $Ba_2Si_6O_{12}N_2$:Eu, $(Sr,Ca)AlSiN_2$:Eu, and $CaAlSiN_2$:Eu.

Throughout this specification, the term "quantum dot" means: a nanocrystal made of semiconductor materials that are small enough to exhibit quantum mechanical properties, such that its excitons are confined in all three spatial dimensions.

Throughout this specification, the term "quantum wire" means: an electrically conducting wire in which quantum effects influence the transport properties.

Throughout this specification, the term "quantum well" means: a thin layer that can confine (quasi-)particles (typically electrons or holes) in the dimension perpendicular to the layer surface, whereas the movement in the other dimensions is not restricted.

Throughout this specification, the term "photonic nanocrystal" means: a periodic optical nanostructure that affects the motion of photons, for one, two, or three dimensions, in much the same way that ionic lattices affect electrons in solids.

Throughout this specification, the term "semiconducting nanoparticle" means: a particle having a dimension within a range of between about 1 nanometer and about 100 nanometers, being formed of a semiconductor.

Throughout this specification, the term "scintillator" means: a material that fluoresces when struck by photons.

Throughout this specification, the term "lumiphoric ink" means: a liquid composition containing a luminescent material. For example, a lumiphoric ink composition may contain semiconductor nanoparticles. Examples of lumiphoric ink compositions that may be utilized are disclosed in Cao et al., U.S. Patent Application Publication No. 20130221489 published on Aug. 29, 2013, the entirety of which hereby is incorporated herein by reference.

Throughout this specification, the term "lumiphoric organic dye" means an organic dye having luminescent up-converting or down-converting activity. As an example, some perylene-based dyes may be suitable.

Throughout this specification, the term "day glow tape" means: a tape material containing a luminescent material.

Throughout this specification, the term "visible light" means light having one or more wavelengths being within a range of between about 380 nanometers and about 670 nanometers; and "visible light spectrum" means the range of wavelengths of between about 380 nanometers and about 670 nanometers.

Throughout this specification, the term "white light" means: light having a color point located at a delta(uv) of about equal to or less than 0.006 and having a CCT being within a range of between about 10000K and about 1800K (herein referred to as a "white color point."). Many different hues of light may be perceived as being "white." For example, some "white" light, such as light generated by a tungsten filament incandescent lighting device, may appear yellowish in color, while other "white" light, such as light generated by some fluorescent lighting devices, may appear more bluish in color. As examples, white light having a CCT of about 3000K may appear yellowish in color, while white light having a CCT of about equal to or greater than 8000K may appear more bluish in color and may be referred to as "cool" white light. Further, white light having a CCT of between about 2500K and about 4500K may appear reddish or yellowish in color and may be referred to as "warm" white light. "White light" includes light having a spectral power distribution of wavelengths including red, green and blue color points. In an example, a CCT of a lumiphor may be tuned by selecting one or more particular luminescent materials to be included in the lumiphor. For example, light emissions from a semiconductor light-emitting device that includes three separate emitters respectively having red, green and blue color points with an appropriate spectral power distribution may have a white color point. As another example, light perceived as being "white" may be produced by mixing light emissions from a semiconductor light-emitting device having a blue, greenish-blue or purplish-blue color point together with light emissions having a yellow color point being produced by passing some of the light emissions having the blue, greenish-blue or purplish-blue color point through a lumiphor to down-convert them into light emissions having the yellow color point. General background information on systems and processes for generating light perceived as being "white" is provided in "Class A Color Designation for Light Sources Used in General Illumination", Freyssinier and Rea, *J. Light & Vis. Env.*, Vol. 37, No. 2 & 3 (Nov. 7, 2013, Illuminating Engineering Institute of Japan), pp. 10-14; the entirety of which hereby is incorporated herein by reference.

Throughout this specification, the term "in contact with" means: that a first object, being "in contact with" a second object, is in either direct or indirect contact with the second object. Throughout this specification, the term "in indirect contact with" means: that the first object is not in direct contact with the second object, but instead that there are a plurality of objects (including the first and second objects), and each of the plurality of objects is in direct contact with at least one other of the plurality of objects (e.g., the first and second objects are in a stack and are separated by one or more intervening layers). Throughout this specification, the term "in direct contact with" means: that the first object, which is "in direct contact" with a second object, is touching the second object and there are no intervening objects between at least portions of both the first and second objects.

Throughout this specification, the term "spectrophotometer" means: an apparatus that can measure a light beam's intensity as a function of its wavelength and calculate its total luminous flux.

Throughout this specification, the term "integrating sphere-spectrophotometer" means: a spectrophotometer operationally connected with an integrating sphere. An integrating sphere (also known as an Ulbricht sphere) is an optical component having a hollow spherical cavity with its interior covered with a diffuse white reflective coating, with small holes for entrance and exit ports. Its relevant property is a uniform scattering or diffusing effect. Light rays incident on any point on the inner surface are, by multiple scattering reflections, distributed equally to all other points. The effects of the original direction of light are minimized. An integrating sphere may be thought of as a diffuser which preserves power but destroys spatial information. Another type of integrating sphere that can be utilized is referred to as a focusing or Coblentz sphere. A Coblentz sphere has a mirror-like (specular) inner surface rather than a diffuse inner surface. Light scattered by the interior of an integrating sphere is evenly distributed over all angles. The total power (radiant flux) of a light source can then be measured without inaccuracy caused by the directional characteristics of the source. Background information on integrating sphere-spectrophotometer apparatus is provided in Liu et al., U.S. Pat. No. 7,532,324 issued on May 12, 2009, the entirety of which hereby is incorporated herein by reference. It is understood throughout this specification that color points may be measured, for example, by utilizing a spectrophotometer, such as an integrating sphere-spectrophotometer. The spectra of reflectance values, absorbance values, and transmittance values of a reflective surface or of an object may be measured, for example, utilizing an ultraviolet-visible-near infrared (UV-VIS-NIR) spectrophotometer.

Throughout this specification, the term "lenticular features" means: an array of semicircular convex lenses ("lenticles") on a surface, being arranged as a sinusoidal series of mutually parallel ridges between troughs, forming a series of "lenticular toroidal lenses." Background information on lenticular toroidal lenses and lenticular features is provided in Seo U.S. Pat. No. 8,503,083 issued on Aug. 6, 2013, the entirety of which hereby is incorporated herein by reference.

Throughout this specification, the term "microprismatic features" means an array of small, equally-spaced multi-faceted prisms being arranged in a regular array forming a "microprismatic lens" on a surface. Background information on microprismatic lenses is provided in Pakhchyan U.S. Patent Application Publication No. 2011/0292483A1 published on Dec. 1, 2011, the entirety of which hereby is incorporated herein by reference.

Throughout this specification, the term "upward direction" means a direction illustrated as being upward, as indicated by an arrow shown in a Figure herein, being upward relative to an object shown in the Figure. Throughout this specification, the term "downward direction" means a direction illustrated as being downward, as indicated by an arrow shown in a Figure herein, being downward relative to an object shown in the Figure. It is understood that the terms "upward direction" and "downward direction" are relative terms defined by the corresponding arrows illustrated in the Figures as indicating such directions; and that the lighting systems illustrated in the Figures may be oriented in other directions. It is likewise understood that the terms "top" and "bottom" are relative terms as shown in the Figures.

Throughout this specification, the term "spline" means a mathematical representation of a curve that includes: a specified series of at least four control points located at intervals along the curve; and a defined function that allows additional points within an interval along the curve to be calculated. Throughout this specification, the term "Catmull-Rom spline" means a spline wherein the specified curve passes through all of the control points. Background information on Catmull-Rom splines is provided in "Introduction to Catmull-Rom Splines," downloaded from: http://www.mvps.org/directx/articles/catmull/, the entirety of which hereby is incorporated herein by reference.

It is understood throughout this specification that numbering of the names of elements as being "first", "second" etcetera, is solely for purposes of clarity in referring to such elements in connection with various examples of lighting systems. It is understood throughout this specification that an example [100] of a lighting system may include any combination of the features discussed in connection with the examples [100] of a lighting system.

Figure 2:
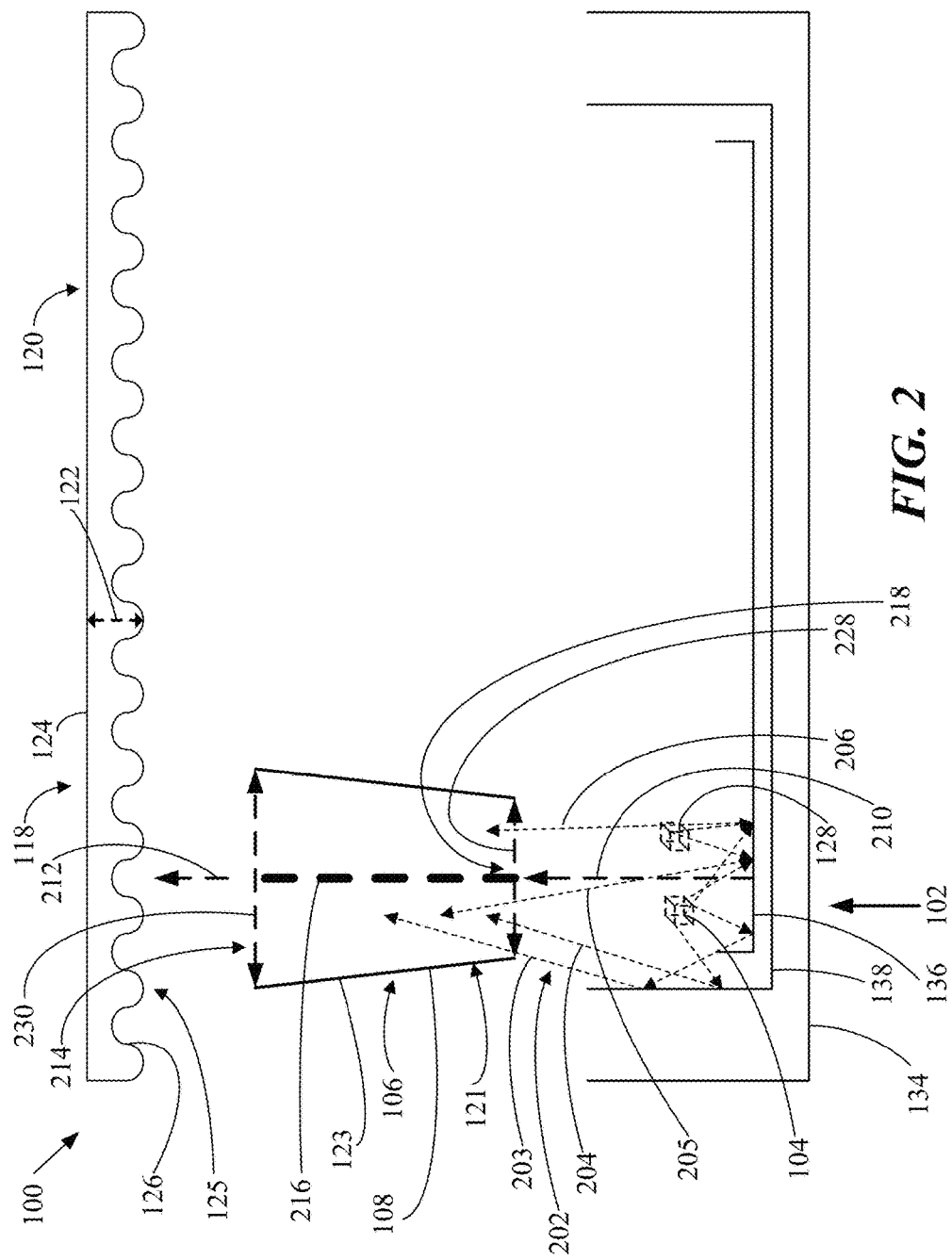
FIG. 2 is a cross-sectional side view taken along the line 2-2, showing the portion of the example [100] of the lighting system.

FIG. 1 is a perspective bottom view showing a portion of an example [100] of an implementation of a lighting system. FIG. 2 is a cross-sectional side view taken along the line 2-2, showing the portion of the example [100] of the lighting system. As shown in FIGS. 1 and 2, the example [100] of the implementation of the lighting system includes a lighting module [102] including a semiconductor light-emitting device [104] configured for emitting light emissions [202] in directions represented by the arrows [203], [204], [205], [206] along a central light emission axis [210]. Further, the example [100] of the lighting system includes a first lens module [106] that includes a first converging lens [108]. The first converging lens [108] of the example [100] of the lighting system is configured for causing convergence of some of the light emissions [202] of the semiconductor light-emitting device [104] to form converged light emissions [212] along the central light emission axis [210]

having a first half-width-half-maximum (HWHM) around the central light emission axis [210] being represented by each of the arrows [110], [112], [114], [116], the first converging lens [108] having a first light output surface [214] being spaced apart along a first lens axis [216] from a first light input surface [218], the first converging lens [108] further having a first total internal reflection side surface [121] being spaced apart around the first lens axis [216] and having a first frusto-conical shape [123] extending between the first light input surface [218] and the first light output surface [214] of the first converging lens [108].

Figure 3:
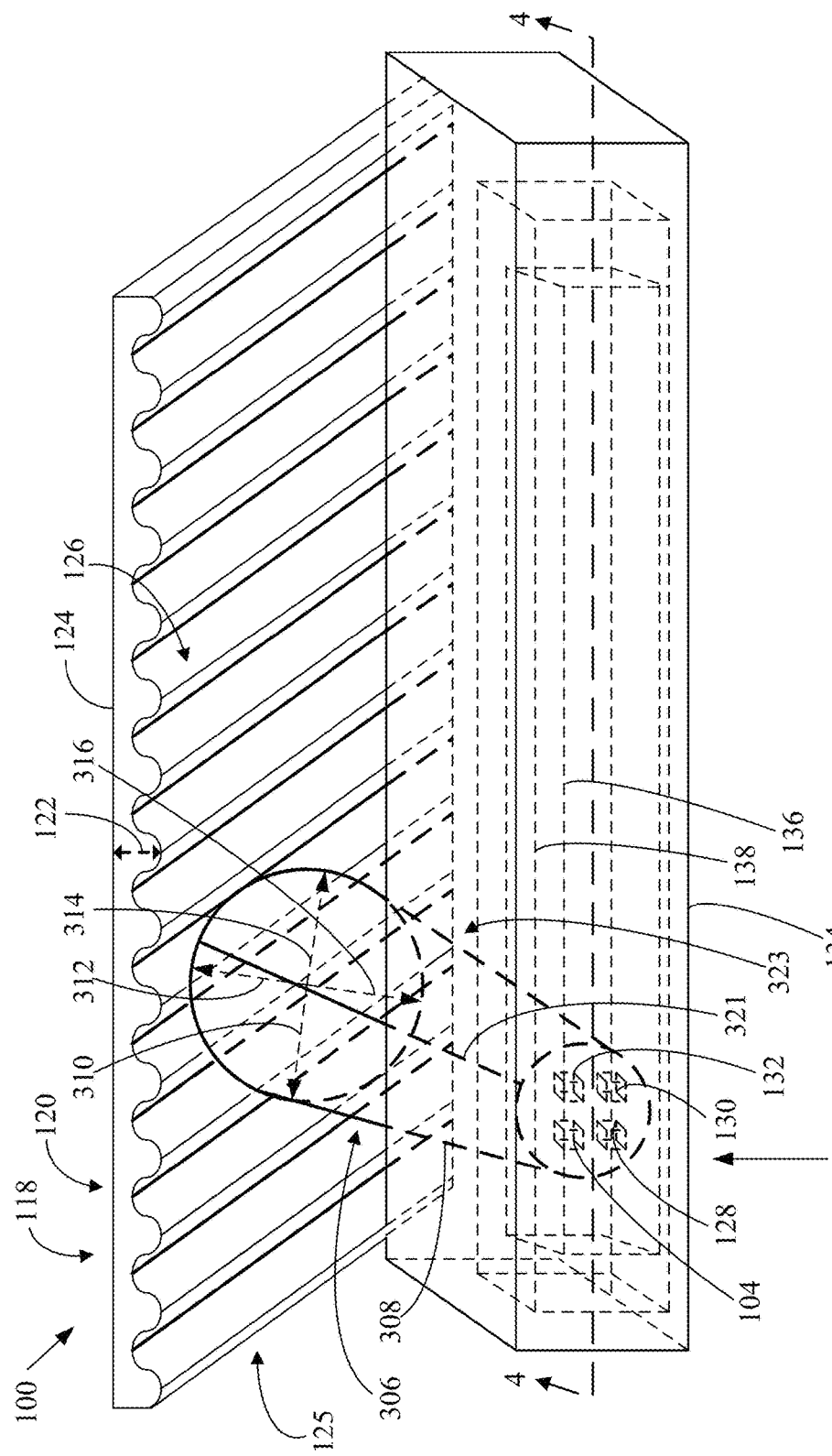
FIG. 3 is a perspective bottom view showing another portion of the example [100] of an implementation of a lighting system.
Figure 4:
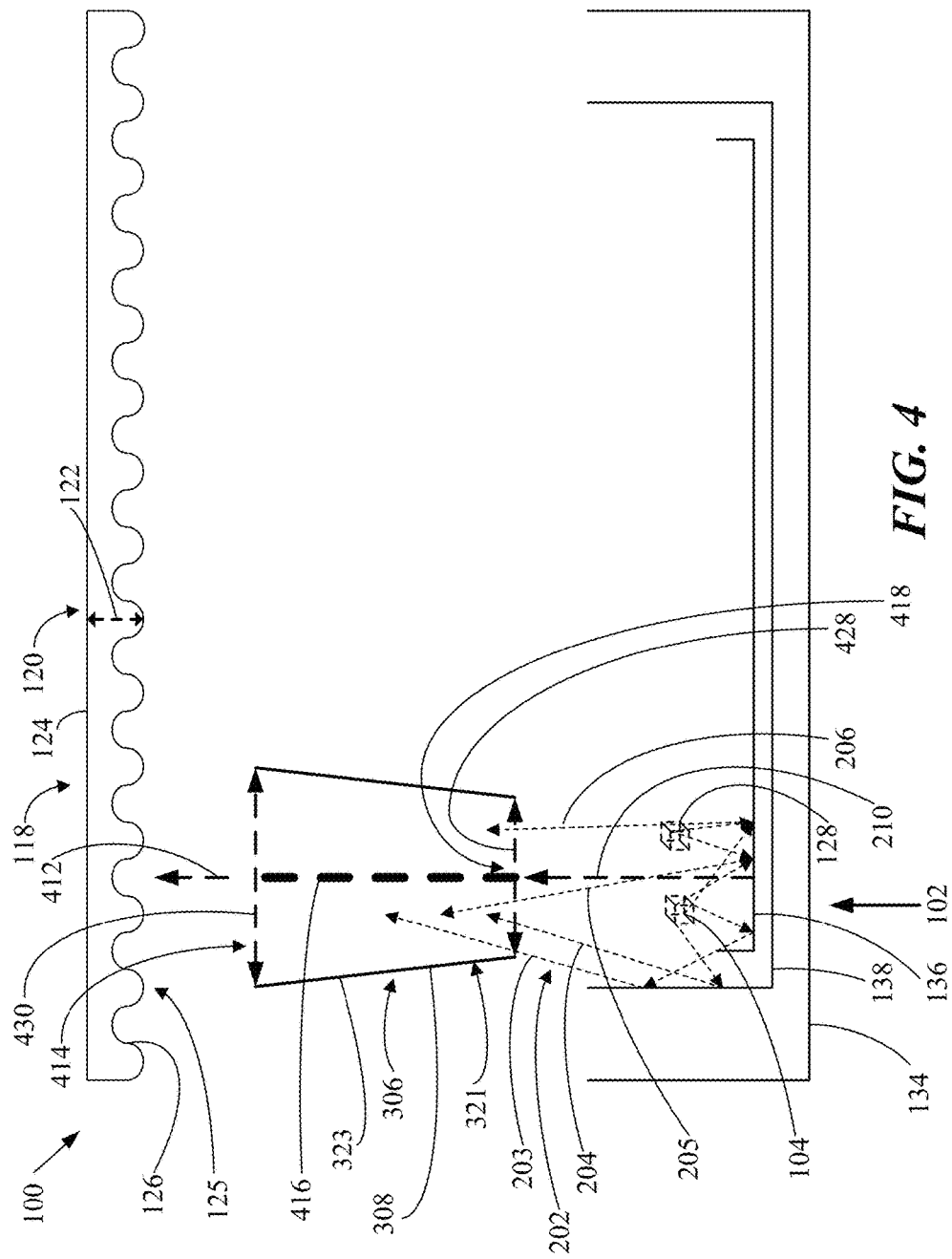
FIG. 4 is a cross-sectional side view taken along the line 4-4, showing the another portion of the example [100] of the lighting system.

FIG. 3 is a perspective bottom view showing another portion of the example [100] of an implementation of a lighting system. FIG. 4 is a cross-sectional side view taken along the line 4-4, showing the another portion of the example [100] of the lighting system. As shown in FIGS. 3 and 4, the example [100] of the implementation of the lighting system further includes a second lens module [306] that includes a second converging lens [308]. The second converging lens [308] of the example [100] of the lighting system is configured for causing convergence of some of the light emissions [202] of the semiconductor light-emitting device [104] to form further converged light emissions [412] along the central light emission axis [210] having a second HWHM around the central light emission axis [210] as represented by each of the arrows [310], [312], [314], [316] being different than the first HWHM represented by each of the arrows [110], [112], [114], [116], the second converging lens [308] having a second light output surface [414] being spaced apart along a second lens axis [416] from a second light input surface [418], the second converging lens [308] further having a second total internal reflection side surface [321] being spaced apart around the second lens axis [416] and having a second frusto-conical shape [323] extending between the second light input surface [418] and the second light output surface [414] of the second converging lens [308].

Figure 5:
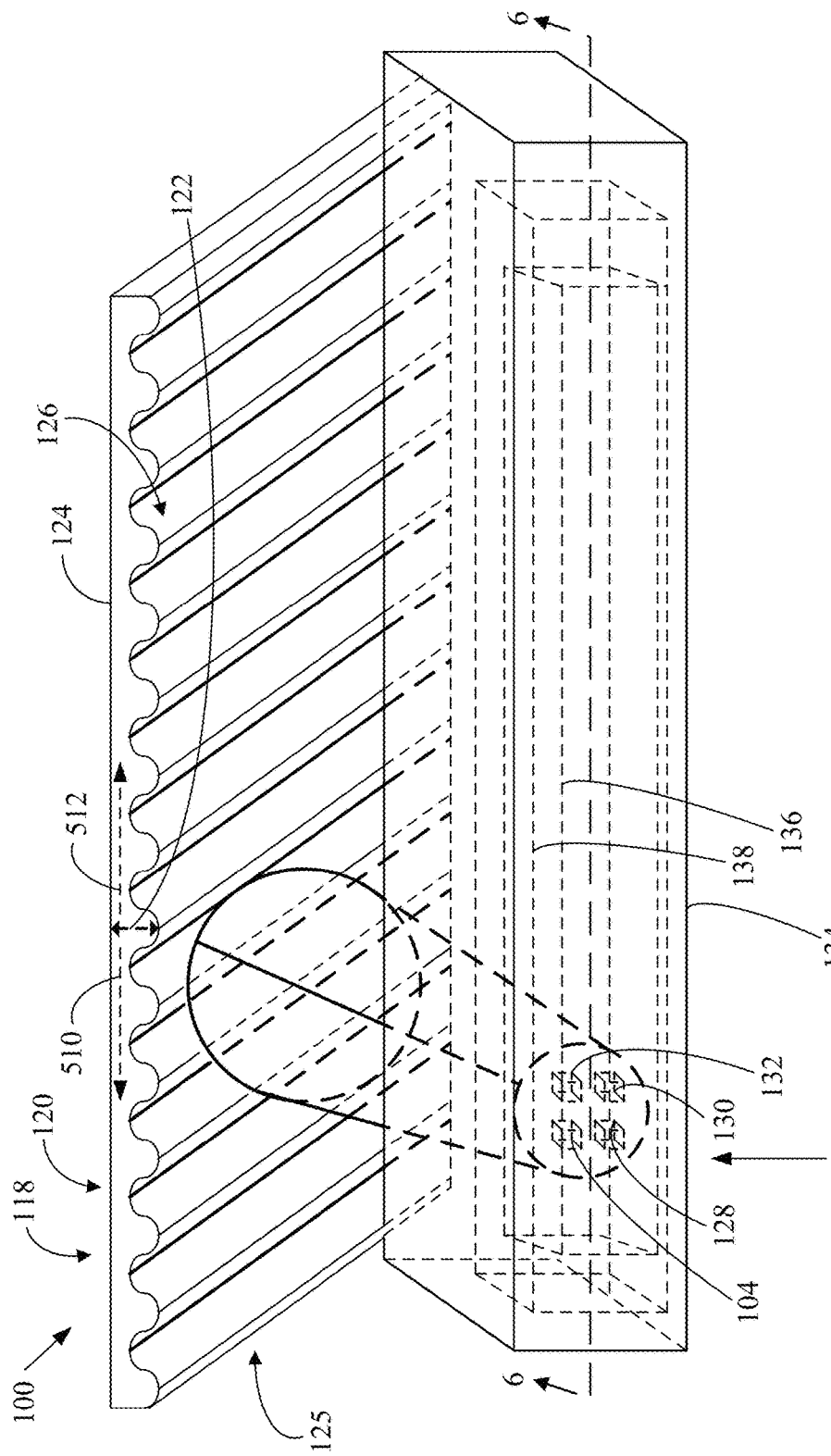
FIG. 5 is a perspective bottom view showing a further portion of the example [100] of an implementation of a lighting system.
Figure 6:
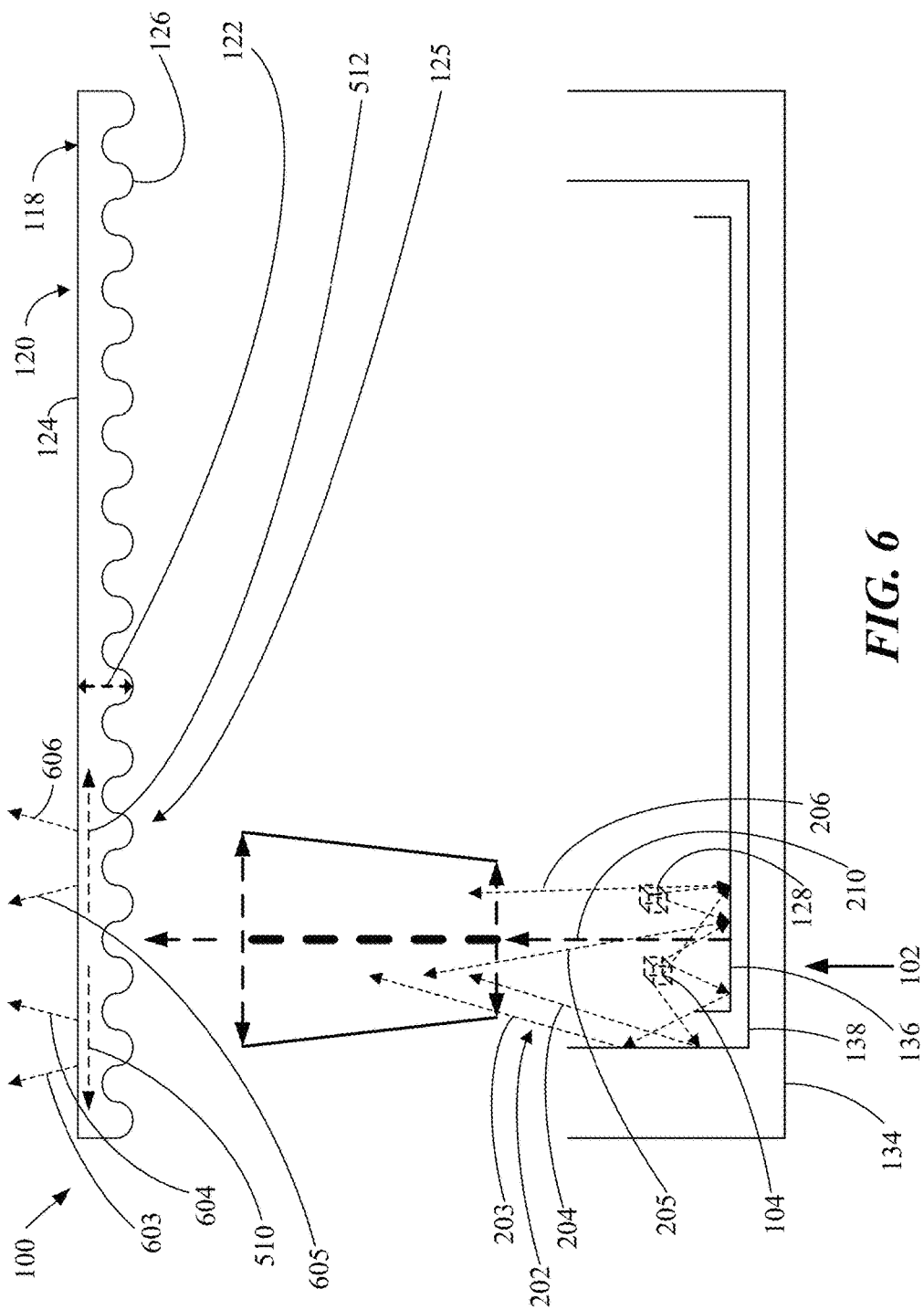
FIG. 6 is a cross-sectional side view taken along the line 6-6, showing the further portion of the example [100] of the lighting system.

FIG. 5 is a perspective bottom view showing a further portion of the example [100] of an implementation of a lighting system. FIG. 6 is a cross-sectional side view taken along the line 6-6, showing the further portion of the example [100] of the lighting system. As shown in FIGS. 1-6, the example [100] of the implementation of the lighting system further includes a third lens module [118] including a first diverging lens [120] having a third lens axis [122], the first diverging lens [120] being configured for causing divergence of some of the converged light emissions [212], [412] away from the third lens axis [122] by a third HWHM represented by each of the arrows [510], [512], to form diverged light emissions in directions represented by the arrows [603], [604], [605], [606] that diverge away from the central light emission axis [210]. As further shown in FIGS. 1-6, the first diverging lens [120] has a third light output surface [124] being spaced apart along the third lens axis [122] from a third light input surface [126], the third light input surface [126] including a first lens screen [125] having lenticular or microprismatic features. Referring to FIGS. 1-6, the example [100] of the lighting system is configured for detachably installing the first lens module [106] or the second lens module [306] in the lighting module [102] between the semiconductor light-emitting device [104] and the third lens module [118]; and the lighting system is configured for aligning the first lens axis [216] or the second lens axis [416] with the central light emission axis [210] and with the third lens axis [122].

Figure 7:
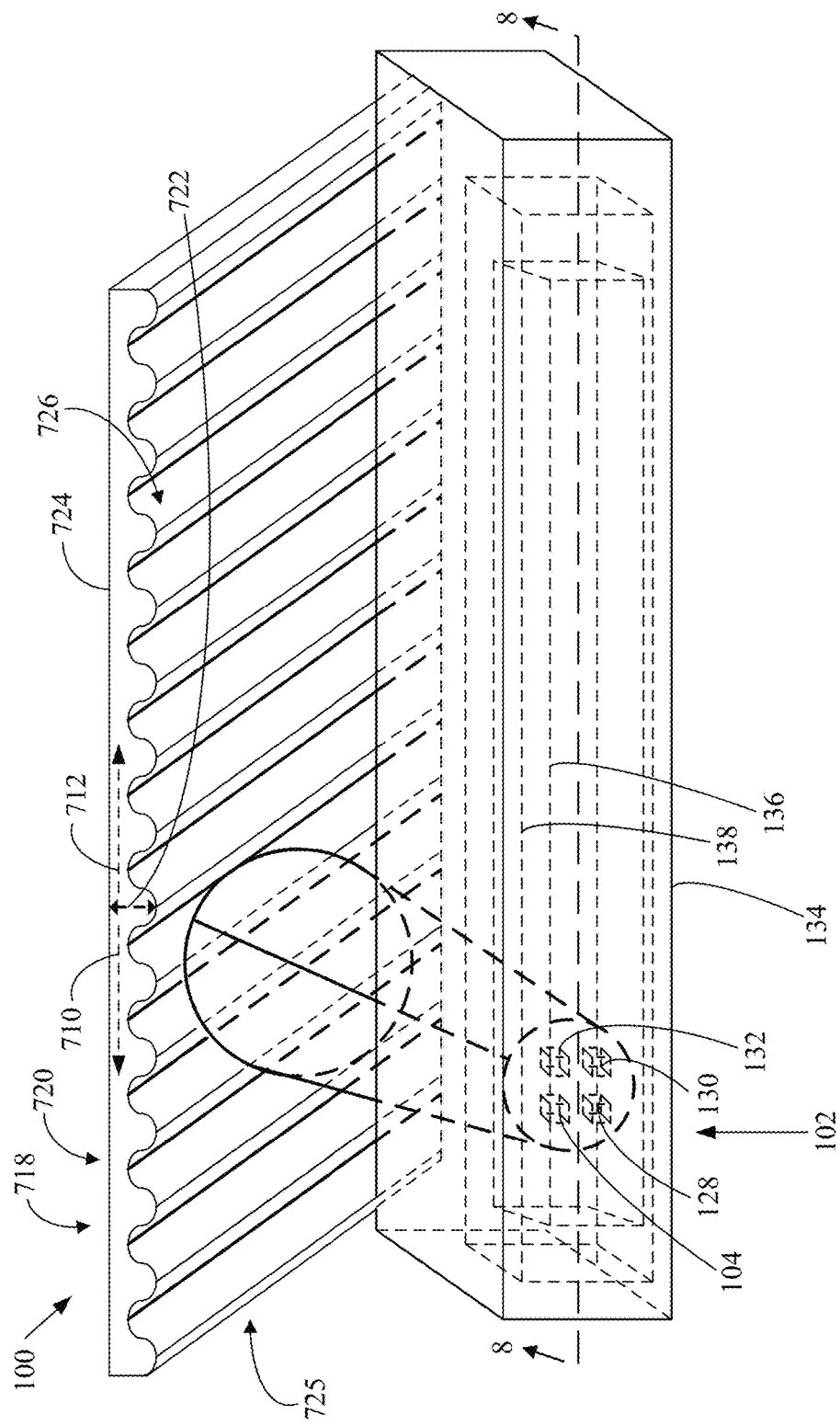
FIG. 7 is a perspective bottom view showing an example of an additional lens module that may be included in the example [100] of an implementation of a lighting system.
Figure 8:
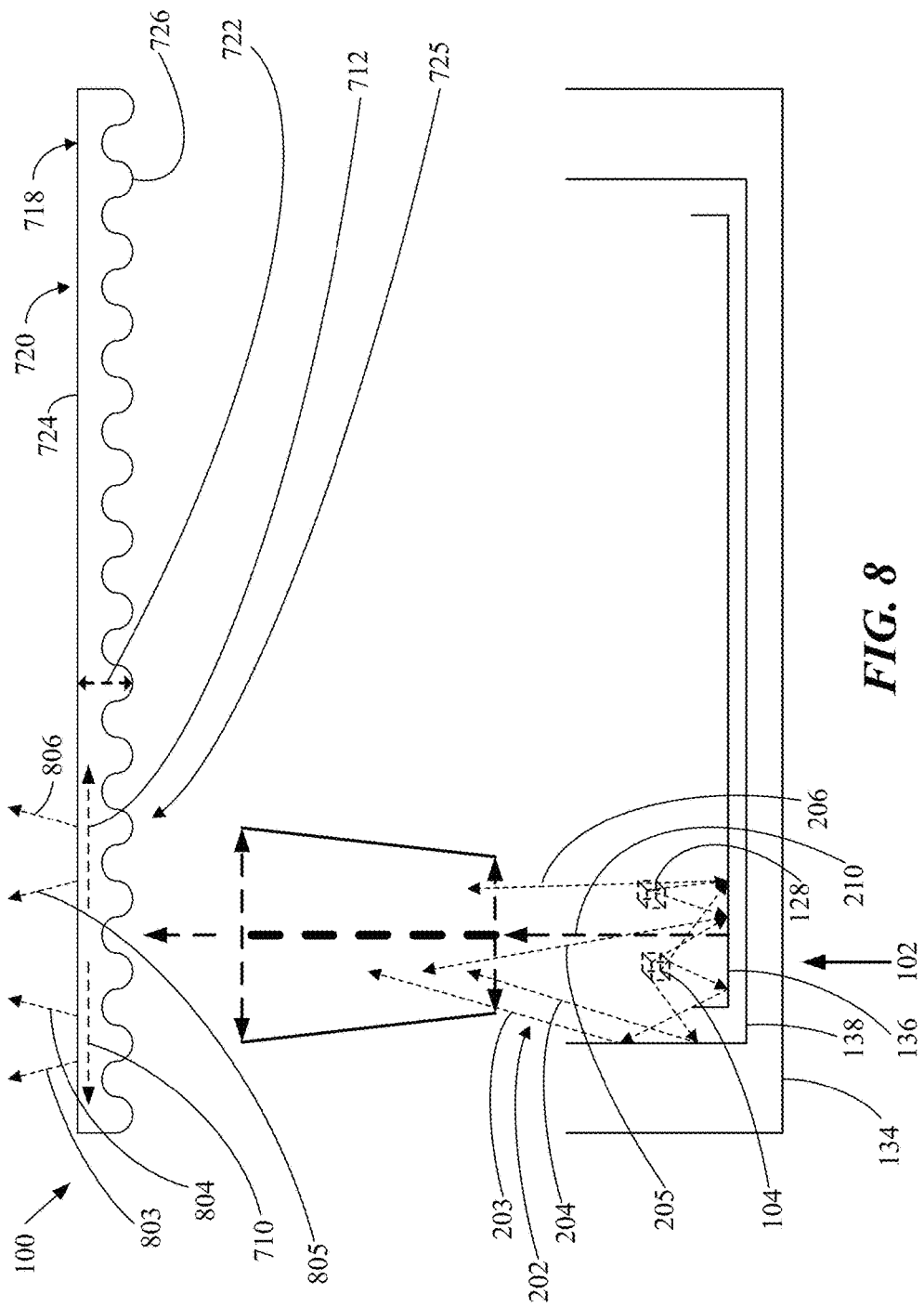
FIG. 8 is a cross-sectional side view taken along the line 8-8, showing the example of the additional lens module that may be included in the example [100] of the lighting system.

FIG. 7 is a perspective bottom view showing an example of an additional lens module that may be included in the example [100] of an implementation of a lighting system. FIG. 8 is a cross-sectional side view taken along the line 8-8, showing the example of the additional lens module that may be included in the example [100] of the lighting system. As shown in FIGS. 7-8, the example [100] of the implementation of the lighting system may include an additional lens module [718] including an additional diverging lens [720] having an additional lens axis [722], the additional diverging lens [720] being configured for causing divergence of some of the converged light emissions [212], [412] away from the additional lens axis [722] by an additional HWHM represented by each of the arrows [710], [712] being different than the third HWHM represented by each of the arrows [510], [512], to form additional diverged light emissions in directions represented by the arrows [803], [804], [805], [806] that diverge away from the central light emission axis [210]. As further shown in FIGS. 7-8, the additional diverging lens [720] may have an additional light output surface [724] being spaced apart along the additional lens axis [722] from an additional light input surface [726], and the additional light input surface [726] may include an additional lens screen [725] having lenticular or microprismatic features. In examples, the example [100] of the lighting system may be configured for detachably installing the first lens module [106] or the second lens module [306] in the lighting module [102] between the semiconductor light-emitting device [104] and the additional lens module [718]; and the example [100] of the lighting system may be configured for aligning the first lens axis [216] or the second lens axis [416] with the central light emission axis [210] and with the additional lens axis [722].

In further examples, the example [100] of the lighting system may be configured for interchangeably installing either the first lens module [106] or the second lens module [306] in the lighting module [102] between the semiconductor light-emitting device [104] and either the third lens module [118] or the additional lens module [718].

As another example of the example [100] of the lighting system, the lighting module [102] may include another semiconductor light-emitting device [128] being configured for emitting light emissions [202] along the central light emission axis [210]. In further examples of the example [100] of the lighting system, the lighting module [102] may include a plurality of additional semiconductor light-emitting devices [128], [130], [132], and the semiconductor light-emitting device [104] and the plurality of the additional semiconductor light-emitting devices [128], [130], [132] may be collectively arranged around and configured for emitting light emissions [202] along the central light emission axis [210]. In additional examples of the example [100] of the lighting system, one or more of the semiconductor light-emitting devices [104], [128], [130], [132] of the lighting module [102] may be configured as including a lumiphor (not shown) for changing a spectral power distribution of some of the light emissions [202].

In some examples of the example [100] of the lighting system, the first converging lens [108] may be configured for causing convergence of some of the light emissions [202] of the semiconductor light-emitting device [104] to form the converged light emissions [212] as having the first HWHM represented by each of the arrows [110], [112], [114], [116] being: about 3.5 degrees; or about 7.5 degrees; or about 12.5 degrees; or about 20 degrees. In further examples of the example [100] of the lighting system, the second converging lens [308] may be configured for causing convergence of some of the light emissions [202] of the semiconductor light-emitting device [104] to form the converged light emissions [412] as having the second HWHM represented by each of the arrows [310], [312], [314], [316] being: about 3.5 degrees; or about 7.5 degrees; or about 12.5 degrees; or about 20 degrees. In additional examples of the example [100] of the lighting system, the first diverging lens [120] may be configured for causing divergence of some of the converged light emissions [212], [412] away from the third lens axis [122] by a third HWHM represented by each of the arrows [510], [512] being: about 4 degrees; or about 10 degrees; or about 15 degrees; or about 25 degrees; or about 30 degrees. In other examples of the example [100] of the lighting system, the additional diverging lens [720] may be configured for causing divergence of some of the converged light emissions [212], [412] away from the additional lens axis [722] by another HWHM represented by each of the arrows [710], [712] being: about 4 degrees; or about 10 degrees; or about 15 degrees; or about 25 degrees; or about 30 degrees. In examples, an example [100] of the lighting system may include a diverging lens [120], [720] having a HWHM of: about 4 degrees including toroidal lenses each having a radius of about 0.815 millimeters ("mm") and a height of about 0.16 mm; or about 10 degrees including toroidal lenses each having a radius of about 0.825 millimeters ("mm") and a height of about 0.28 mm; or about 25 degrees including toroidal lenses each having a radius of about 0.845 millimeters ("mm") and a height of about 0.47 mm.

In examples of the example [100] of the lighting system, the first diverging lens [120] may have the first lens screen [125] as including an array of lenticular toroidal lenses. In further examples of the example [100] of the lighting system, the additional diverging lens [720] may have the additional lens screen [725] as including an array of lenticular toroidal lenses. In additional examples (not shown) of the example [100] of the lighting system, the either or both of the diverging lenses [120], [720] may respectively have the lens screen [125], [725] as including an array of microprismatic lenses.

In some examples of the example [100] of the lighting system, the first converging lens [108] may have a first diameter [228] transverse to the first lens axis [216] at the first light input surface [218], and the first converging lens [108] may have a second diameter [230] transverse to the first lens axis [216] at the first light output surface [214], and the first diameter [228] may be smaller than the second diameter [230]. In additional examples of the example [100] of the lighting system, the second converging lens [308] may have a first diameter [428] transverse to the second lens axis [416] at the second light input surface [418], and the second converging lens [308] may have a second diameter [430] transverse to the second lens axis [416] at the second light output surface [414], and the first diameter [428] may be smaller than the second diameter [430].

In other examples, the example [100] of the lighting system may include a housing [134] being configured for positioning the lighting module [102] for emission of the light emissions [202] from the semiconductor light-emitting device [104] along the central light emission axis [210]. In further examples, the example [100] of the lighting system may include a carrier [136] being configured for positioning the first lens module [106] or the second lens module [306] in the housing [134] with the first lens axis [216] or the second lens axis [416] being aligned with the central light emission axis [210]. In additional examples, the example [100] of the lighting system may include a primary visible light reflector [138] configured for being positioned between the housing [134] and the carrier [136], and the primary visible light reflector [138] may be configured for redirecting some of the light emissions [202] of the semiconductor light-emitting device [104] in the directions represented by the arrows [203], [204], [205], [206] along the central light emission axis [210]

Figure 9:
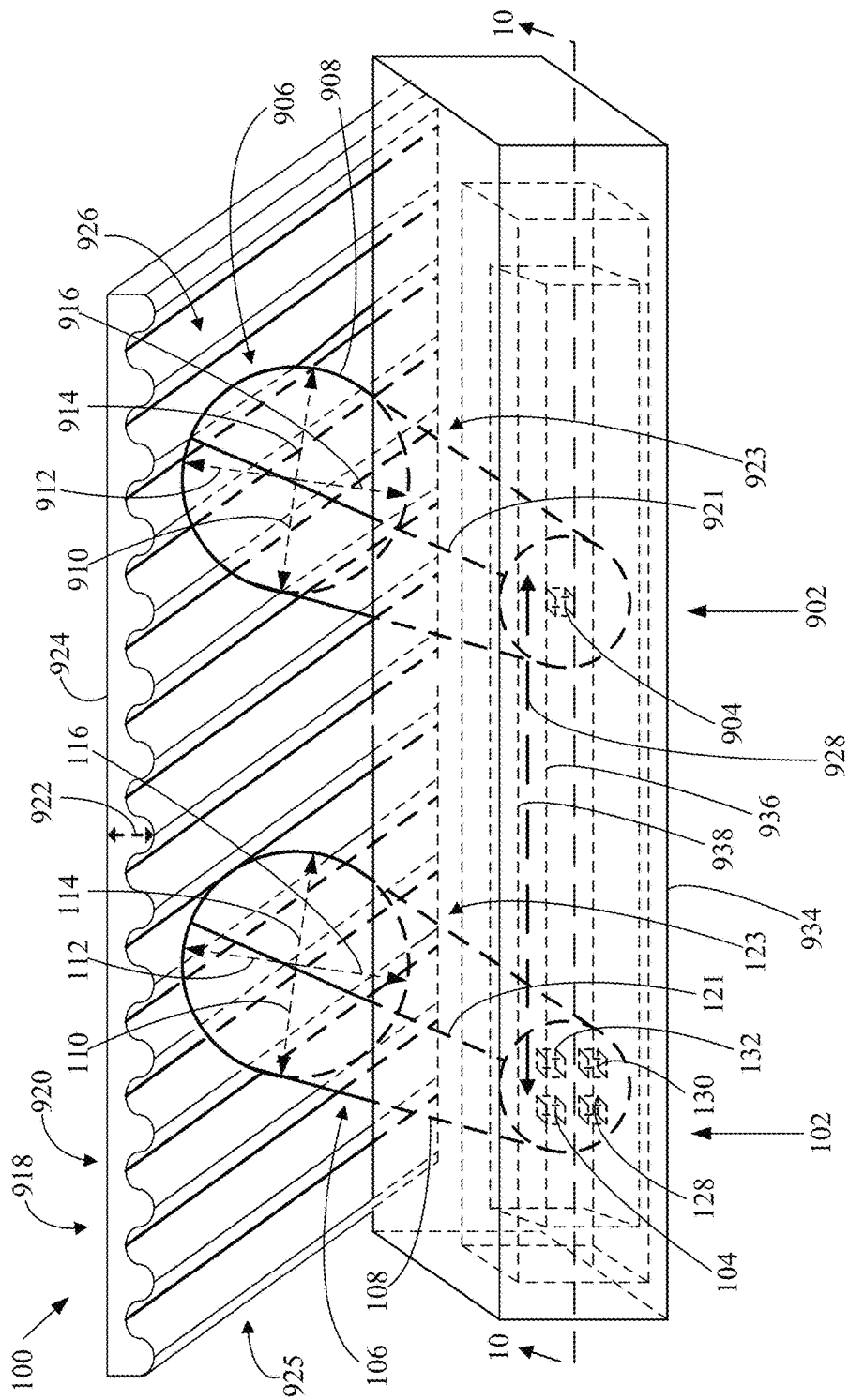
FIG. 9 is a perspective bottom view showing an example of a portion of a second lighting module that may be included in the example [100] of an implementation of a lighting system.
Figure 10:
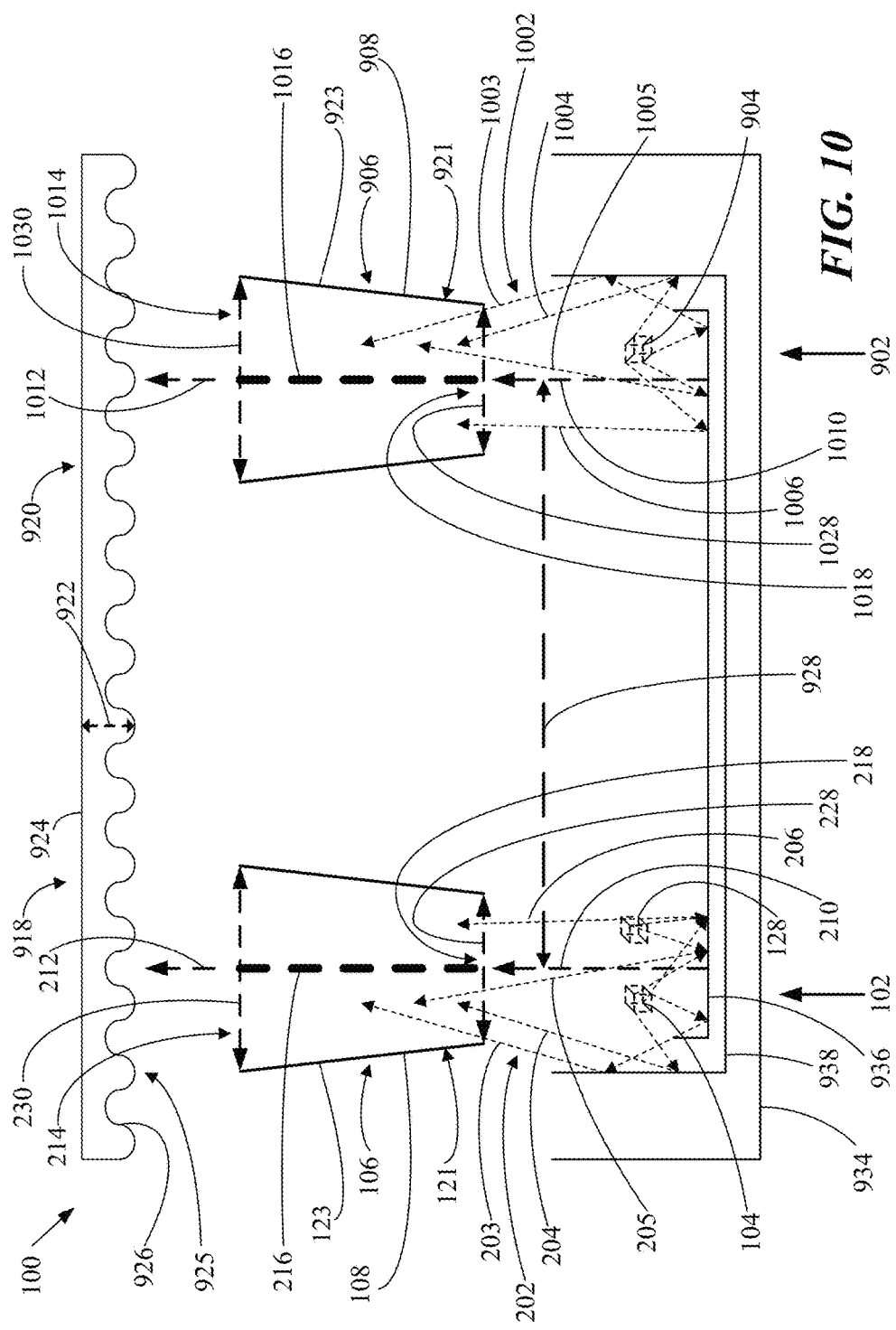
FIG. 10 is a cross-sectional side view taken along the line 10-10, showing the example of the portion of the second lighting module that may be included in the example [100] of the lighting system.

FIG. 9 is a perspective bottom view showing an example of a portion of a second lighting module that may be included in the example [100] of an implementation of a lighting system. FIG. 10 is a cross-sectional side view taken along the line 10-10, showing the example of the portion of the second lighting module that may be included in the example [100] of the lighting system. As shown in FIGS. 9-10, the example [100] of the implementation of the lighting system may include a second lighting module [902] including a second semiconductor light-emitting device [904] configured for emitting further light emissions [1002] in directions represented by the arrows [1003], [1004], [1005], [1006] along a second central light emission axis [1010]. Further, the example [100] of the lighting system may include a fourth lens module [906] that may include a third converging lens [908]. The third converging lens [908] of this example [100] of the lighting system may be configured for causing convergence of some of the further light emissions [1002] of the second semiconductor light-emitting device [904] to form additional converged light emissions [1012] along the second central light emission axis [1010] having a fourth HWHM represented by each of the arrows [910], [912], [914], [916], the third converging lens [908] having a fourth light output surface [1014] being spaced apart along a fourth lens axis [1016] from a fourth light input surface [1018], the third converging lens [908] further having a third total internal reflection side surface [921] being spaced apart around the fourth lens axis [1016] and having a third frusto-conical shape [923] extending between the fourth light input surface [1018] and the fourth light output surface [1014] of the third converging lens [908]. In further examples of the example [100] of the lighting system, the second lighting module [902] may include another or a plurality of additional semiconductor light-emitting devices (not shown), and the second semiconductor light-emitting device [904] and the another or the plurality of the additional semiconductor light-emitting devices may be collectively arranged around and configured for emitting the further light emissions [1002] along the second central light emission axis [1010]. In additional examples of the example [100] of the lighting system, the second semiconductor light-emitting device [904] and the another or the plurality of the additional semiconductor light-emitting devices of the second lighting module [902] may be configured as including a lumiphor (not shown) for changing a spectral power distribution of some of the further light emissions [1002].

Figure 11:
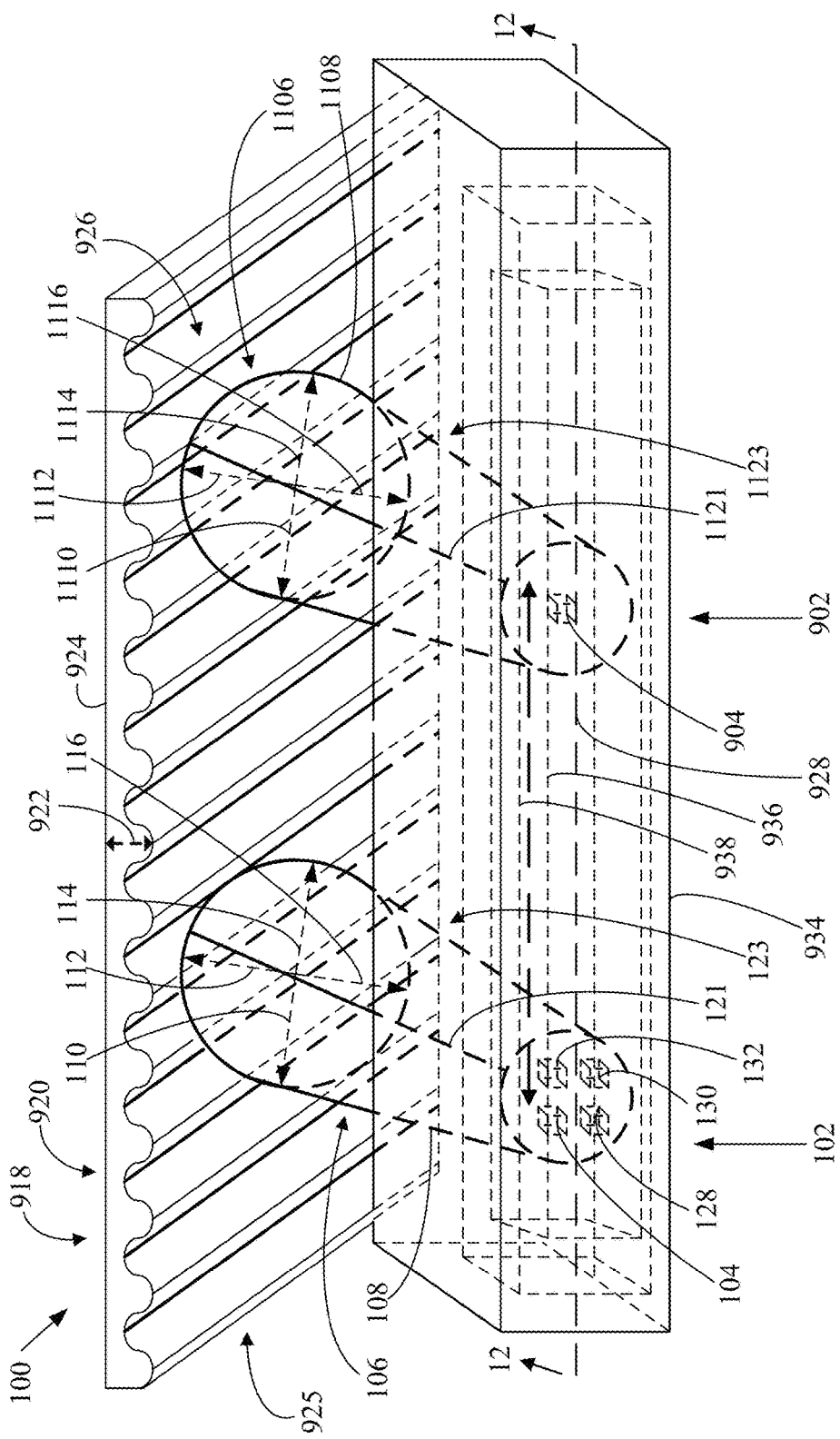
FIG. 11 is a perspective bottom view showing an example of another portion of the second lighting module that may be included in the example [100] of an implementation of a lighting system.
Figure 12:
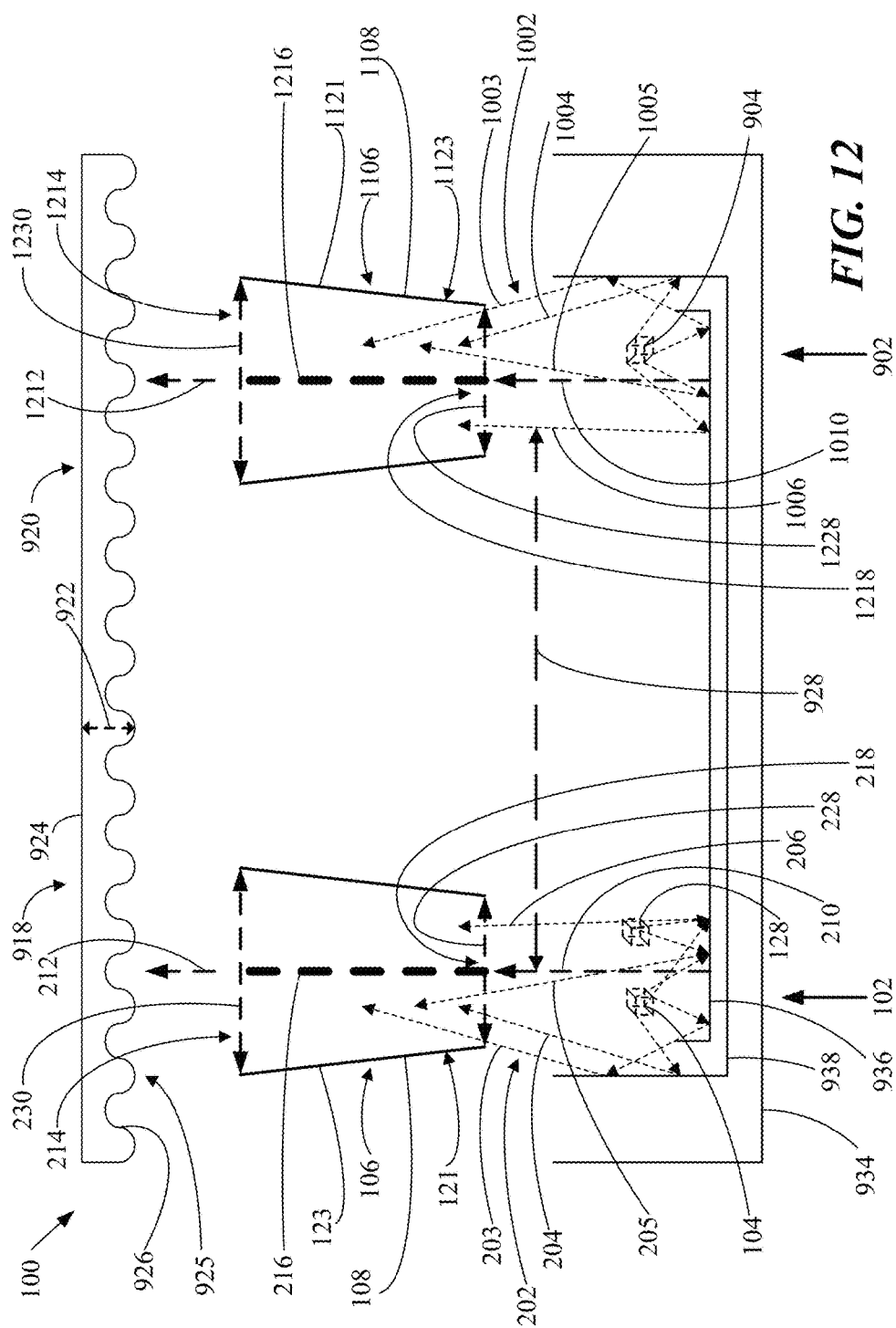
FIG. 12 is a cross-sectional side view taken along the line 12-12, showing the example of the another portion of the second lighting module that may be included in the example [100] of the lighting system.

FIG. 11 is a perspective bottom view showing an example of another portion of the second lighting module that may be included in the example [100] of an implementation of a lighting system. FIG. 12 is a cross-sectional side view taken along the line 12-12, showing the example of the another portion of the second lighting module that may be included in the example [100] of the lighting system. As shown in FIGS. 11-12, the example [100] of the implementation of the lighting system may include a fifth lens module [1106] that may include a fourth converging lens [1108]. The fourth converging lens [1108] may be configured for causing convergence of some of the further light emissions [1002] of the second semiconductor light-emitting device [904] to form other converged light emissions [1212] along the second central light emission axis [1010] having a fifth HWHM around the second central light emission axis [1010] as represented by each of the arrows [1110], [1112], [1114], [1116] being different than the fourth HWHM represented by each of the arrows [910], [912], [914], [916], the fourth converging lens [1108] having a fifth light output surface [1214] being spaced apart along a fifth lens axis [1216] from a fifth light input surface [1218], the fourth converging lens [1108] further having a fourth total internal reflection side surface [1121] being spaced apart around the fifth lens axis [1216] and having a fourth frusto-conical shape [1123] extending between the fifth light input surface [1218] and the fifth light output surface [1214] of the fourth converging lens [1108].

Figure 13:
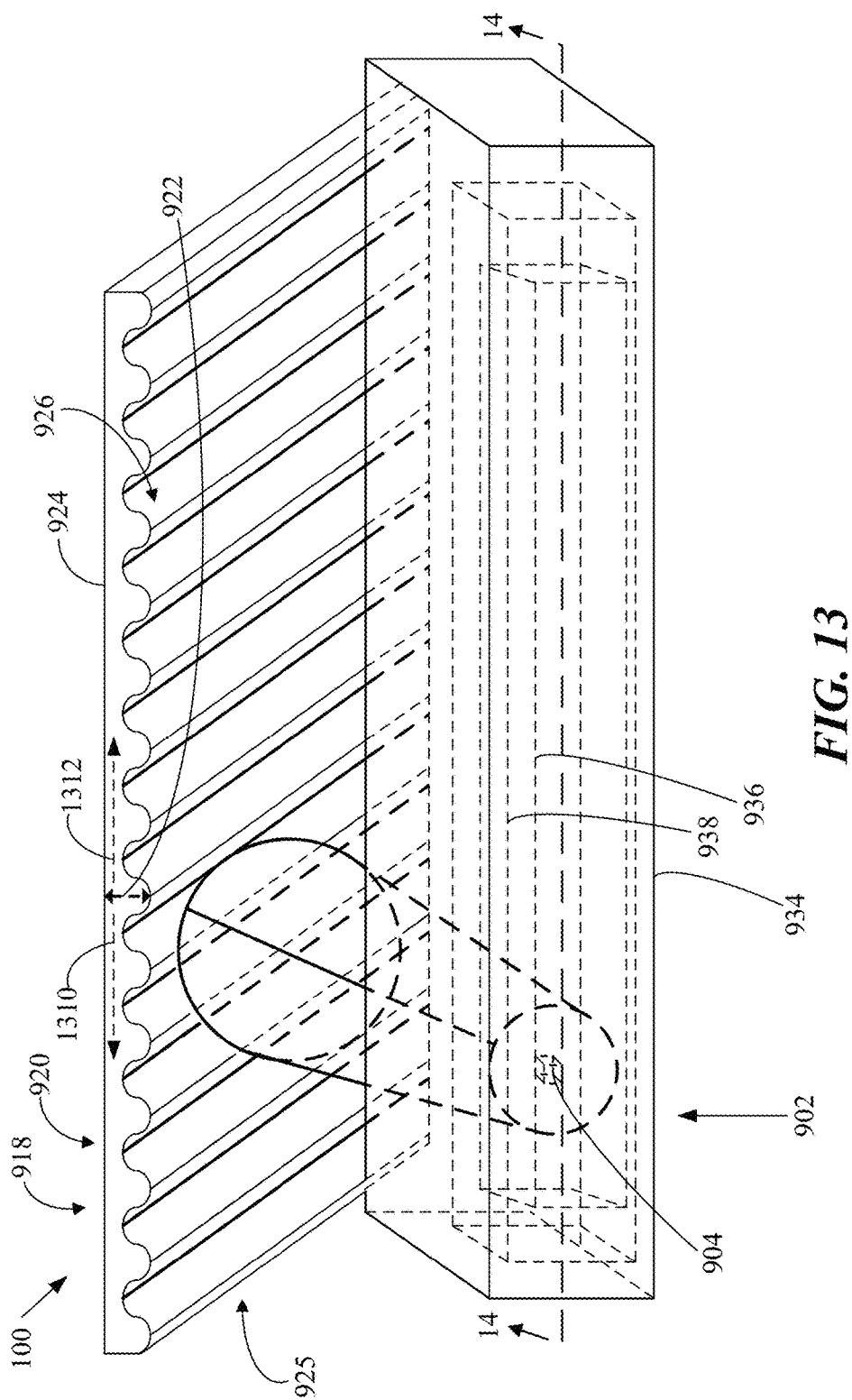
FIG. 13 is a perspective bottom view showing an example of a further portion of the second lighting module that may be included in the example [100] of an implementation of a lighting system.
Figure 14:
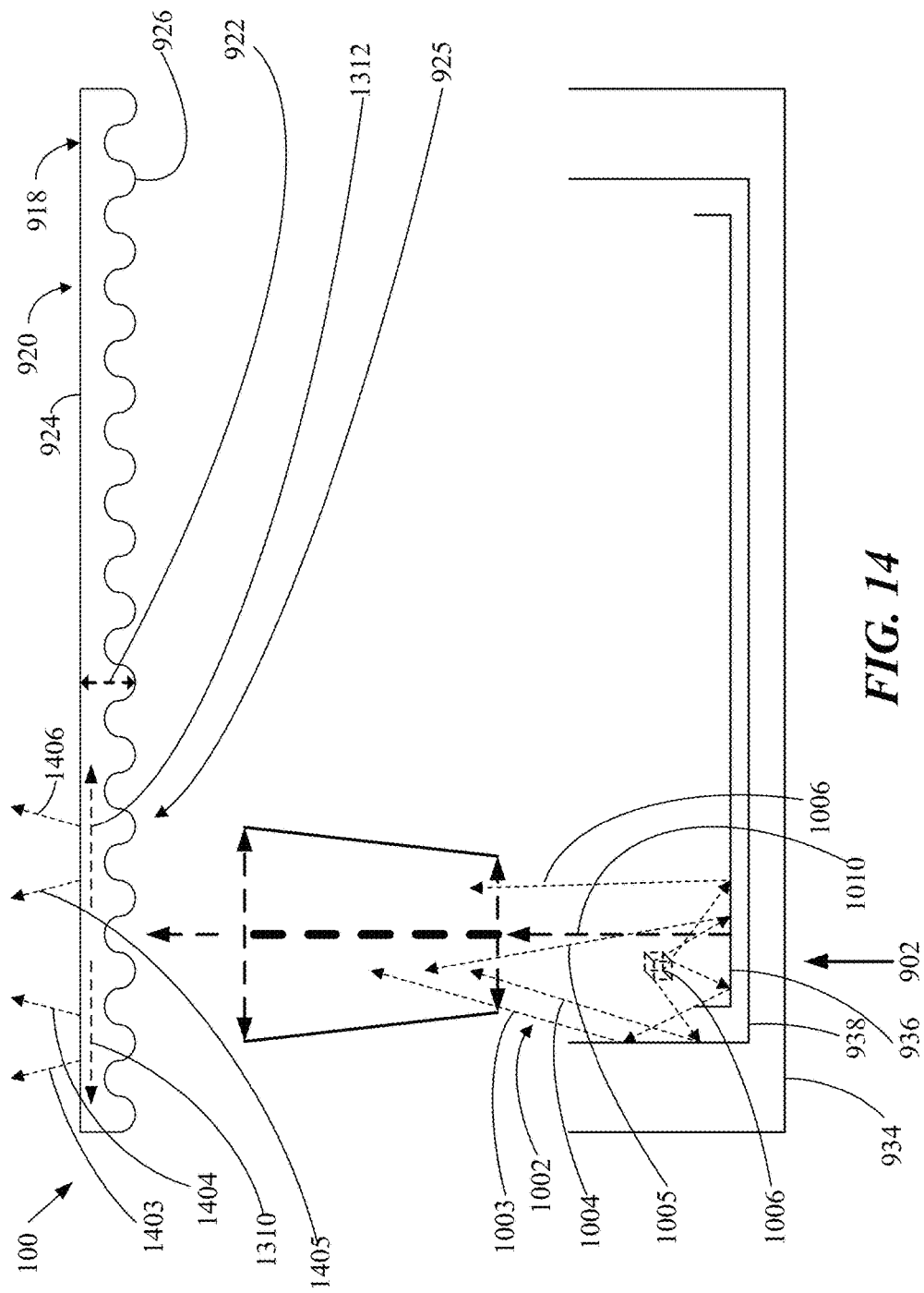
FIG. 14 is a cross-sectional side view taken along the line 14-14, showing the example of the further portion of the second lighting module that may be included in the example [100] of the lighting system.

FIG. 13 is a perspective bottom view showing an example of a further portion of the second lighting module that may be included in the example [100] of an implementation of a lighting system. FIG. 14 is a cross-sectional side view taken along the line 14-14, showing the example of the further portion of the second lighting module that may be included in the example [100] of the lighting system. As shown in FIGS. 9-14, the example [100] of the implementation of the lighting system may include a sixth lens module [918] including a second diverging lens [920] having a sixth lens axis [922], the second diverging lens [920] being configured for causing divergence of some of the converged light emissions [1012], [1212] from each of the lens modules [906], [1106] away from the sixth lens axis [922] by a sixth HWHM represented by each of the arrows [1310], [1312] to form diverged light emissions in directions represented by the arrows [1403], [1404], [1405], [1406] that diverge away from the second central light emission axis [1010]. As shown in FIGS. 9-14, the second diverging lens [920] may have a sixth light output surface [924] being spaced apart along the sixth lens axis [922] from a sixth light input surface [926], the sixth light input surface [926] including a second lens screen [925] having lenticular or microprismatic features.

In examples, the example [100] of the lighting system may be configured for detachably installing the fourth lens module [906] or the fifth lens module [1106] in the second lighting module [902] between the second semiconductor light-emitting device [904] and the sixth lens module [918]; and the example [100] of the lighting system may be configured for aligning the fourth lens axis [1016] or the fifth lens axis [1216] with the second central light emission axis [1010] and the sixth lens axis [922].

In some examples of the example [100] of the lighting system, the third converging lens [908] may be configured for causing convergence of some of the further light emissions [1002] of the second semiconductor light-emitting device [904] to form the converged light emissions [1012] as having the fourth HWHM represented by each of the arrows [910], [912], [914], [916] being: about 3.5 degrees; or about 7.5 degrees; or about 12.5 degrees; or about 20 degrees. In further examples of the example [100] of the lighting system, the fourth converging lens [1108] may be configured for causing convergence of some of the further light emissions [1002] of the second semiconductor light-emitting device [904] to form the converged light emissions [1212] as having the fifth HWHM represented by each of the arrows [1110], [1112], [1114], [1116] being: about 3.5 degrees; or about 7.5 degrees; or about 12.5 degrees; or about 20 degrees. In additional examples of the example [100] of the lighting system, the second diverging lens [920] may be configured for causing divergence of some of the converged light emissions [212], [412], [1012], [1212] away from the sixth lens axis [922] by a sixth HWHM represented by each of the arrows [1310], [1312] being: about 4 degrees; or about 10 degrees; or about 15 degrees; or about 25 degrees; or about 30 degrees. In examples of the example [100] of the lighting system, the second diverging lens [920] may have the second lens screen [925] as including an array of lenticular toroidal lenses. In other examples (not shown) of the example [100] of the lighting system, the second diverging lens [920] may have the second lens screen [925] as including an array of microprismatic lenses.

In some examples of the example [100] of the lighting system, the third converging lens [908] may have a third diameter [1028] transverse to the fourth lens axis [1016] at the fourth light input surface [1018], and the third converging lens [908] may have a fourth diameter [1030] transverse to the fourth lens axis [1016] at the fourth light output surface [1014], and the third diameter [1028] may be smaller than the fourth diameter [1030]. In additional examples of the example [100] of the lighting system, the fourth converging lens [1108] may have a third diameter [1228] transverse to the fifth lens axis [1216] at the fifth light input surface [1218], and the fourth converging lens [1108] may have a fourth diameter [1230] transverse to the fifth lens axis [1216] at the fifth light output surface [1214], and the third diameter [1228] may be smaller than the fourth diameter [1230].

In other examples, the example [100] of the lighting system may include a housing [934] being configured: for positioning the lighting module [102] for emission of the light emissions [202] from the semiconductor light-emitting device [104] along the central light emission axis [210]; and for positioning the second lighting module [902] for emission of the further light emissions [1002] from the second semiconductor light-emitting device [904] along the second central light emission axis [1010]. In further examples, the example [100] of the lighting system may include a carrier [936] being configured: for positioning the first lens module [106] or the second lens module [306] in the housing [934] with the first lens axis [216] or the second lens axis [416] being aligned with the central light emission axis [210]; and for positioning the fourth lens module [906] or the fifth lens module [1106] in the housing [934] with the fourth lens axis [1016] or the fifth lens axis [1216] being aligned with the second central light emission axis [1010]. In additional examples, the example [100] of the lighting system may include a primary visible light reflector [938] configured for being positioned between the housing [934] and the carrier [936], and the primary visible light reflector [938] may be configured for redirecting some of the further light emissions [1002] of the second semiconductor light-emitting device [904] in the directions represented by the arrows [1003], [1004], [1005], [1006] along the second central light emission axis [1010].

Figure 16:
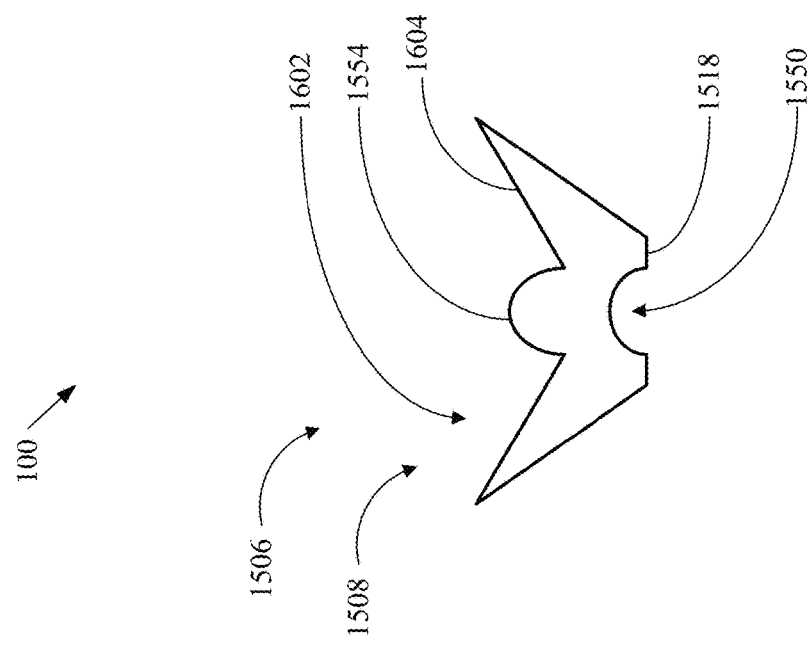
FIG. 16 is a cross-sectional side view taken along the line 16-16, showing the example of the another lens module that may be included in the example [100] of the lighting system.
Figure 15:
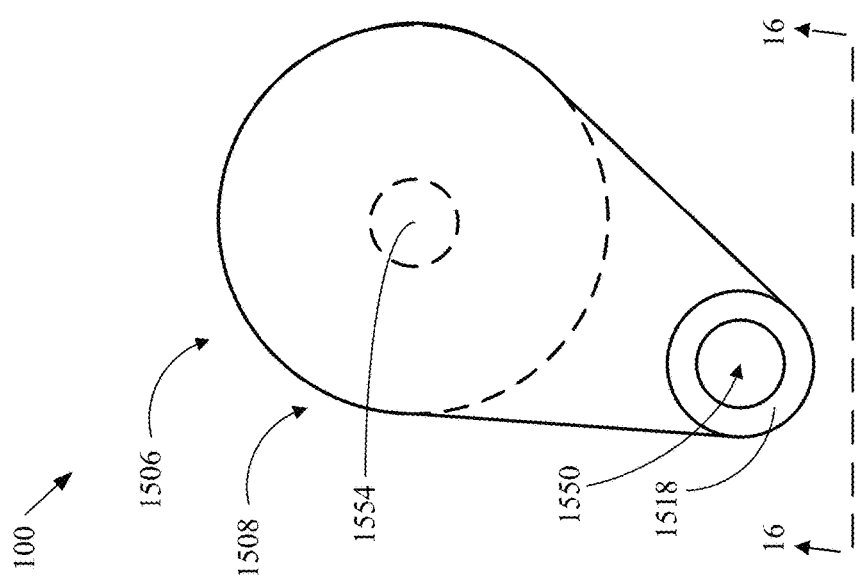
FIG. 15 is a perspective bottom view showing an example of another lens module that may be included in the example [100] of an implementation of a lighting system.

FIG. 15 is a perspective bottom view showing an example of another lens module that may be included in the example [100] of an implementation of a lighting system. FIG. 16 is a cross-sectional side view taken along the line 16-16, showing the example of the another lens module that may be included in the example [100] of the lighting system. In examples, the example [100] of the lighting system may include a lens module [1506] as being: the first lens module [106]; or the second lens module [306]; or the fourth lens module [906]; or the fifth lens module [1106]. As examples, the lens module [1506] may include a converging lens [1508]. In examples, the converging lens [1508] may include a light input surface [1518] having a central cavity [1550] being shaped as a portion of a spheroid. In further examples, the converging lens [1508] may include a light output surface [1602] having a bowl-shaped cavity [1604] surrounding a central mound [1554] shaped as a portion of a spheroid. In some examples of the example [100] of the lighting system, the converging lens [1508] may be configured for causing convergence of some of the light emissions [202], [1002] of the semiconductor light-emitting devices [104], [904] to form the converged light emissions [212], [412], [1012], [1212] as having a HWHM being about 3.5 degrees.

Figure 18:
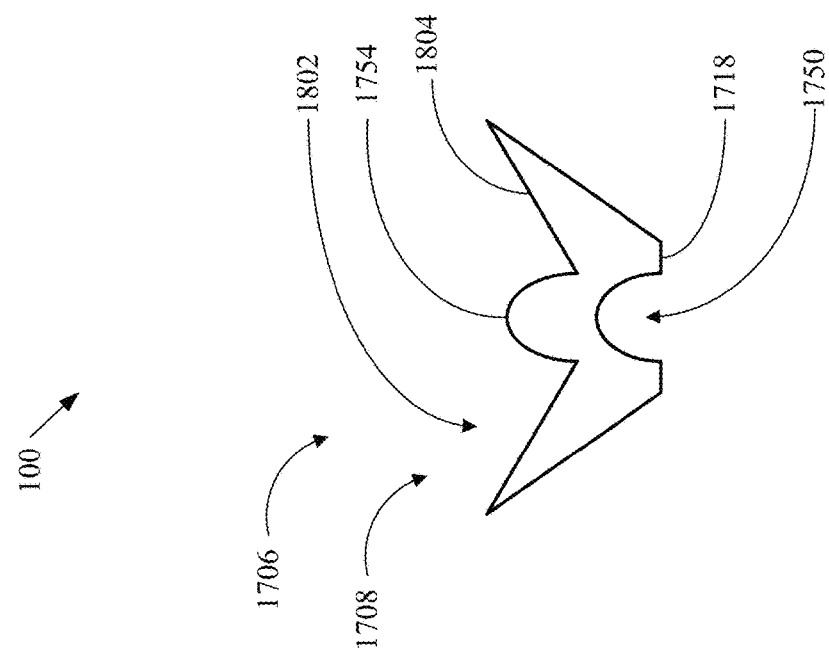
FIG. 18 is a cross-sectional side view taken along the line 18-18, showing the example of the further lens module that may be included in the example [100] of the lighting system.
Figure 17:
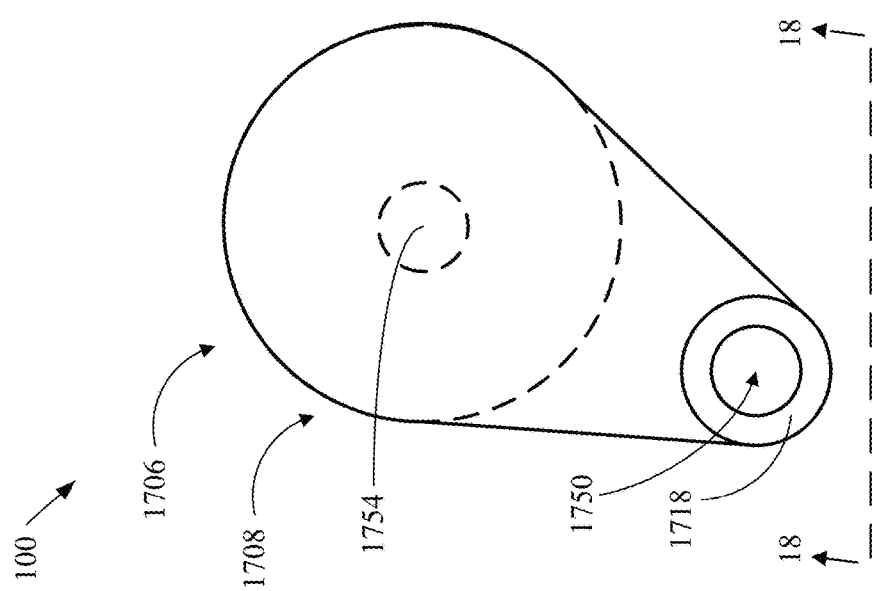
FIG. 17 is a perspective bottom view showing an example of a further lens module that may be included in the example [100] of an implementation of a lighting system.

FIG. 17 is a perspective bottom view showing an example of a further lens module that may be included in the example [100] of an implementation of a lighting system. FIG. 18 is a cross-sectional side view taken along the line 18-18, showing the example of the further lens module that may be included in the example [100] of the lighting system. In examples, the example [100] of the lighting system may include a lens module [1706] as being: the first lens module [106]; or the second lens module [306]; or the fourth lens module [906]; or the fifth lens module [1106]. As examples, the lens module [1706] may include a converging lens [1708]. In examples, the converging lens [1708] may include a light input surface [1718] having a central cavity [1750] being shaped as a portion of a spheroid. In further examples, the converging lens [1708] may include a light output surface [1802] having a bowl-shaped cavity [1804] surrounding a central mound [1754] shaped as a portion of a spheroid. In some examples of the example [100] of the lighting system, the converging lens [1708] may be configured for causing convergence of some of the light emissions [202], [1002] of the semiconductor light-emitting devices [104], [904] to form the converged light emissions [212], [412], [1012], [1212] as having a HWHM being about 7.5 degrees.

Figure 20:
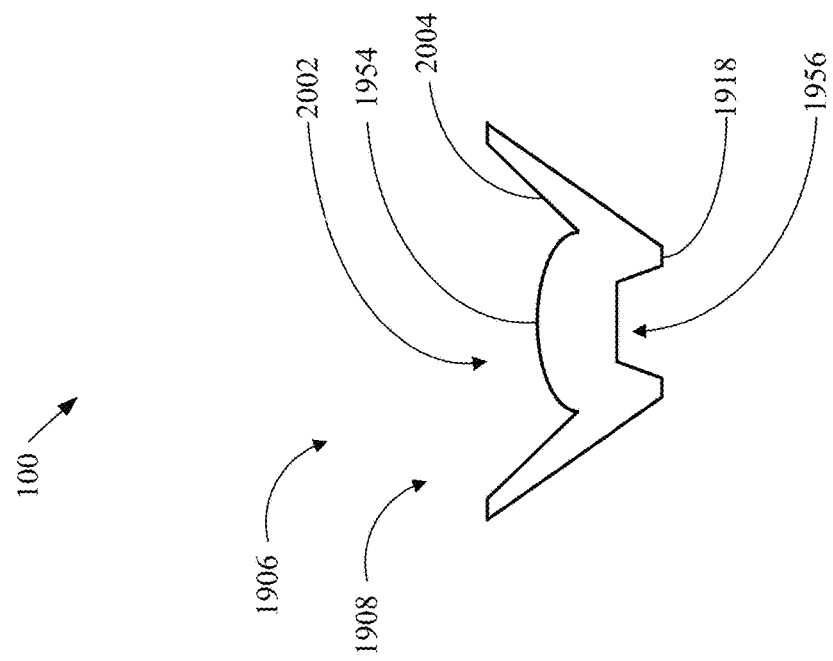
FIG. 20 is a cross-sectional side view taken along the line 20-20, showing the example of the additional lens module that may be included in the example [100] of the lighting system.
Figure 19:
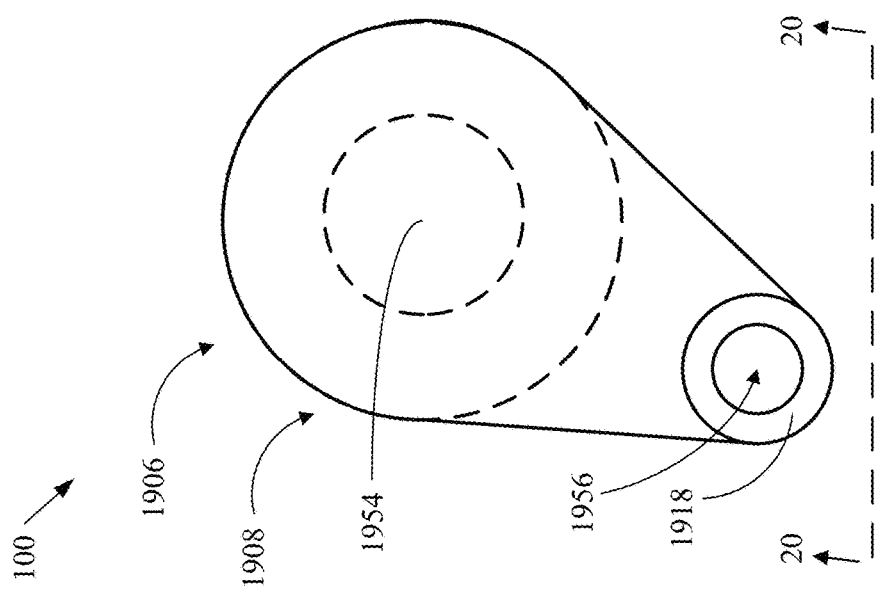
FIG. 19 is a perspective bottom view showing an example of an additional lens module that may be included in the example [100] of an implementation of a lighting system.

FIG. 19 is a perspective bottom view showing an example of an additional lens module that may be included in the example [100] of an implementation of a lighting system. FIG. 20 is a cross-sectional side view taken along the line 20-20, showing the example of the additional lens module that may be included in the example [100] of the lighting system. In examples, the example [100] of the lighting system may include a lens module [1906] as being: the first lens module [106]; or the second lens module [306]; or the fourth lens module [906]; or the fifth lens module [1106]. As examples, the lens module [1906] may include a converging lens [1908]. In examples, the converging lens [1908] may include a light input surface [1918] having a central disk-shaped cavity [1956]. In further examples, the converging lens [1908] may include a light output surface [2002] having a bowl-shaped cavity [2004] surrounding a central mound [1954] shaped as a portion of a spheroid. In some examples of the example [100] of the lighting system, the converging lens [1908] may be configured for causing convergence of some of the light emissions [202], [1002] of the semiconductor light-emitting devices [104], [904] to form the converged light emissions [212], [412], [1012], [1212] as having a HWHM being about 12.5 degrees.

Figure 22:
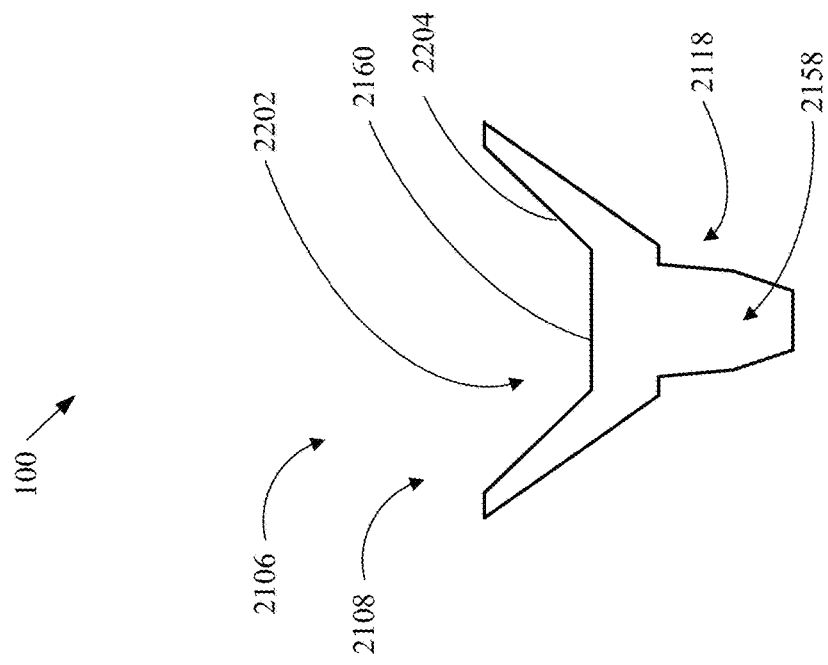
FIG. 22 is a cross-sectional side view taken along the line 22-22, showing the example of the another lens module that may be included in the example [100] of the lighting system.
Figure 21:
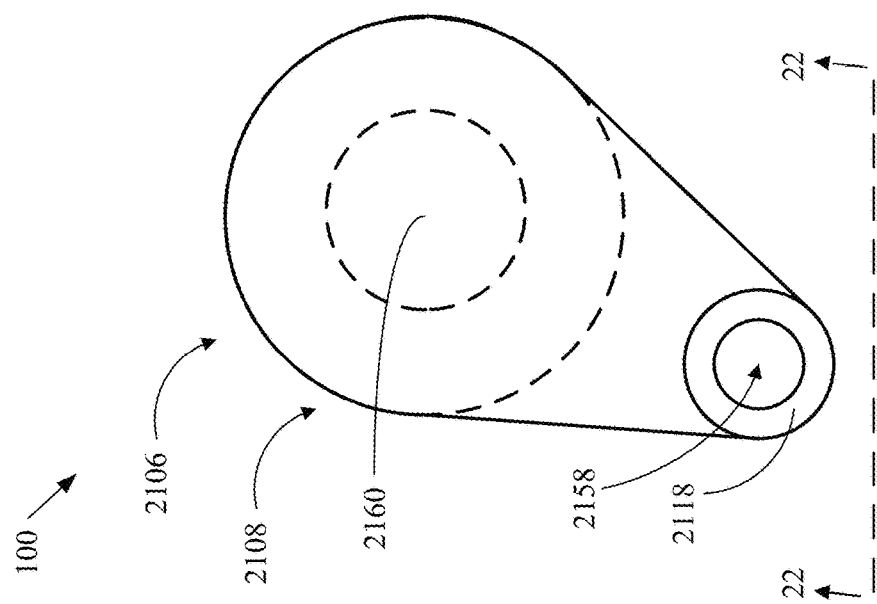
FIG. 21 is a perspective bottom view showing an example of another lens module that may be included in the example [100] of an implementation of a lighting system.

FIG. 21 is a perspective bottom view showing an example of another lens module that may be included in the example [100] of an implementation of a lighting system. FIG. 22 is a cross-sectional side view taken along the line 22-22, showing the example of the another lens module that may be included in the example [100] of the lighting system. In examples, the example [100] of the lighting system may include a lens module [2106] as being: the first lens module [106]; or the second lens module [306]; or the fourth lens module [906]; or the fifth lens module [1106]. As examples, the lens module [2106] may include a converging lens [2108]. In examples, the converging lens [2108] may include a light input surface [2118] having a central compound parabolic concentrator [2158]. In further examples, the converging lens [2108] may include a light output surface [2202] having a bowl-shaped cavity [2204] surrounding a central flat region [2160]. In some examples of the example [100] of the lighting system, the converging lens [2108] may be configured for causing convergence of some of the light emissions [202], [1002] of the semiconductor light-emitting devices [104], [904] to form the converged light emissions [212], [412], [1012], [1212] as having a HWHM being about 20 degrees.

In some examples, the example [100] of the lighting system may be configured for interchangeably installing either: the first lens module [106] in the lighting module [102] and the fourth lens module [906] in the second lighting module [902]; or the second lens module [306] in the lighting module [102] and the fifth lens module [1106] in the second lighting module [902]. In additional examples, the example [100] of the lighting system may include the first lens module [106] as being integral with the fourth lens module [906], and may include the second lens module [306] as being integral with the fifth lens module [1106]. In further examples [100] of the lighting system (not shown), the first lens module [106] may be integral with a plurality of fourth lens modules [906]; and the second lens module [306] may be integral with a plurality of fifth lens modules [1106]. In additional examples [100] of the lighting system (not shown), the first lens module [106] and the plurality of fourth lens modules [906], or the second lens module [306] and the plurality of fifth lens modules [1106], may collectively be integrated in a row, or in a plurality of rows, or in a circle. As further examples [100] of the lighting system (not shown), a plurality of the fourth lens modules [906], being within a range of between one and about twenty, or being within a range of between one and about one hundred, may be integrated together with the first lens module [106]. As other examples [100] of the lighting system (not shown), a plurality of the fifth lens modules [1106], being within a range of between one and about twenty, or being within a range of between one and about one hundred, may be integrated together with the second lens module [306].

Figure 23:
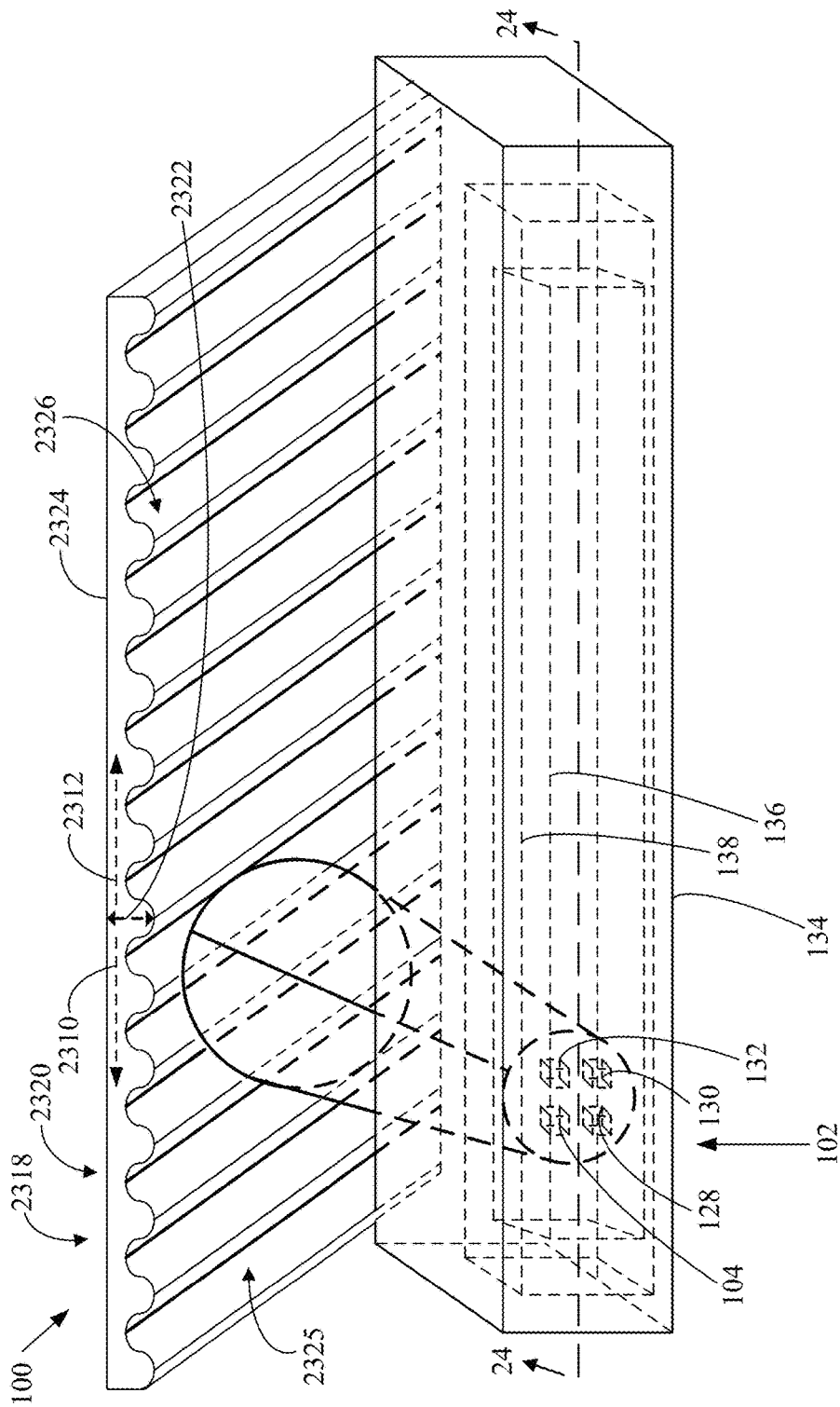
FIG. 23 is a perspective bottom view showing an example of a seventh lens module that may be included in the example [100] of an implementation of a lighting system.
Figure 24:
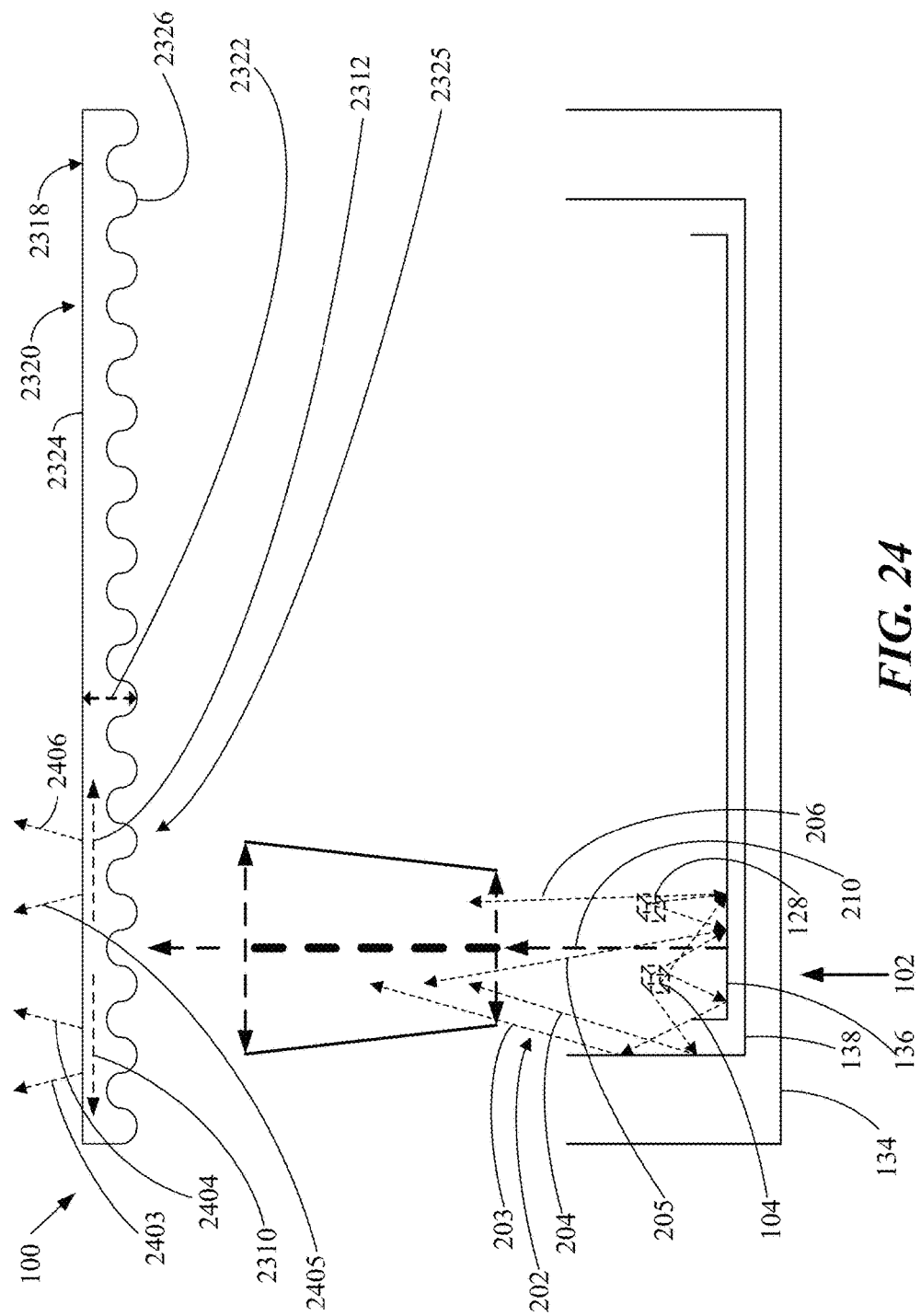
FIG. 24 is a cross-sectional side view taken along the line 24-24, showing the example of the seventh lens module that may be included in the example [100] of the lighting system.

FIG. 23 is a perspective bottom view showing an example of a seventh lens module that may be included in the example [100] of an implementation of a lighting system. FIG. 24 is a cross-sectional side view taken along the line 24-24, showing the example of the seventh lens module that may be included in the example [100] of the lighting system. In some examples [100], the lighting system may include a seventh lens module [2318] including a third diverging lens [2320] having a seventh lens axis [2322], the third diverging lens [2320] being configured for causing divergence of some of the converged light emissions [212], [412] away from the seventh lens axis [2322] by a seventh HWHM represented by each of the arrows [2310], [2312], being different than the third HWHM represented by each of the arrows [510], [512], to form additional diverged light emissions represented by the arrows [2403], [2404], [2405], [2406] that may diverge away from the central light emission axis [210]. As examples, the third diverging lens [2320] may have a seventh light output surface [2324] being spaced apart along the seventh lens axis [2322] from a seventh light input surface [2326], the seventh light input surface [2326] including a third lens screen [2325] having lenticular or microprismatic features. In examples, the example [100] of the lighting system may be configured for detachably installing the first lens module [106] or the second lens module [306]

in the lighting module [102] between the semiconductor light-emitting device [104] and the seventh lens module [2318]; and the example [100] of the lighting system may be configured for aligning the first lens axis [216] or the second lens axis [416] with the central light emission axis [210] and the seventh lens axis [2322].

Figure 25:
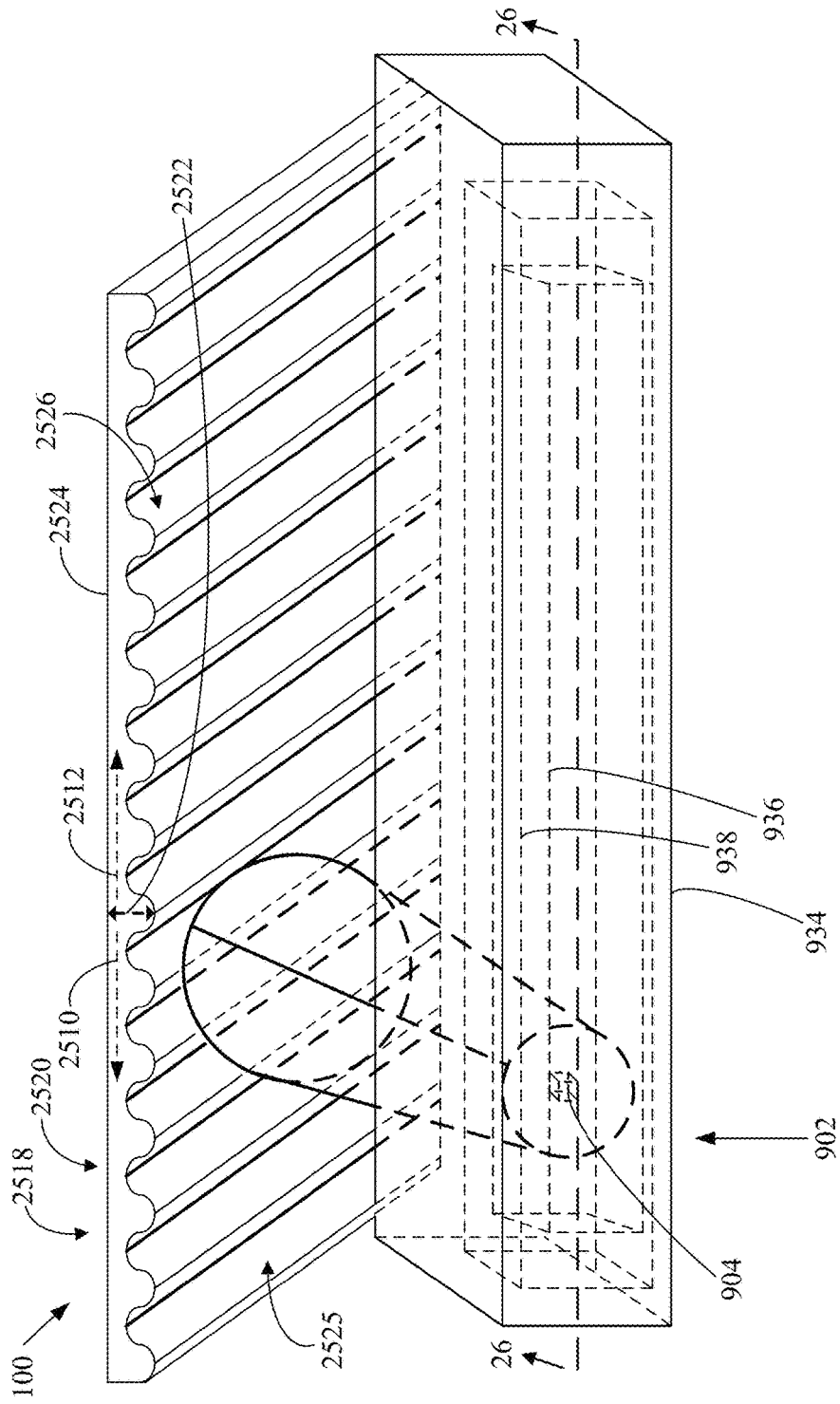
FIG. 25 is a perspective bottom view showing an example of an eighth lens module that may be included in the example [100] of an implementation of a lighting system.
Figure 26:
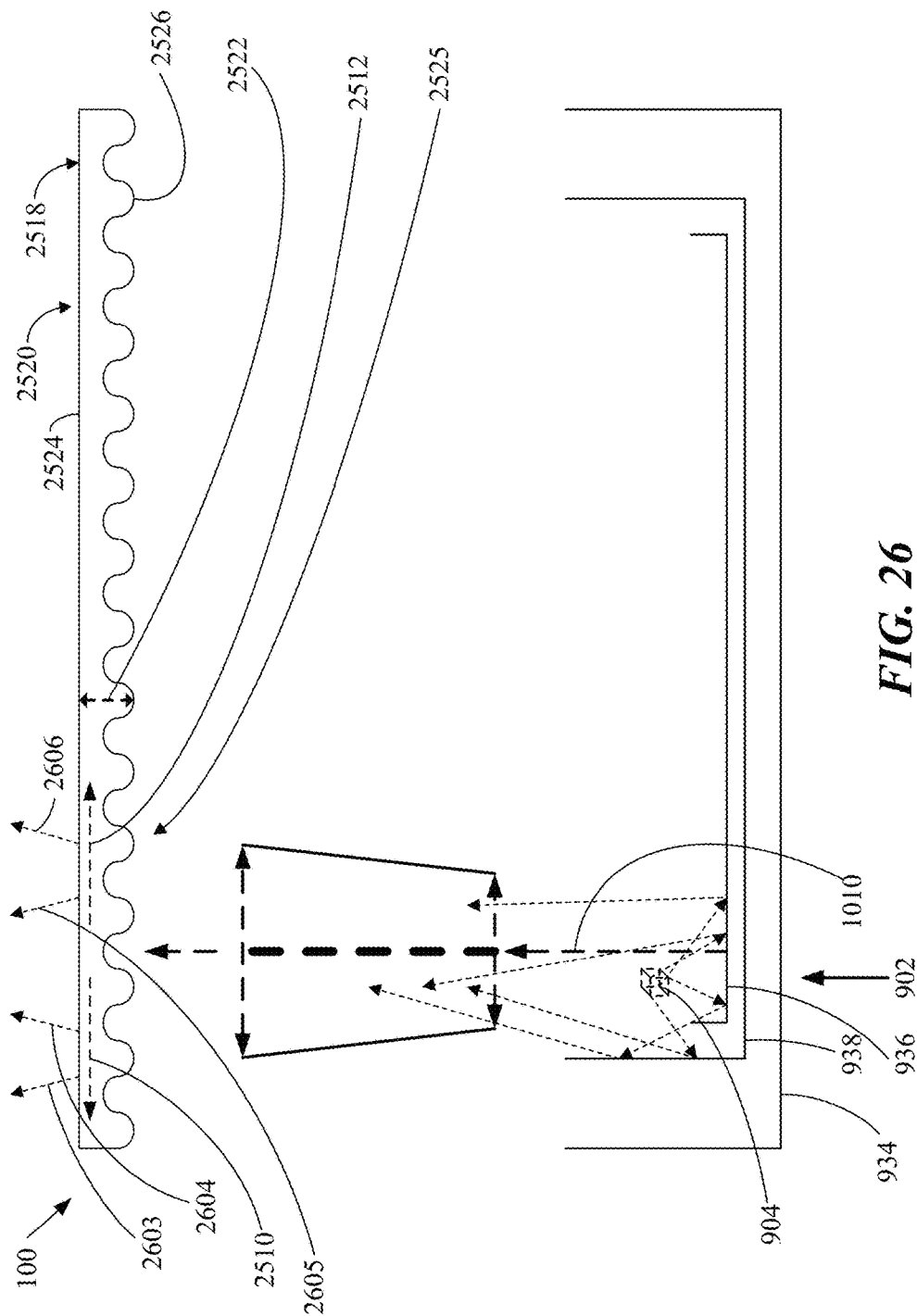
FIG. 26 is a cross-sectional side view taken along the line 26-26, showing the example of the eighth lens module that may be included in the example [100] of the lighting system.

FIG. 25 is a perspective bottom view showing an example of an eighth lens module that may be included in the example [100] of an implementation of a lighting system. FIG. 26 is a cross-sectional side view taken along the line 26-26, showing the example of the eighth lens module that may be included in the example [100] of the lighting system. In some examples [100], the lighting system may include an eighth lens module [2518] including a fourth diverging lens [2520] having an eighth lens axis [2522], the fourth diverging lens [2520] being configured for causing divergence of some of the converged light emissions [1012], 1212] away from the eighth lens axis [2522] by an eighth HWHM represented by each of the arrows [2510], [2512], being different than the sixth HWHM represented by each of the arrows [1310], [1312], to form additional diverged light emissions represented by arrows [2603], [2604], [2605], [2606] that may diverge away from the second central light emission axis [1010]. As examples, the fourth diverging lens [2520] may have an eighth light output surface [2524] being spaced apart along the eighth lens axis [2522] from an eighth light input surface [2526], the eighth light input surface [2526] including a fourth lens screen [2525] having lenticular or microprismatic features. In examples, the example [100] of the lighting system may be configured for detachably installing the fourth lens module [906] or the fifth lens module [1106] in the second lighting module [902] between the second semiconductor light-emitting device [904] and the eighth lens module [2518]; and the example [100] of the lighting system may be configured for aligning the fourth lens axis [1016] or the fifth lens axis [1216] with the second central light emission axis [1010] and the eighth lens axis [2522]

In some examples, the example [100] of the lighting system may be configured for interchangeably installing either: the third lens module [118] in the lighting module [102] and the sixth lens module [918] in the second lighting module [902]; or the seventh lens module [2318] in the lighting module [102] and the eighth lens module [2518] in the second lighting module [902]. In further examples [100] of the lighting system, the third lens module [118] may be integral with the sixth lens module [918], and the seventh lens module [2318] may be integral with the eighth lens module [2518]. In further examples [100] of the lighting system (not shown), the third lens module [118] may be integral with a plurality of sixth lens modules [918]; and the seventh lens module [2318] may be integral with a plurality of eighth lens modules [2518]. In additional examples [100] of the lighting system (not shown), the third lens module [118] and the plurality of sixth lens modules [918], or the seventh lens module [2318] and the plurality of eighth lens modules [2518], may collectively be integrated in a row, or in a plurality of rows, or in a circle. As further examples [100] of the lighting system (not shown), a plurality of the sixth lens modules [918], being within a range of between one and about twenty, or being within a range of between one and about one hundred, may be integrated together with the third lens module [118]. As other examples [100] of the lighting system (not shown), a plurality of the seventh lens modules [2318], being within a range of between one and about twenty, or being within a range of between one and about one hundred, may be integrated together with the eighth lens module [2518].

In additional examples [100] of the lighting system, the third HWHM of the third lens module [118] may be the same as the sixth HWHM of the sixth lens module [918]; and the seventh HWHM of the seventh lens module [2318] may be the same as the eighth HWHM of the eighth lens module [2518]. As other examples, the example [100] of the lighting system may be further configured for interchangeably installing either: the first lens module [106] in the lighting module [102] and the fourth lens module [906] in the second lighting module [902]; or the second lens module [306] in the lighting module [102] and the fifth lens module [1106] in the second lighting module [902]. In additional examples [100] of the lighting system [100], the first lens module [106] may be integral with the fourth lens module [906], and the second lens module [306] may be integral with the fifth lens module [1106].

In some examples [100] of the lighting system, the first diverging lens [120] may be integral with the second diverging lens [920]; and the example [100] of the lighting system may be configured for positioning the semiconductor light-emitting device [104] as being spaced apart on a longitudinal axis [928] away from the second semiconductor light-emitting device [904], and the first and second diverging lenses [120], [920] may be integrally configured for causing divergence of some of the converged light emissions [212], [412], [1012], [1212] away from the central light emission axes [210], [1010] in directions that are spaced apart from directions along the longitudinal axis [928]. In additional examples [100] of the lighting system, each of the first and second diverging lenses [120], [920] may be configured for causing divergence of some of the converged light emissions [212], [412], [1012], [1212] away from the central light emission axes [210], [1010] in directions that are spaced apart from directions along the longitudinal axis [928] by an HWHM being: about 4 degrees; or about 10 degrees; or about 15 degrees; or about 25 degrees; or about 30 degrees.

In some examples [100] of the lighting system, the first, second, third and fourth converging lenses [108], [308], [908], and [1108] may respectively be configured for forming the converged light emissions [212], [412], [1012], [1212] as having the first, second, fourth, and fifth HWHM being within a range of between about 2 degrees and about 5 degrees; and the first and second diverging lenses [120], [920] may be configured for causing divergence of some of the converged light emissions [212], [412], [1012], [1212] away from the central light emission axes [210], [1010] in directions that are spaced apart from directions along the longitudinal axis [928] by an HWHM being within a range of between about 2 degrees and about 6 degrees. Further in those examples [100] of the lighting system, the diverged light emissions may have a cumulative HWHM away from the central light emission axes [210], [1010] in directions that are spaced apart from directions along the longitudinal axis [928] being within a range of between about 4 degrees and about 11 degrees.

In some examples [100] of the lighting system, the first, second, third and fourth converging lenses [108], [308], [908], and [1108] may respectively be configured for forming the converged light emissions [212], [412], [1012], [1212] as having the first, second, fourth, and fifth HWHM being within a range of between about 15 degrees and about 25 degrees; and the first and second diverging lenses [120], [920] may be configured for causing divergence of some of the converged light emissions [212], [412], [1012], [1212]

away from the central light emission axes [210], [1010] in directions that are spaced apart from directions along the longitudinal axis [928] by an HWHM being within a range of between about 25 degrees and about 35 degrees. Further in those examples [100] of the lighting system, the diverged light emissions may have a cumulative HWHM away from the central light emission axes [210], [1010] in directions that are spaced apart from directions along the longitudinal axis [928] being within a range of between about 40 degrees and about 60 degrees.

In some examples [100] of the lighting system, the first, second, third and fourth converging lenses [108], [308], [908], and [1108] may respectively be configured for forming the converged light emissions [212], [412], [1012], [1212] as having the first, second, fourth, and fifth HWHM being within a range of between about 15 degrees and about 25 degrees; and the first and second diverging lenses [120], [920] may be configured for causing divergence of some of the converged light emissions [212], [412], [1012], [1212] away from the central light emission axes [210], [1010] in directions that are spaced apart from directions along the longitudinal axis [928] by an HWHM being within a range of between about 2 degrees and about 6 degrees. Further in those examples [100] of the lighting system, the diverged light emissions may have a cumulative HWHM away from the central light emission axes [210], [1010] in directions that are spaced apart from directions along the longitudinal axis [928] being within a range of between about 17 degrees and about 31 degrees.

In some examples [100] of the lighting system, the first, second, third and fourth converging lenses [108], [308], [908], and [1108] may respectively be configured for forming the converged light emissions [212], [412], [1012], [1212] as having the first, second, fourth, and fifth HWHM being within a range of between about 2 degrees and about 5 degrees; and the first and second diverging lenses [120], [920] may be configured for causing divergence of some of the converged light emissions [212], [412], [1012], [1212] away from the central light emission axes [210], [1010] in directions that are spaced apart from directions along the longitudinal axis [928] by an HWHM being within a range of between about 25 degrees and about 35 degrees. Further in those examples [100] of the lighting system, the diverged light emissions may have a cumulative HWHM away from the central light emission axes [210], [1010] in directions that are spaced apart from directions along the longitudinal axis [928] being within a range of between about 27 degrees and about 40 degrees.

In some examples [100] of the lighting system, the first diverging lens [120] may be integral with the second diverging lens [920]; and the example [100] of the lighting system may be configured for positioning the semiconductor light-emitting device [104] as being spaced apart on the longitudinal axis [928] away from the second semiconductor light-emitting device [904], and the first and second diverging lenses [120], [920] may be integrally configured for causing divergence of some of the converged light emissions [212], [412], [1012], [1212] away from the central light emission axes [210], [1010] in directions that are spaced apart from directions being transverse to the longitudinal axis [928]. As an example, the eighth lens module [2518] may be rotated by ninety (90) degrees on the second central light emission axis [1010] to accordingly change the directions of divergence of some of the converged light emissions. In additional examples [100] of the lighting system, each of the first and second diverging lenses [120], [920] may be configured for causing divergence of some of the converged light emissions [212], [412], [1012], [1212] away from the central light emission axes [210], [1010] in directions that are spaced apart from directions being transverse to the longitudinal axis [928] by an HWHM being: about 4 degrees; or about 10 degrees; or about 15 degrees; or about 25 degrees; or about 30 degrees.

In some examples [100] of the lighting system, the first, second, third and fourth converging lenses [108], [308], [908], and [1108] may respectively be configured for forming the converged light emissions [212], [412], [1012], [1212] as having the first, second, fourth, and fifth HWHM being within a range of between about 2 degrees and about 25 degrees; and the first and second diverging lenses [120], [920] may be configured for causing divergence of some of the converged light emissions [212], [412], [1012], [1212] away from the central light emission axes [210], [1010] in directions that are spaced apart from directions being transverse to the longitudinal axis [928] by an HWHM being within a range of between about 4 degrees and about 30 degrees. Further in those examples [100] of the lighting system, the diverged light emissions may have a cumulative HWHM away from the central light emission axes [210], [1010] in directions that are spaced apart from directions being transverse to the longitudinal axis [928] being within a range of between about 6 degrees and about 55 degrees.

Figure 28:
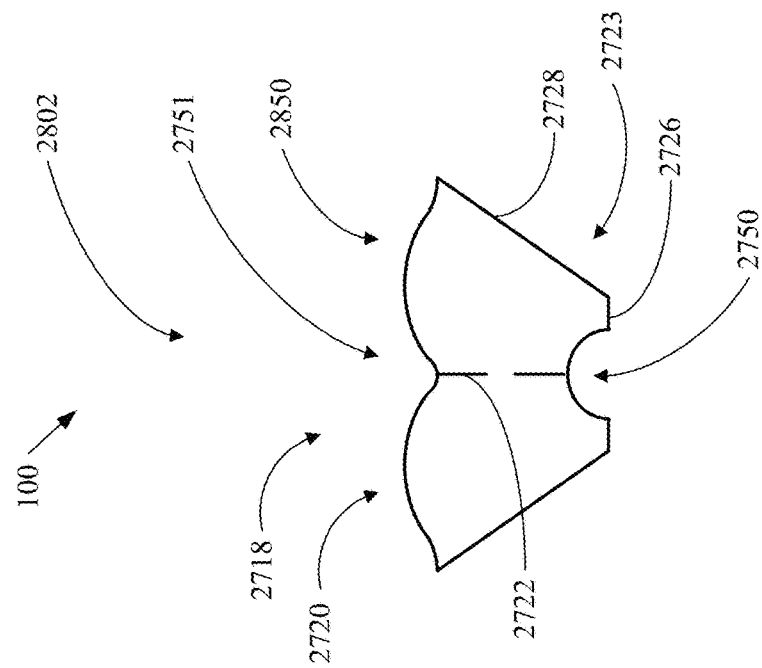
FIG. 28 is a cross-sectional side view taken along the line 28-28, showing the example of the ninth lens module that may be included in the example [100] of the lighting system.
Figure 27:
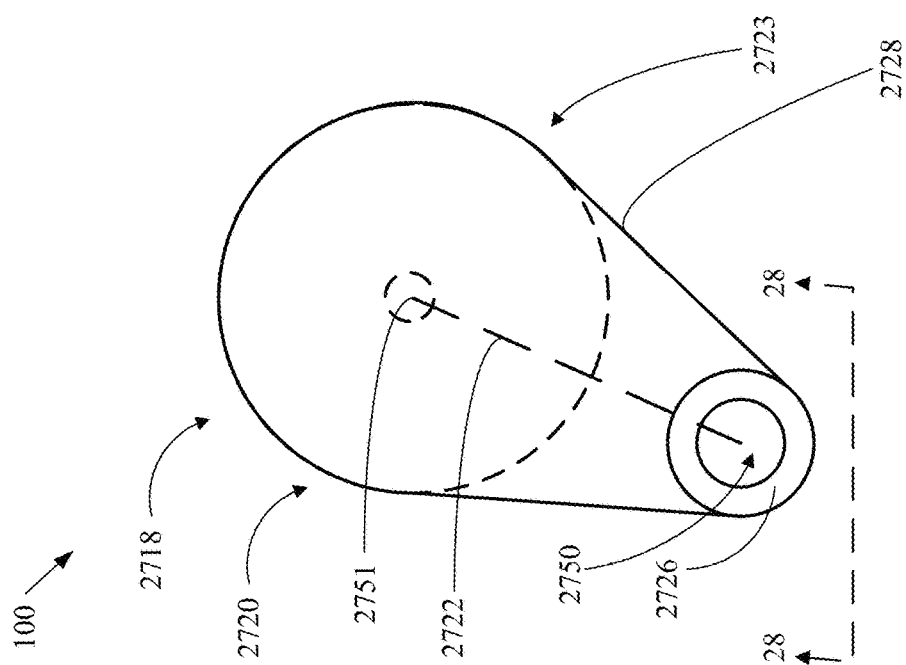
FIG. 27 is a perspective bottom view showing an example of a ninth lens module that may be included in the example [100] of an implementation of a lighting system.

FIG. 27 is a perspective bottom view showing an example of a ninth lens module that may be included in the example [100] of an implementation of a lighting system. FIG. 28 is a cross-sectional side view taken along the line 28-28, showing the example of the ninth lens module that may be included in the example [100] of the lighting system. In some examples, the example [100] of the lighting system may include a ninth lens module [2718] including a fifth diverging lens [2720]. The fifth diverging lens [2720] may have a ninth light output surface [2802] being spaced apart along a ninth lens axis [2722] from a ninth light input surface [2726], the fifth diverging lens [2720] having a fifth total internal reflection side surface [2728] being spaced apart around the ninth lens axis [2722] and having a fifth frusto-conical shape [2723] extending between the ninth light input surface [2726] and the ninth light output surface [2802] of the fifth diverging lens [2720]. Further, for example, the ninth light input surface [2726] of the fifth diverging lens [2720] may include a central cavity [2750] being shaped as a portion of a spheroid. Additionally, for example, the ninth light output surface [2802] of the fifth diverging lens [2720] may include a first raised region [2850] being shaped as a sliced torus having a second central cavity [2751]. In examples, the example [100] of the lighting system may be configured for detachably installing the ninth lens module [2718] in the lighting module [102] between the semiconductor light-emitting device [104] and the third lens module [118]; and the example [100] of the lighting system may be configured for aligning the ninth lens axis [2722] with the central light emission axis [210] and the third lens axis [122]. In further examples [100] of the lighting system, the first raised region [2850] of the fifth diverging lens [2720], being shaped as a sliced torus, may be configured for causing some of the light emissions [202] to pass through the ninth light output surface [2802] at a plurality of spread-apart points. In some examples [100] of the lighting system, the first raised region [2850] of the fifth diverging lens [2720] may be configured for causing some of the light emissions [202] to pass through the ninth light output surface [2802] at spread-apart points being distributed throughout the ninth light output surface [2802].

Figure 29:
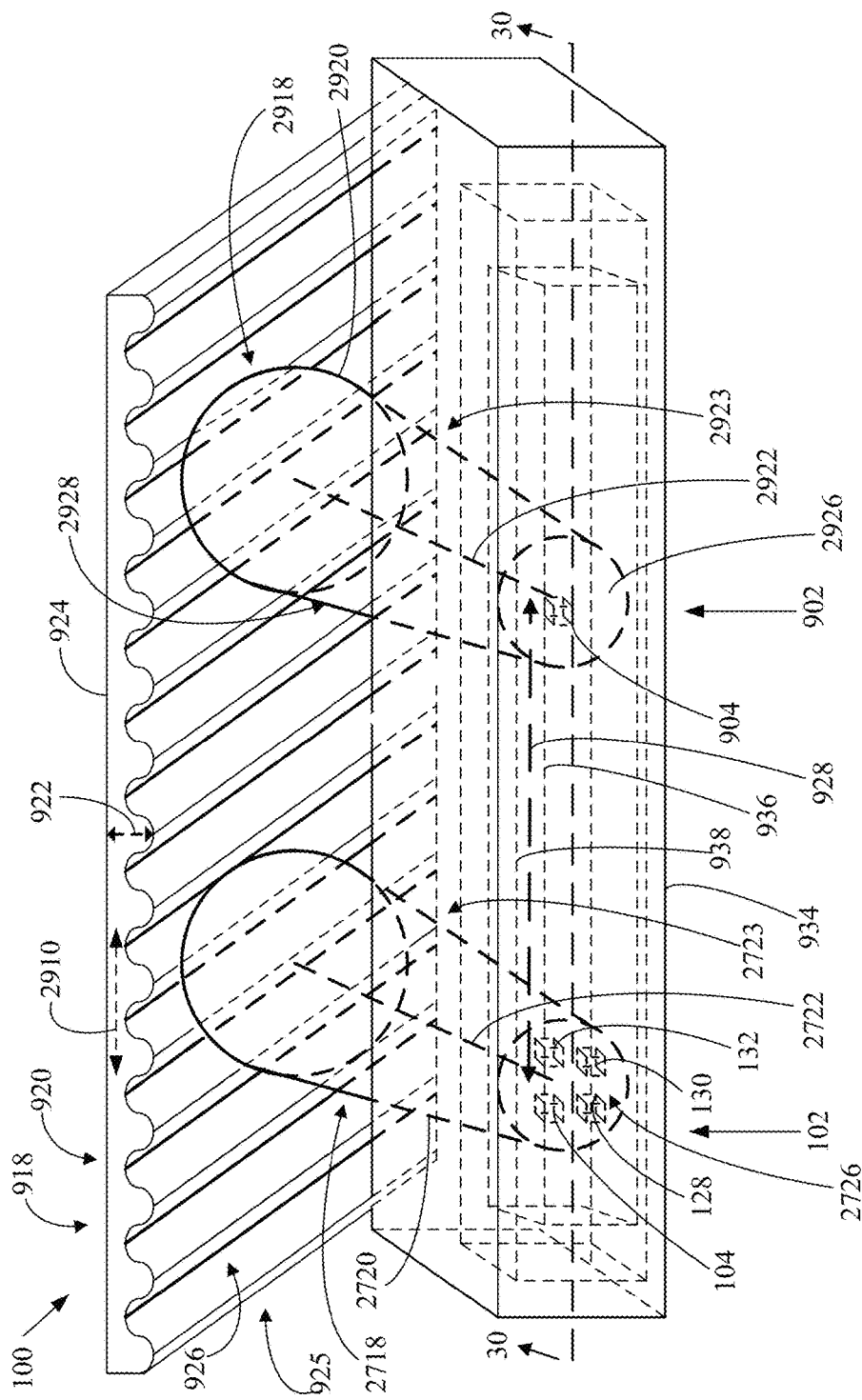
FIG. 29 is a perspective bottom view showing the example of the ninth lens module; and showing an example of a tenth lens module that may be included in the example [100] of an implementation of a lighting system.
Figure 30:
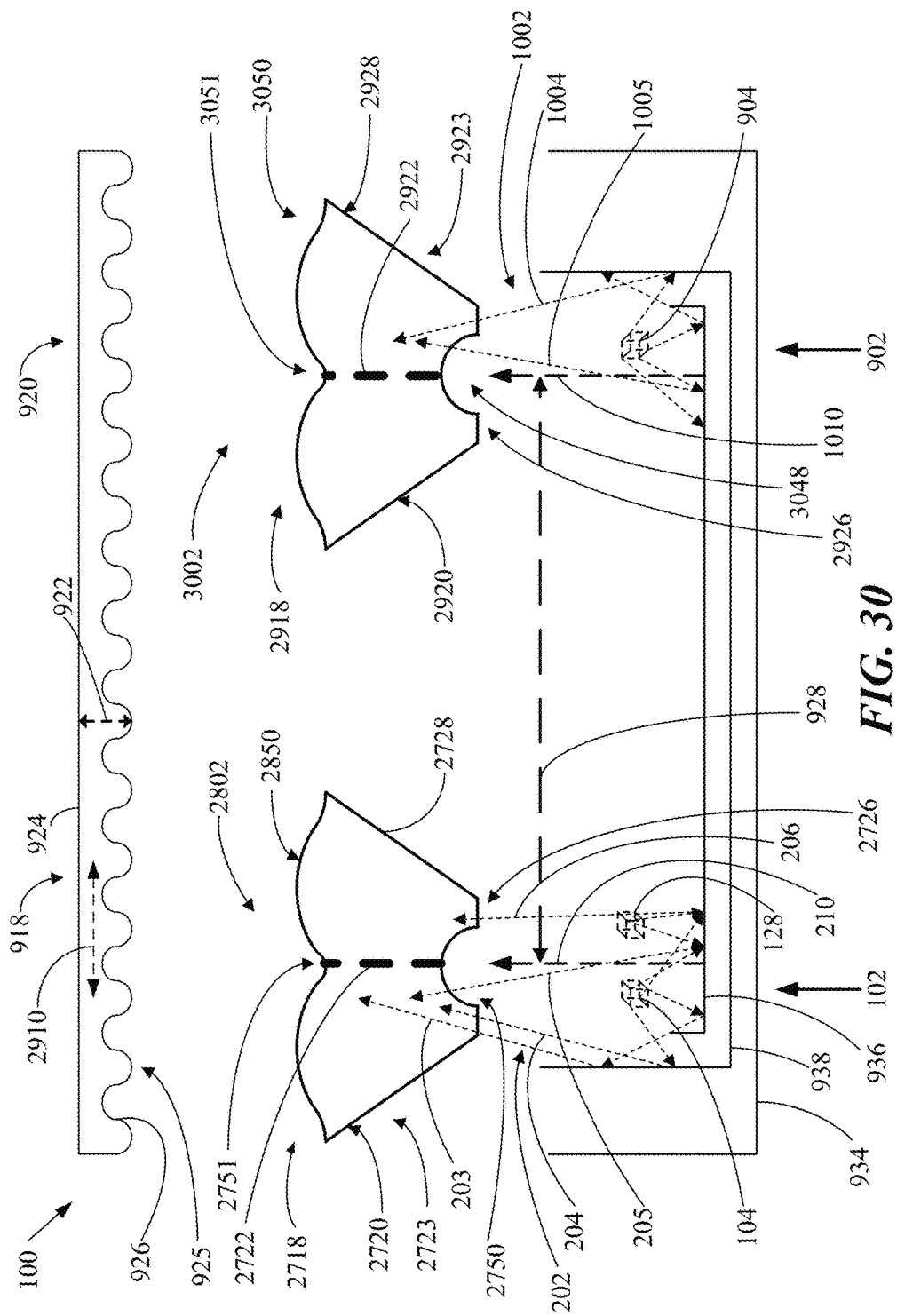
FIG. 30 is a cross-sectional side view taken along the line 30-30, showing the example of the ninth lens module; and showing the example of the tenth lens module that may be included in the example [100] of the lighting system.

FIG. 29 is a perspective bottom view showing the example of the ninth lens module; and showing an example of a tenth lens module that may be included in the example [100] of an implementation of a lighting system. FIG. 30 is a cross-sectional side view taken along the line 30-30, showing the example of the ninth lens module; and showing the example of the tenth lens module that may be included in the example [100] of the lighting system. In some examples, the example [100] of the lighting system may include a tenth lens module [2918] including a sixth diverging lens [2920]. The sixth diverging lens [2920] may have a tenth light output surface [3002] being spaced apart along a tenth lens axis [2922] from a tenth light input surface [2926], the sixth diverging lens [2920] having a sixth total internal reflection side surface [2928] being spaced apart around the tenth lens axis [2922] and having a sixth frusto-conical shape [2923] extending between the tenth light input surface [2926] and the tenth light output surface [3002] of the sixth diverging lens [2920]. Further, for example, the tenth light input surface [2926] of the sixth diverging lens [2920] may include a central cavity [3048] being shaped as a portion of a spheroid. Additionally, for example, the tenth light output surface [3002] of the sixth diverging lens [2920] may include a second raised region [3050] being shaped as a sliced torus having a second central cavity [3051]. In examples, the example [100] of the lighting system may be configured for detachably installing the tenth lens module [2918] in the second lighting module [902] between the second semiconductor light-emitting device [904] and the sixth lens module [918]; and the example [100] of the lighting system may be configured for aligning the tenth lens axis [2922] with the second central light emission axis [1010]. In further examples [100] of the lighting system, the second raised region [3050] of the sixth diverging lens [2920], being shaped as a sliced torus, may be configured for causing some of the light emissions [1002] to pass through the tenth light output surface [3002] at a plurality of spread-apart points. In some examples [100] of the lighting system, the second raised region [3050] of the sixth diverging lens [2920] may be configured for causing some of the light emissions [1002] to pass through the tenth light output surface [3002] at spread-apart points being distributed throughout the tenth light output surface [3002].

In some examples [100], the lighting system may be configured for positioning the semiconductor light-emitting device [104] as being spaced apart on the longitudinal axis [928] away from the second semiconductor light-emitting device [904], for causing the central light emission axis [210] to be spaced apart from the second central light emission axis [1010]. Further, for example, the fifth diverging lens [2720] of the ninth lens module [2718] may be integral with the sixth diverging lens [2920] of the tenth lens module [2918]; and the fifth and sixth diverging lenses [2720], [2920] may be integrally configured for causing some of the light emissions [202], [1002] to pass through the sixth light output surface [924] at a plurality of spread-apart points. In some examples [100] of the lighting system, the first and second raised regions [2850], [3050] of the fifth and sixth diverging lenses [2720], [2920] may be configured for causing some of the light emissions [202], [1002] to pass through the sixth light output surface [924] at a plurality of spread-apart points being distributed throughout the sixth light output surface [924].

As additional examples [100] of the lighting system, the fifth diverging lens [2720] of the ninth lens module [2718], the sixth diverging lens [2920] of the tenth lens module [2918], and the second diverging lens [920] of the sixth lens module [918] may be collectively configured for causing the sixth light output surface [924] to emit a perceived line of light. As an example [100] of the lighting system, the perceived line of light may extend in the directions represented by the arrow [2910]. As another example, the sixth lens module [918] may be rotated by ninety (90) degrees on a central light emission axis [210], [1010] to accordingly change the directions of divergence of some of the converged light emissions. In other examples [100] of the lighting system (not shown), the only lens modules included in a lighting system may be: the ninth lens module [2718]; the tenth lens module [2918]; and the sixth lens module [918]. Further in those other examples [100] of the lighting system, the ninth lens module [2718] may be integral with the tenth lens module [2918]; and as shown in FIGS. 29-30, the sixth lens module [918] may extend in directions that are spaced apart from directions along the longitudinal axis [928] between and beyond both the ninth light output surface [2802] and the tenth light output surface [3002]. Additionally, for example, the third lens module [118] (not shown) may be integral with the sixth lens module [918] as so extending between and beyond the ninth and tenth light output surfaces [2802], [3002]. In additional examples [100] of the lighting system (not shown), the ninth lens module [2718] may be integral with a plurality of tenth lens modules [2918]. In additional examples [100] of the lighting system (not shown), the ninth lens module [2718] and the plurality of tenth lens modules [2918] may collectively be integrated in a row, or in a plurality of rows, or in a circle. As further examples [100] of the lighting system (not shown), a plurality of the tenth lens modules [2918], being within a range of between one and about twenty, or being within a range of between one and about one hundred, may be integrated together with the ninth lens module [2718]. In further examples [100] of the lighting system (not shown), the lighting system may include a plurality of ninth lens modules [2718], each being integral with a tenth lens module [2918]. In those further examples [100] of the lighting system (not shown), each of a plurality of the accordingly integrated light output surfaces [2802], [3002] may include: a different depth of the central cavities [2750], [3048] or of the second central cavities [2751], [3051] along the lens axes [2722], [2922]; a different diameter of the central cavities [2750], [3048] or of the second central cavities [2751], [3051] transversely to the lens axes [2722], [2922]; or a different height of the raised regions [2850], [3050] above the second central cavities [2751], [3051] along the lens axes [2722], [2922].

Figure 31:
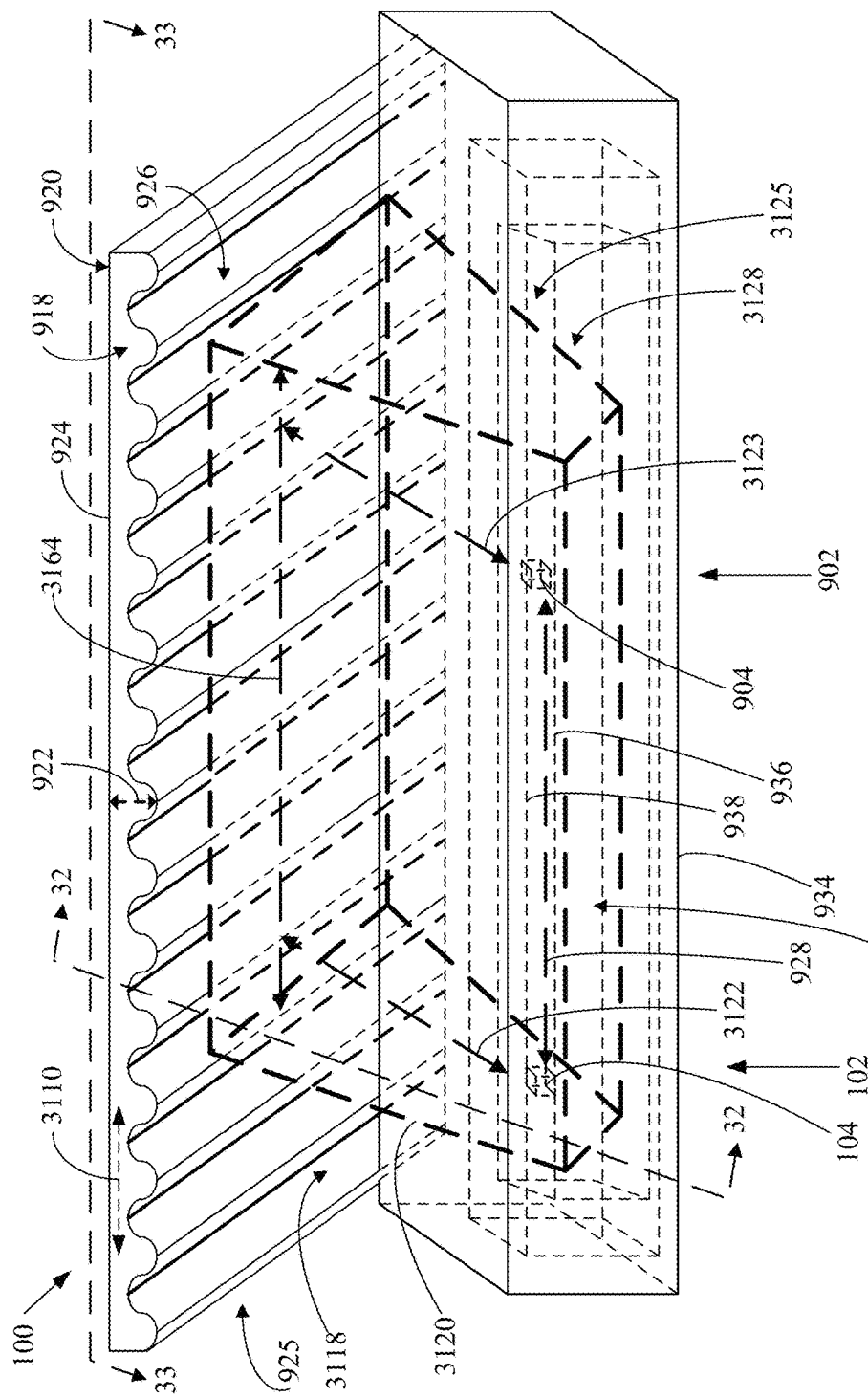
FIG. 31 is a perspective bottom view showing an example of an eleventh lens module that may be included in the example [100] of an implementation of a lighting system.
Figure 32:
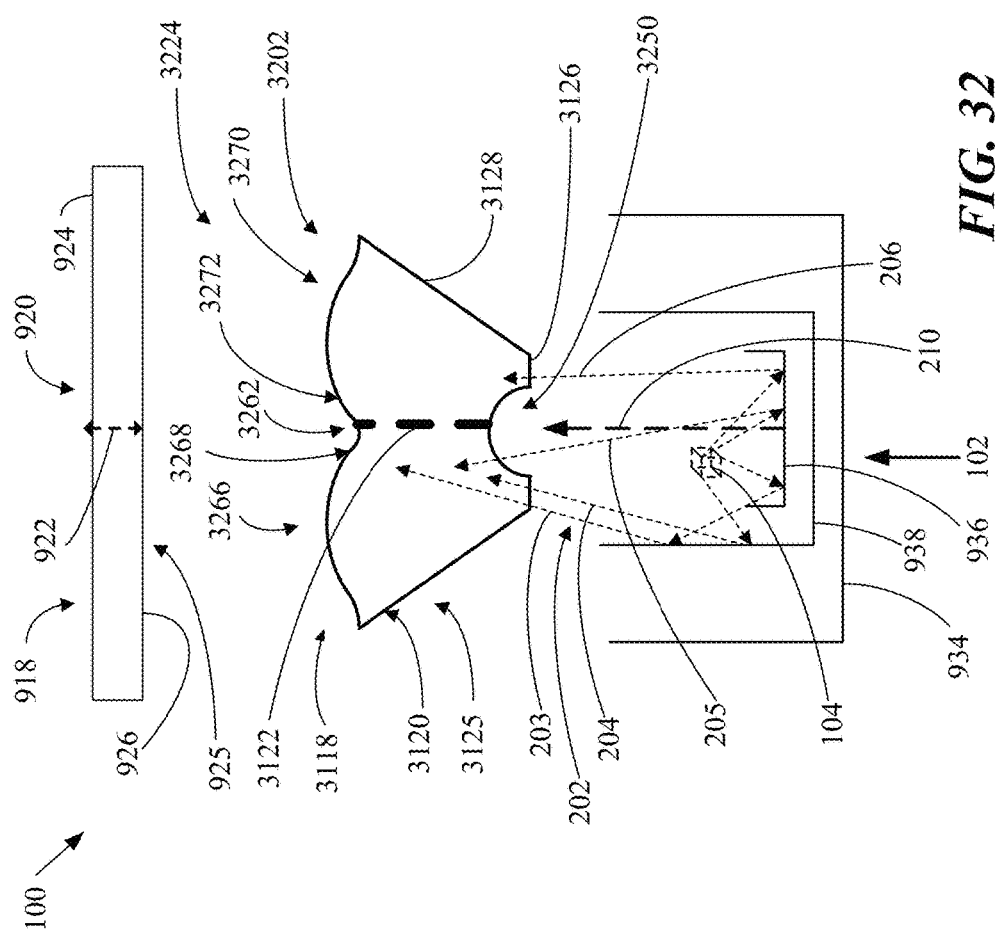
FIG. 32 is cross-sectional view taken along the line 32-32, showing the example of the eleventh lens module that may be included in the example [100] of the lighting system.
Figure 33:
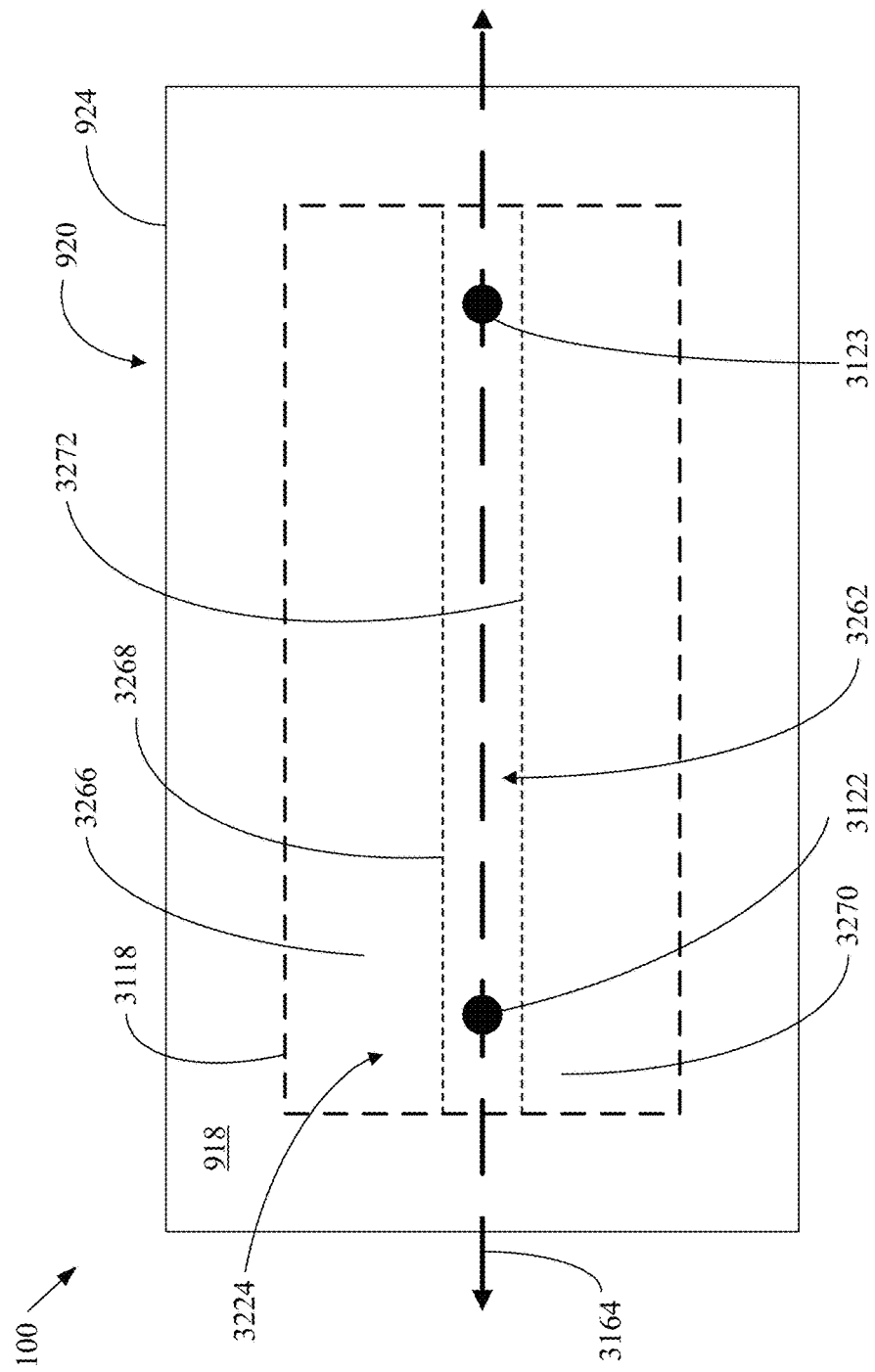
FIG. 33 is a top view taken along the line 33-33, showing the example of the eleventh lens module that may be included in the example [100] of the lighting system.

FIG. 31 is a perspective bottom view showing an example of an eleventh lens module that may be included in the example [100] of an implementation of a lighting system. FIG. 32 is a cross-sectional view taken along the line 32-32, showing the example of the eleventh lens module that may be included in the example [100] of the lighting system. FIG. 33 is a top view taken along the line 33-33, showing the example of the eleventh lens module that may be included in the example [100] of the lighting system. In some examples, the example [100] of the lighting system may include an eleventh lens module [3118] including a seventh diverging lens [3120]. In examples [100] of the lighting system, the seventh diverging lens [3120] may have one lens axis [3122] being spaced apart from another lens axis [3123]. For example, the example [100] of the lighting system may be configured for detachably installing the seventh diverging lens [3120] with the one lens axis [3122] being aligned with the central light emission axis [210] and with the another lens axis [3123] being aligned with the second central light emission axis [1010]. In some examples [100] of the lighting system, the seventh diverging lens [3120] may have a seventh total internal reflection side surface [3128] having a seventh frusto-conical shape [3125] extending between an eleventh light input surface [3126] and an eleventh light output surface [3202], the eleventh light output surface [3202] including a contoured lens screen [3224] having lenticular or microprismatic features. In some examples [100] of the lighting system, the seventh diverging lens [3120] may have the contoured lens screen [3224] as including an array of lenticular toroidal lenses. In other examples (not shown) of the example [100] of the lighting system, the seventh diverging lens [3120] may have the contoured lens screen [3224] as including an array of microprismatic lenses.

In further examples [100] of the lighting system, the eleventh light input surface [3126] may include one cavity [3250] aligned with the one lens axis [3122] and shaped as a portion of a spheroid; and the eleventh light input surface [3126] may include another cavity (not shown) aligned with the another lens axis [3123] and shaped as a portion of a spheroid. In additional examples [100], the lighting system may be configured for positioning the semiconductor light-emitting device [104] as being spaced apart on the longitudinal axis [928] away from the second semiconductor light-emitting device [904] for causing the central light emission axis [210] to be spaced apart from the second central light emission axis [1010]. Further in those examples [100] of the lighting system, the contoured lens screen [3224] may have a central concave surface [3262], having a lens screen axis [3164] that extends in directions that are similar to and spaced apart from directions along the longitudinal axis [928]. In some examples [100] of the lighting system, the lens screen axis [3164] may intersect the one lens axis [3122] and the another lens axis [3123], the lens axes [3122], [3123] being represented as dots in FIG. 33. As further examples [100] of the lighting system, the contoured lens screen [3224] may have one convex surface [3266] extending in directions along the lens screen axis [3164], and one edge [3268] of the central concave surface [3262] may extend adjacent to the one convex surface [3266] in directions along the lens screen axis [3164]. In additional examples [100] of the lighting system, the contoured lens screen [3224] may have another convex surface [3270] extending in directions along the lens screen axis [3164], and another edge [3272] of the central concave surface [3262] may extend adjacent to the another convex surface [3270] in directions along the lens screen axis [3164]. In other examples [100] of the lighting system, the contoured lens screen [3224] may be configured for causing divergence of some of the converged light emissions [212], [412], [1012], [1212] away from the lens screen axis [3164].

In some examples [100] of the lighting system, the eleventh lens module [3118] may be configured for causing some of the light emissions [202], [1002] to pass through the contoured lens screen [3224] at a plurality of spread-apart points. In some examples [100] of the lighting system, the eleventh lens module [3118] may be configured for causing some of the light emissions [202], [1002] to pass through the contoured lens screen [3224] at spread-apart points being distributed throughout the contoured lens screen [3224]. As additional examples [100] of the lighting system, the seventh diverging lens [3120] of the eleventh lens module [3118] and the second diverging lens [920] of the sixth lens module [918] may be collectively configured for causing the sixth light output surface [924] to emit a perceived line of light. As an example [100] of the lighting system, the perceived line of light may extend in the directions represented by the arrow [3110]. As another example, the sixth lens module [918] may be rotated by ninety (90) degrees on a central light emission axis [210], [1010] to accordingly change the directions of divergence of some of the converged light emissions. In other examples [100] of the lighting system (not shown), the only lens modules included in a lighting system may be: the eleventh lens module [3118]; and the sixth lens module [918]. Further in those other examples [100] of the lighting system, as shown in FIGS. 31-33, the sixth lens module [918] may extend in directions that are spaced apart from directions along the longitudinal axis [928] between and beyond both the one lens axis [3122] and the another lens axis [3123]. Additionally, for example, the third lens module [118] (not shown) may be integral with the sixth lens module [918] as so extending between and beyond the lens axes [3122], [3123]. In additional examples [100] of the lighting system (not shown), the eleventh lens module [3118] may include the seventh diverging lens [3120] as having one or more further lens axes being spaced apart along the longitudinal axis [928] in addition to the one lens axis [3122] and the another lens axis [3123], and the eleventh lens module [3118] may be configured for being aligned with one or more further central light emission axes of additional semiconductor light-emitting devices in addition to the central light emission axes [210], [1010]. As additional examples, the example [100] of the lighting system may include one or more additional eleventh lens modules [3118]. In those additional examples [100] of the lighting system (not shown), each of a plurality of the light output surfaces [3202] may include: a different depth of the central cavity [3250] or of the central concave surface [3262] along the lens axes [3122], [3123]; a different diameter of the central cavity [3250] or of the central concave surface [3262] transversely to the lens axes [3122], [3123]; or a different height of the convex surfaces [3266], [3270] above the central concave surface [3262] along the lens axes [3122], [3123].

In other examples [100], the lighting system may include the housing [934]. As examples [100] of the lighting system, the housing [934] may be configured for positioning the lighting module [102] for emission of the light emissions [202] from the semiconductor light-emitting device [104] along the central light emission axis [210]; and the housing [934] may be configured for positioning the second lighting module [902] for emission of the further light emissions [1002] from the second semiconductor light-emitting device [904] along the second central light emission axis [1010]. Further in those examples, the example [100] of the lighting system may include the carrier [936]. Additionally in those examples [100] of the lighting system, the carrier [936] may be configured for positioning the eleventh lens module [3118] in the housing [934] with the one lens axis [3122] being aligned with the central light emission axis [210] and with the another lens axis [3123] being aligned with the second central light emission axis [1010]. Additionally in those examples, the example [100] of the lighting system may include the primary visible light reflector [938]. In those examples [100] of the lighting system, the primary visible light reflector [938] may be configured for being positioned between the housing [934] and the carrier [936], and the primary visible light reflector [938] may be configured for redirecting some of the light emissions [202] of the semiconductor light-emitting device [104] along the central light emission axis [210], and the primary visible light reflector [938] may be configured for redirecting some of the further light emissions [1002] of the second semiconductor light-emitting device [904] along the second central light emission axis [1010].

Figure 36:
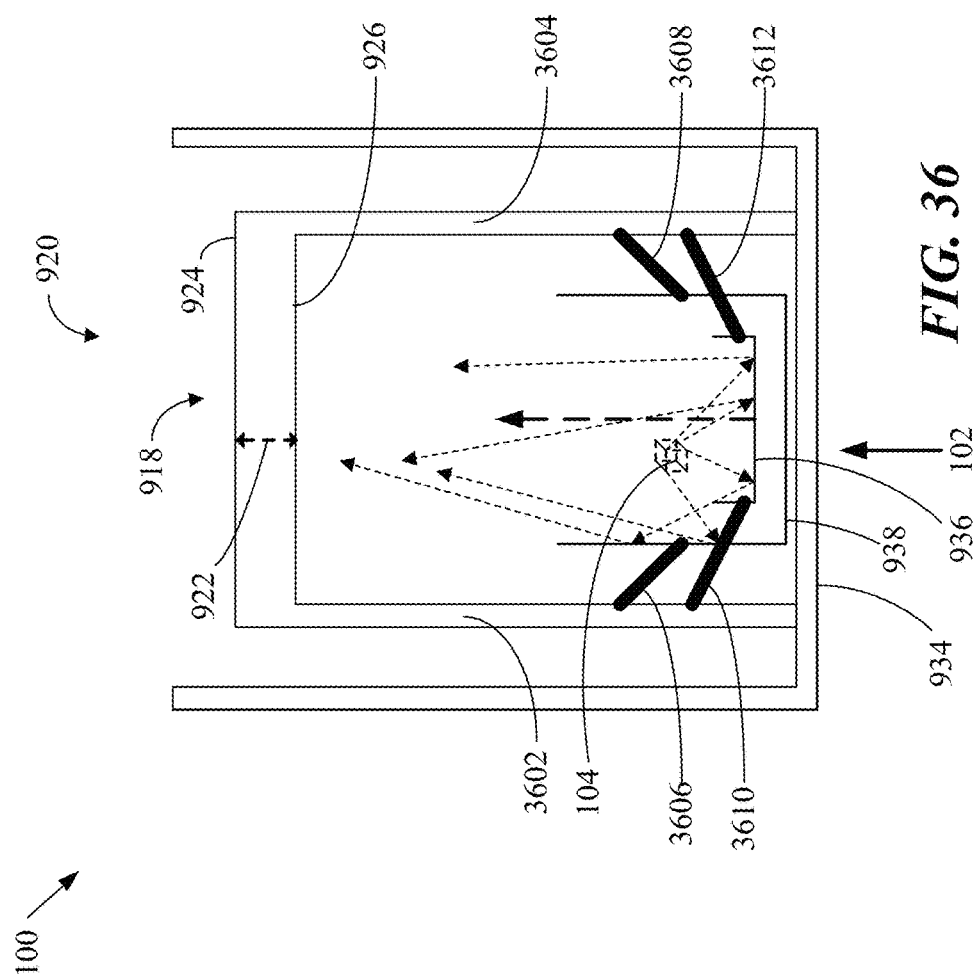
FIG. 36 is a schematic cross-sectional view of the examples [100] of the lighting system shown in FIGS. 34-35.

FIG. 34 is a top view showing examples of the carrier [136], [936] and the primary visible light reflector [138], [938] that may be included in the example [100] of an implementation of a lighting system. FIG. 35 is a perspective view showing the examples of the carrier [136], [936] and the primary visible light reflector [138], [938] as shown in FIG. 34. FIG. 36 is a schematic cross-sectional view of the examples [100] of the lighting system shown in FIGS. 34-35. As shown in this example [100] of the lighting system, the primary visible light reflector [938] may include a plurality of apertures [3402], [3404] being spaced apart in a row extending in directions that are spaced apart from directions along the longitudinal axis [928] (not shown) for receiving light emissions [202], [1002] from semiconductor light-emitting devices [104], [904] (not shown) being positioned underneath the primary visible light reflector [938] with their central light emission axes [210], [1010] aligned with the apertures [3402], [3404]. As an example, the primary visible light reflector [938] may include sixteen of the apertures [3402], [3404] for receiving light emissions [202], [1002] from sixteen corresponding semiconductor light-emitting devices [104], [904] (not shown), one of which being positioned with its central light emission axis [210], [1010] aligned with each one of the sixteen apertures [3402], [3404]. In other examples [100] of the lighting system (not shown), the primary visible light reflector [938] may include a different quantity of the apertures [3402], [3404] for receiving light emissions [202], [1002] from a corresponding different number of semiconductor light-emitting devices [104], [904] (not shown), one of which being positioned with its central light emission axis [210], [1010] aligned with each one of the apertures [3402], [3404]. In other examples [100] of the lighting system, the primary visible light reflector [938] may include a quantity of the apertures [3402], [3404] being within a range of between one and about twenty apertures, or being within a range of between one and about one hundred apertures. Further, for example, more than one semiconductor light-emitting device [104], [904] may be positioned with its central light emission axis [210], [1010] being aligned with each one of the apertures [3402], [3404]. In examples [100] of the lighting system, the primary visible light reflector [938] may include each of the apertures [3402], [3404] as being located between a pair of reflector elements [3420]. In examples [100] of the lighting system, each of the reflector elements [3420] may include a top reflective surface [3406] being oriented to reflect light emissions [202], [1002] along the central light emission axes [210], [1010], the top reflective surface [3406] being located between two tangential reflective surfaces [3408]. As further shown in this example [100] of the lighting system, the carrier [936] may include a plurality of apertures [3410], [3412] being spaced apart in a row extending in directions that are spaced apart from directions along the longitudinal axis [928] (not shown) for receiving light emissions [202], [1002] from semiconductor light-emitting devices [104], [904] (not shown) with their central light emission axes [210], [1010] being aligned with the apertures [3410], [3412]. In these examples [100] of the lighting system, the carrier [936] may be placed over the primary visible light reflector [938] with the apertures [3410], [3412] being aligned with the apertures [3402], [3404] as represented by the arrows [3414], [3416], and the semiconductor light-emitting devices [104], [904] may be placed below the primary visible light reflector [938]. Further, for example, the apertures [3410], [3412] of the carrier [936] may be configured and shaped for receiving and holding in place the lens modules [106], [306], [906], [1106], [1506], [1706], [1906], [2106], [2718], and [2918]. As an example, the carrier [936] may include sixteen of the apertures [3410], [3412] for receiving light emissions [202], [1002] from sixteen corresponding semiconductor light-emitting devices [104], [904] (not shown), one of which being positioned with its central light emission axis [210], [1010] aligned with each one of the sixteen apertures [3410], [3412]. In other examples [100] of the lighting system (not shown), the carrier [936] may include a different quantity of the apertures [3410], [3412] for receiving light emissions [202], [1002] from a corresponding different number of semiconductor light-emitting devices [104], [904] (not shown), one of which being positioned with its central light emission axis [210], [1010] aligned with each one of the apertures [3410], [3412]. In some examples [100] of the lighting system, the carrier [936] may include a quantity of the apertures [3410], [3412] being within a range of between one and about twenty apertures, or being within a range of between one and about one hundred apertures. Further, for example, more than one semiconductor light-emitting device [104], [904] may be positioned with its central light emission axis [210], [1010] being aligned with each one of the apertures [3410], [3412]. In these examples [100] of the lighting system, the primary visible light reflector [938] may be configured for being positioned between the housing [934] (not shown) and the carrier [936]. Further, for example, the carrier [936] may be configured for redirecting some of the light emissions [202], [1002] of the semiconductor light-emitting devices [104], [904] (not shown) along the central light emission axes [210], [1010]. In other examples [100], the lighting system may include the carrier [936] being configured for being placed in direct contact with the housing [934]. In other examples [100] of the lighting system (not shown), the primary visible light reflector [938] and the carrier [936] may include their respective apertures [3402], [3404], [3410], [3412] being spaced apart in a plurality of rows, or in another formation such as a rectangle or a circle. In further examples [100], the lighting system may include the sixth lens module [918]. Further, for example, the sixth lens module [918] may have walls [3602], [3604] reaching downward in the housing [934]. Additionally, for example, the walls [3602], [3604] of the sixth lens module [918] may have members [3606], [3608], [3610], [3612] configured for holding the primary visible light reflector [938] and the carrier [936] in place within the housing [934].

Figure 37:
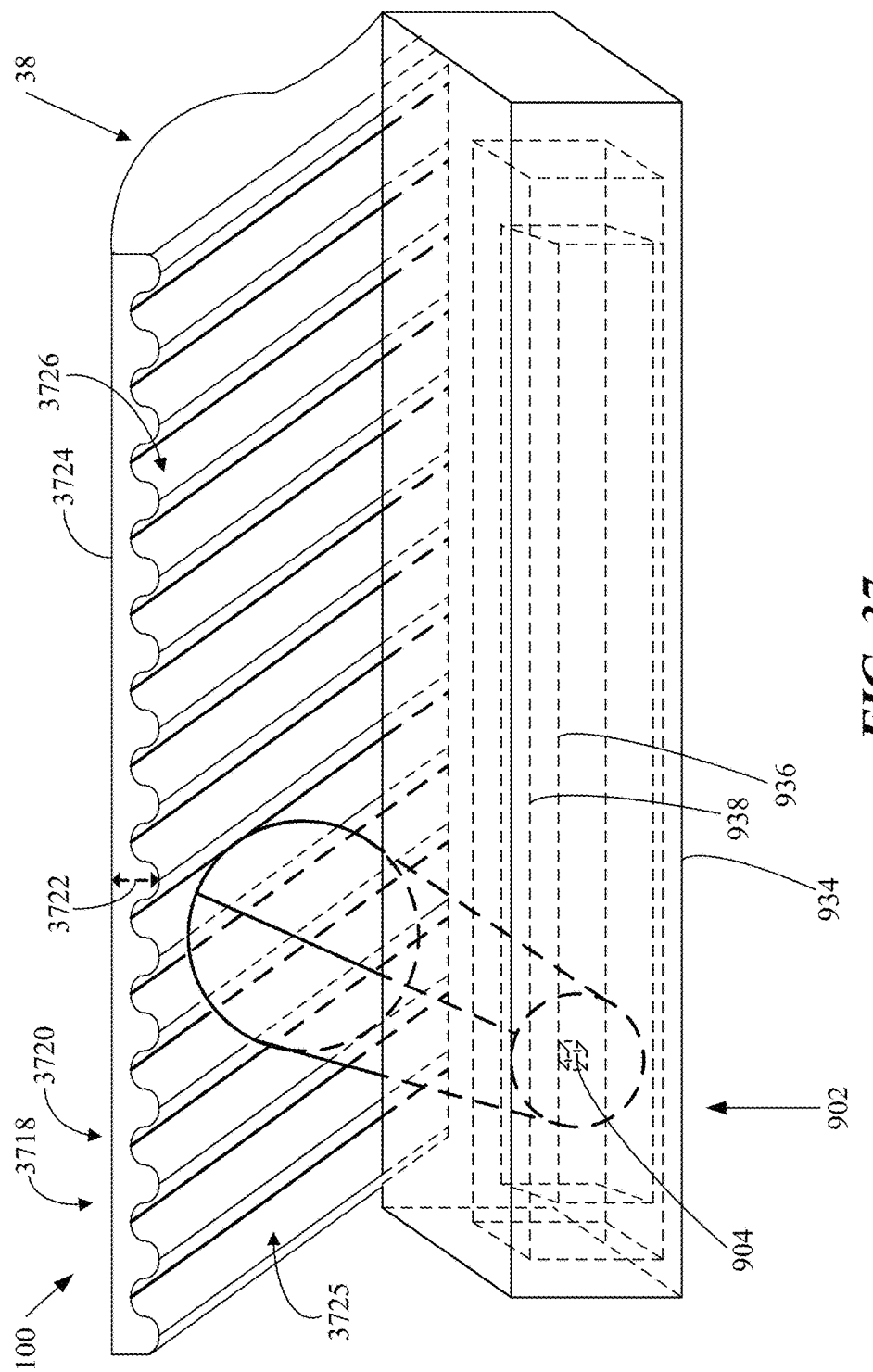
FIG. 37 is a perspective bottom view showing an example of an asymmetric twelfth lens module that may be included in the example [100] of an implementation of a lighting system.
Figure 38:
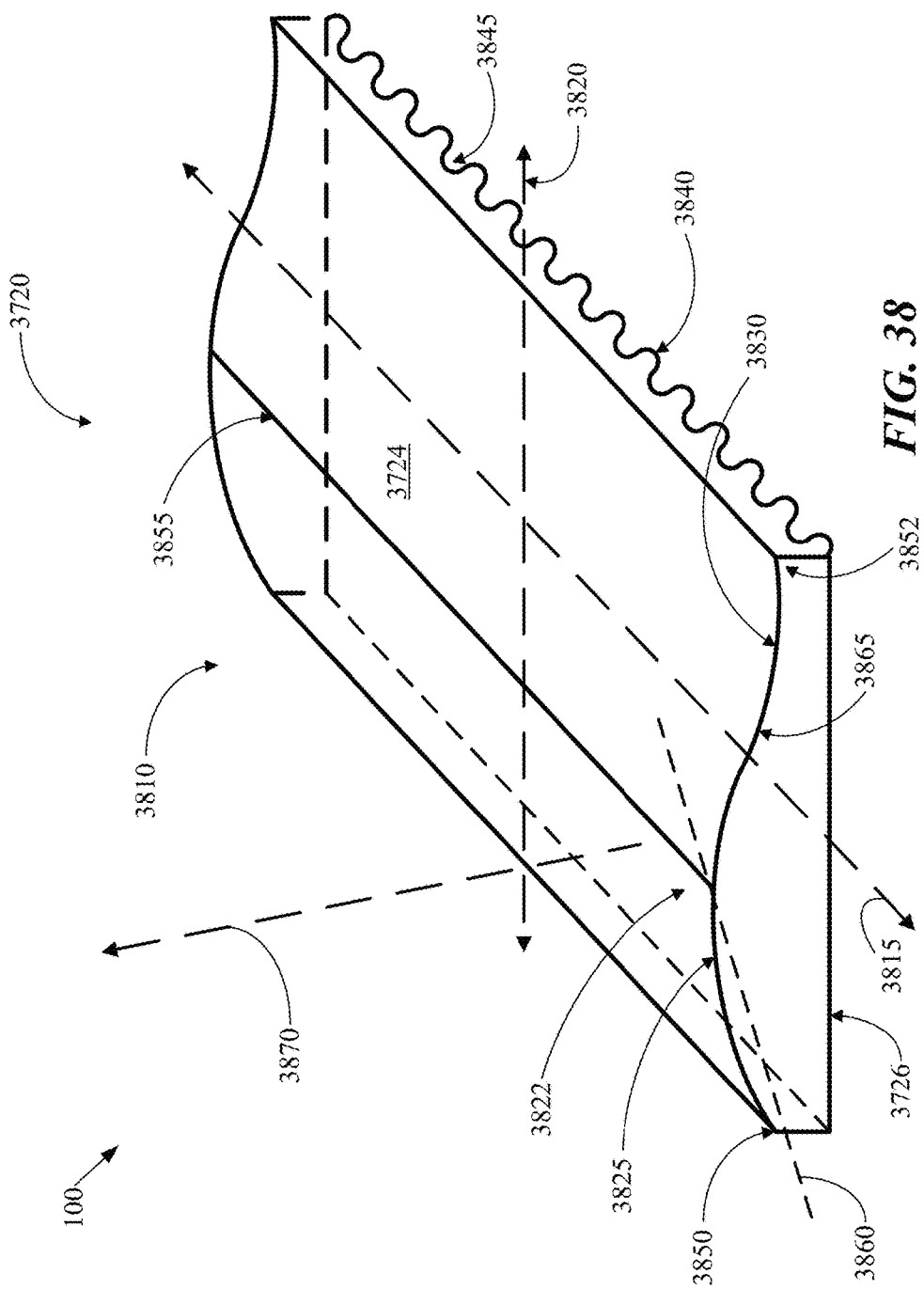
FIG. 38 is a side view taken along the line 38, showing the example of the twelfth lens module including a sixth diverging lens having a twelfth lens axis, that may be included in the example [100] of the lighting system.

FIG. 37 is a perspective bottom view showing an example of an asymmetric twelfth lens module [3718] that may be included in the example [100] of an implementation of a lighting system. FIG. 38 is a side view taken along the line 38, showing the example of the twelfth lens module [3718] including a sixth diverging lens [3720] having a twelfth lens axis [3722], that may be included in the example [100] of the lighting system. As examples, the sixth diverging lens [3720] may have a twelfth light output surface [3724] being spaced apart along the twelfth lens axis [3722] from a twelfth light input surface [3726]. The example [3718] of the twelfth lens module includes a lens body [3810] having the light output surface [3724] spaced apart along the light transmission axis [3722] from a light input surface [3726]. The lens body [3810] has a longitudinal axis [3815] and a lateral axis [3820], where the longitudinal and lateral axes [3815], [3820] are transverse to the light transmission axis [3722]. In the example [3718] of the twelfth lens module, the light input surface [3726] may, in an example, include an array of diverging lenses being configured for causing divergence of light away from the light transmission axis [3722] in directions along the longitudinal axis [3815] of the lens body [3810]. Further in the example [3718] of the twelfth lens module, the light output surface [3724] has an asymmetric curvilinear contour [3822] being formed by a convex region [3825] overlapping in directions along the lateral axis [3820] with a concave region [3830], the asymmetric curvilinear contour [3822] uniformly extending in directions along the longitudinal axis [3815]. Further, for example, the twelfth light input surface [3726] may, as an example, have an array of diverging lenses including a fourth lens screen [3725] having lenticular or microprismatic features. In other examples (not shown) the asymmetric twelfth lens module [3718] may not include an array of diverging lenses at the light input surface [3726]. Further, as examples, the light input surface [3726] of the example [3718] of the twelfth lens module may, for example, have a lens screen [3725] including an array of lenticular toroidal lenses. As another example, the example [3718] of the twelfth lens module may include the light input surface [3726] as having an array of lenticular toroidal lenses including a plurality of convex regions [3840] being interposed between a plurality of concave regions [3845], each of the pluralities of the convex regions [3840] and of the concave regions [3845] extending in directions along the lateral axis [3820].

In examples of the example [3718] of the twelfth lens module, the light output surface [3724] may include a first end [3850] being spaced apart along the lateral axis [3820] from a second end [3852]; and the asymmetric curvilinear contour [3822] may extend from the first end [3850] to the second end [3852]. As additional examples of the example [3718] of the twelfth lens module, the convex region [3825] of the asymmetric curvilinear contour [3822] may extend from the first end [3850] of the light output surface [3724] towards the light transmission axis [3722]. Further, for example, the concave region [3830] of the asymmetric curvilinear contour [3822] may extend from the second end [3852] of the light output surface [3724] towards the light transmission axis [3722]. In additional examples of the examples of the example [3718] of the twelfth lens module, the light output surface [3724] may have a ridge [3855] extending in directions along the longitudinal axis [3815] and being located at a greatest distance, in directions along the light transmission axis [3722], of the light output surface [3724] away from the light input surface [3726]. In some examples of the example [3718] of the twelfth lens module, the ridge [3855] may be at a location, in directions along the lateral axis [3820], being between the light transmission axis [3722] and the first end [3850] of the light output surface [3724]. In further examples of the example [3718] of the twelfth lens module, a portion of the light output surface [3724] may extend for a distance in directions along the lateral axis [3820] from the first end [3850] to the light transmission axis [3722], and the ridge [3855] may be on that portion of the light output surface [3724] at a location being at within a range of between about 30% and about 70% along the distance extending from the first end [3850] to the light transmission axis [3722]. In additional examples of the example [3718] of the twelfth lens module, a portion of the light output surface [3724] may extend for a distance in directions along the lateral axis [3820] from the first end [3850] to the light transmission axis [3722], and the ridge [3855] may be on that portion of the light output surface [3724] at a location being at within a range of between about 40% and about 60% along the distance extending from the first end [3850] to the light transmission axis [3722]. As further examples of the example [3718] of the twelfth lens module, the convex region [3825] of the asymmetric curvilinear contour [3822] may have an angle of elevation [3860] at the first end [3850] of the light output surface [3724] measured from the lateral axis [3820] rising to the ridge [3855], and the angle of elevation [3860] may be within a range of between about 30 degrees and about 40 degrees. In some examples of the example [3718] of the twelfth lens module, the convex region [3825] of the asymmetric curvilinear contour [3822] may have an angle of elevation [3860] at the first end [3850] of the light output surface [3724] from the lateral axis [3820] to the ridge [3855], and the angle of elevation [3860] may be within a range of between about 33 degrees and about 37 degrees. As other examples of the example [3718] of the twelfth lens module, the convex region [3825] of the asymmetric curvilinear contour [3822] may have an angle of elevation [3860] at the first end [3850] of the light output surface [3724] from the lateral axis [3820] to the ridge [3855], and the angle of elevation [3860] may be about 35 degrees. In examples of the example [3718] of the twelfth lens module, the asymmetric curvilinear contour [3822] of the light output surface [3724] may have an inflection point [3865] between the convex region [3825] and the concave region [3830]. Further, as examples of the example [3718] of the twelfth lens module, the light output surface [3724] may extend for a distance in directions along the lateral axis [3820] from the first end [3850] to the second end [3852], and the inflection point [3865] may be on the light output surface [3724] at a location being at within a range of between about 40% and about 60% along the distance extending from the first end [3850] to the second end [3852]. In some examples, the example [3718] of the twelfth lens module may be configured for emitting light having a full width half maximum beam width being within a range of between about 7 degrees and about 30 degrees. As another example, examples [3718] of the twelfth lens module may be configured for emitting light having a full width half maximum beam width being within a range of between about 10 degrees and about 20 degrees. In further examples, the example [3718] of the twelfth lens module may be configured for emitting light as being distributed on a planar surface. For example, the example [3718] of the twelfth lens module may be located in a cove near a room ceiling, positioned with the light transmission axis oriented along, e.g. parallel with, the plane of the ceiling. In examples, the example [3718] of the twelfth lens module may asymmetrically shift light away from the light transmission axis [3722] as represented by the arrow [3870]. In examples, examples of the example [3718] of the twelfth lens module may be configured for causing a luminance of light reflected by the planar surface to have a ratio of maximum luminance divided by minimum luminance being about 4 or less. Further, for example, examples of the example [3718] of the twelfth lens module may be configured for causing a luminance of light reflected by the planar surface to have a ratio of maximum luminance divided by minimum luminance being within a range of beteween about 4.0 and about 1.8. Additionally, for example, the examples [3718] of the twelfth lens module may be configured for causing a luminance of light reflected by the planar surface to have a ratio of average luminance divided by minimum luminance being about 2 or less. In other examples, examples of the example [3718] of the twelfth lens module may be configured for causing a luminance of light reflected by the planar surface to have a ratio of average luminance divided by minimum luminance being within a range of between about 2.1 and about 1.2. In other examples, where the angle of elevation [3860] is outside the range of between about 30 degrees and about 40 degrees, uniformity of the illumination of a planar surface such as a ceiling or wall by the example [3718] of the twelfth lens module may become degraded. In addition, where the angle of elevation [3860] is outside that range, bands of relative darkness may appear on the illuminated surface, e.g. next to a cove, or in the middle of the illuminated planar surface.

In examples, the example [100] of the lighting system may be configured for detachably installing the fourth lens module [906] or the fifth lens module [1106] in the second lighting module [902] between the second semiconductor light-emitting device [904] and the twelfth lens module [3718]; and the example [100] of the lighting system may be configured for aligning the fourth lens axis [1016] or the fifth lens axis [1216] with the second central light emission axis [1010] and the twelfth lens axis [3722]. In some examples, the example [100] of the lighting system may be configured for interchangeably installing either: a one of the twelfth lens module [3718] in the lighting module [102], and another of the twelfth lens module [3718] in the second lighting module [902]; or the third lens module [118] in the lighting module [102] and the sixth lens module [918] in the second lighting module [902]; or the seventh lens module [2318] in the lighting module [102] and the eighth lens module [2518] in the second lighting module [902]. In further examples [100] of the lighting system, two of the twelfth lens modules [3718] may be integrated together, or additional ones of the twelfth lens module [3718] may further be integrated together. In additional examples [100] of the lighting system (not shown), the plurality of twelfth lens modules [3718] may collectively be integrated in a row, or in a plurality of rows, or in a circle. As further examples [100] of the lighting system (not shown), a plurality of the twelfth lens modules [3718], being within a range of between one and about twenty, or being within a range of between one and about one hundred, may be integrated together with the twelfth lens module [3718]. As other examples [100] of the lighting system (not shown), a plurality of the twelfth lens modules [3718], being within a range of between one and about twenty, or being within a range of between one and about one hundred, may be integrated together with the twelfth lens module [3718].

Figure 39:
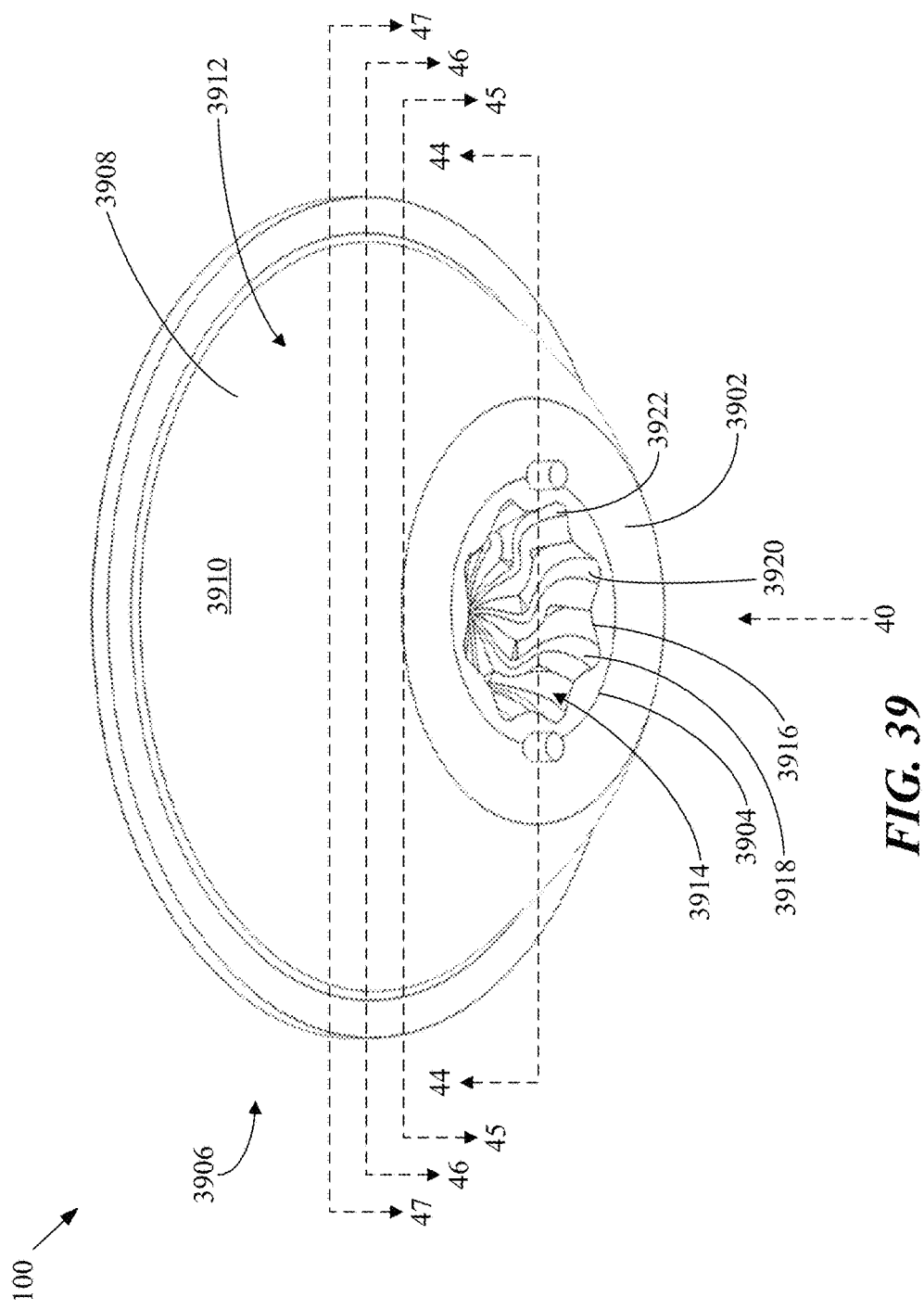
FIG. 39 is a perspective bottom view showing another portion of the example [100] of an implementation of a lighting system.
Figure 40:
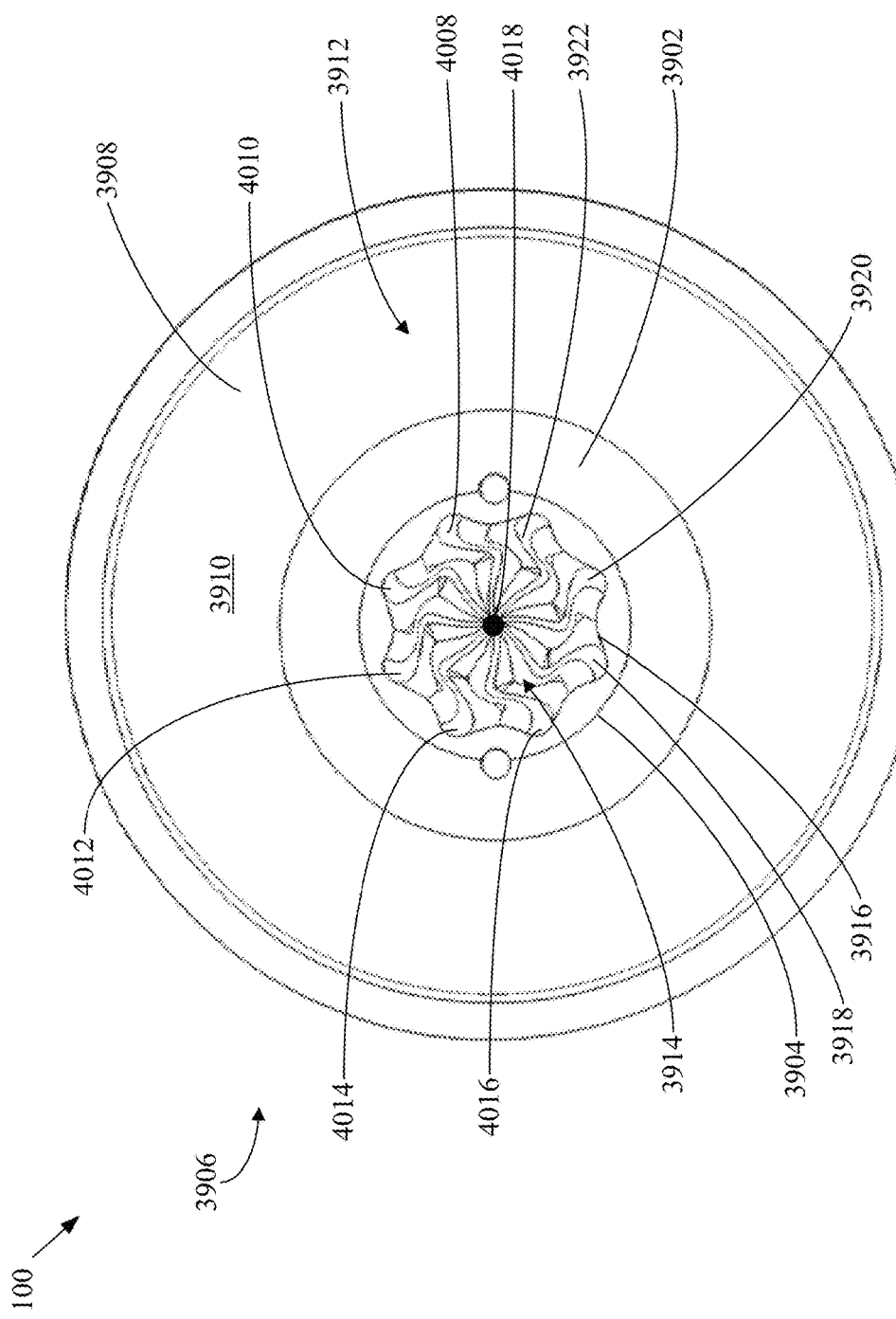
FIG. 40 is a bottom view taken along the line 40, showing the another portion of the example [100] of the lighting system.
Figure 41:
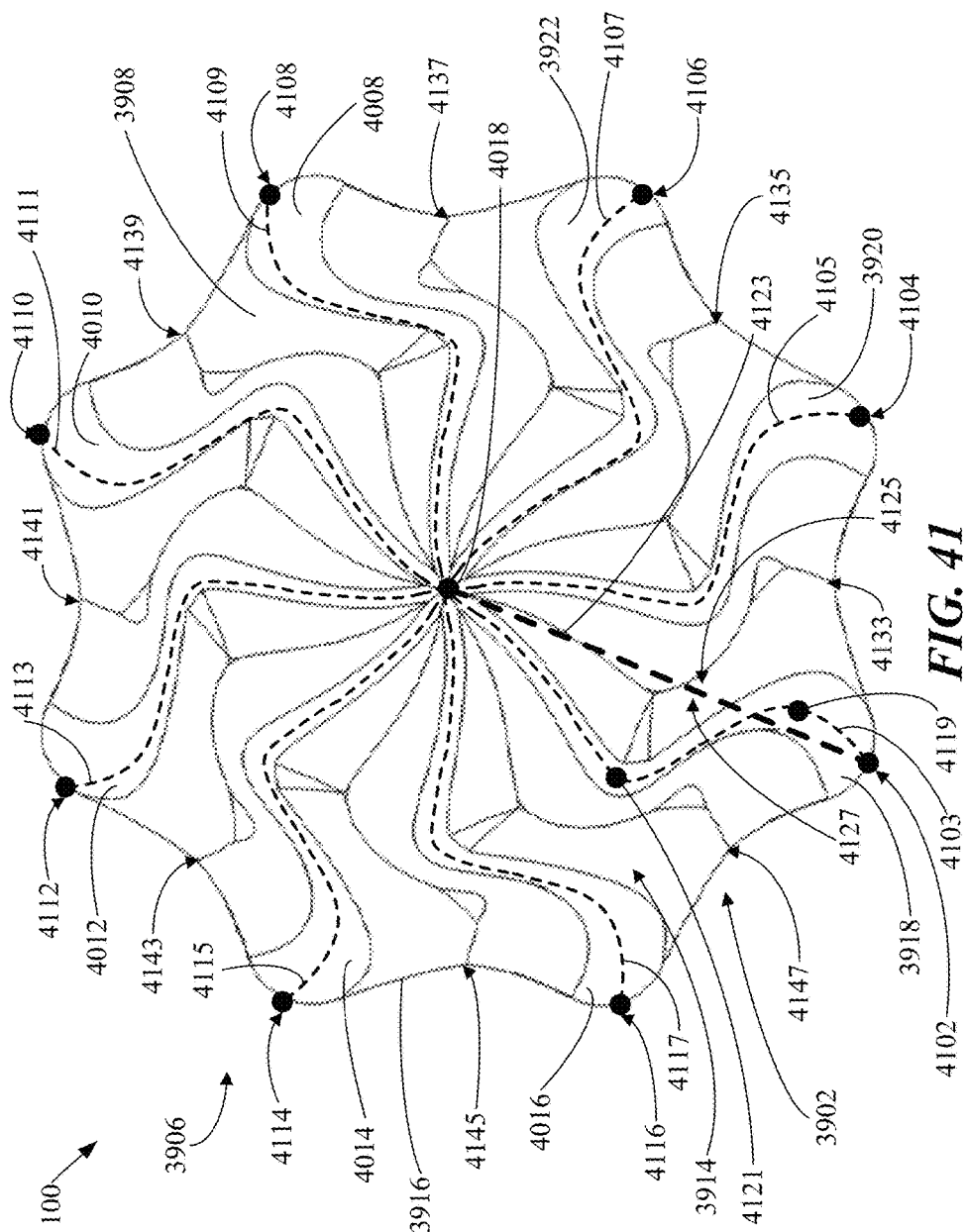
FIG. 41 is a bottom close-up view also taken along the line 40, showing a central bottom region of the another portion of the example [100] of the lighting system.
Figure 42:
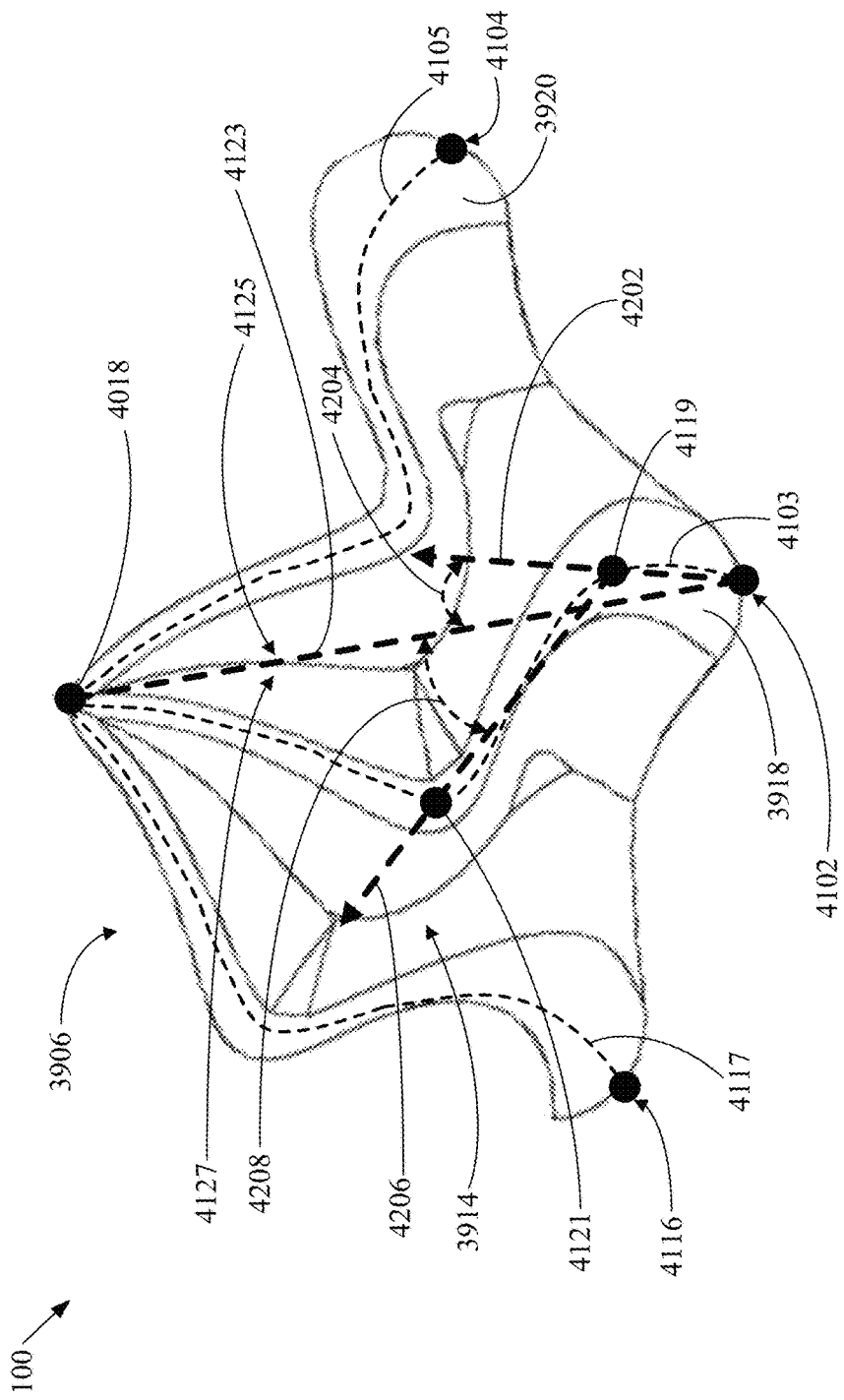
FIG. 42 is a close-up view also taken along the line 40, showing a portion of the central bottom region of the example [100] of the lighting system.
Figure 43:
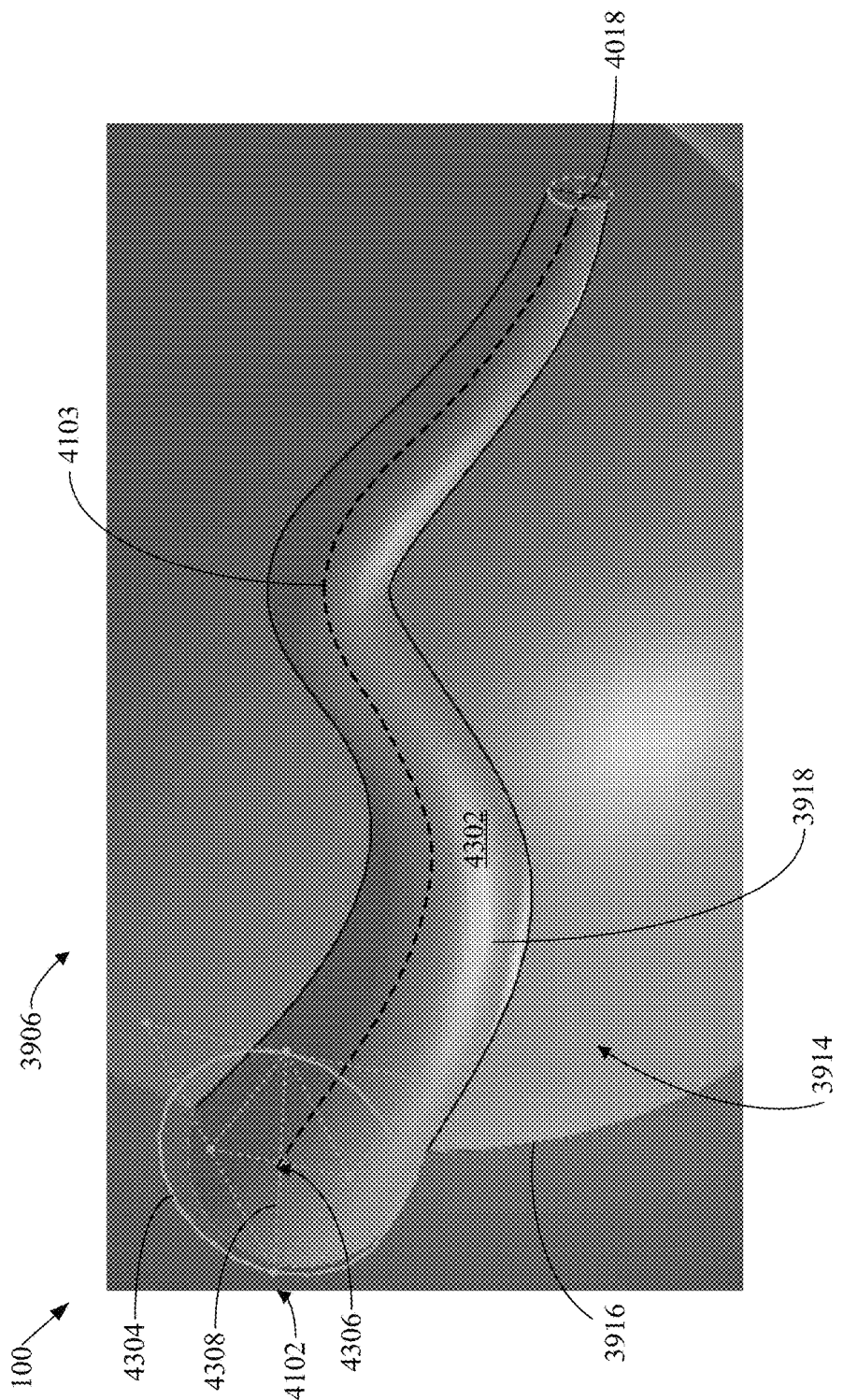
FIG. 43 is another close-up view also taken along the line 40, showing a portion of the central bottom region of the example [100] of the lighting system.
Figure 44:
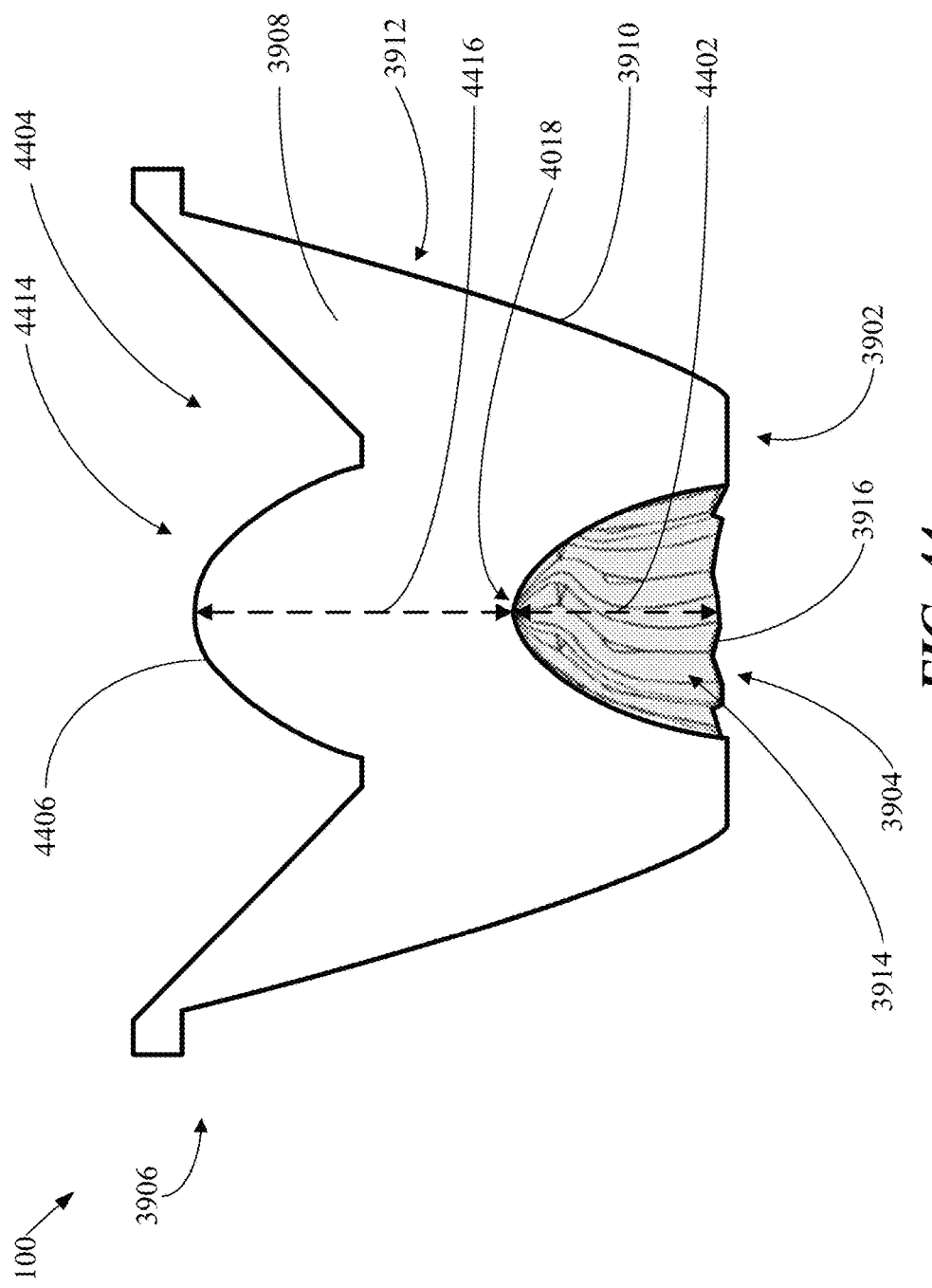
FIG. 44 is a cross-sectional side view taken along the line 44-44, showing the another portion of the example [100] of the lighting system.
Figure 45:
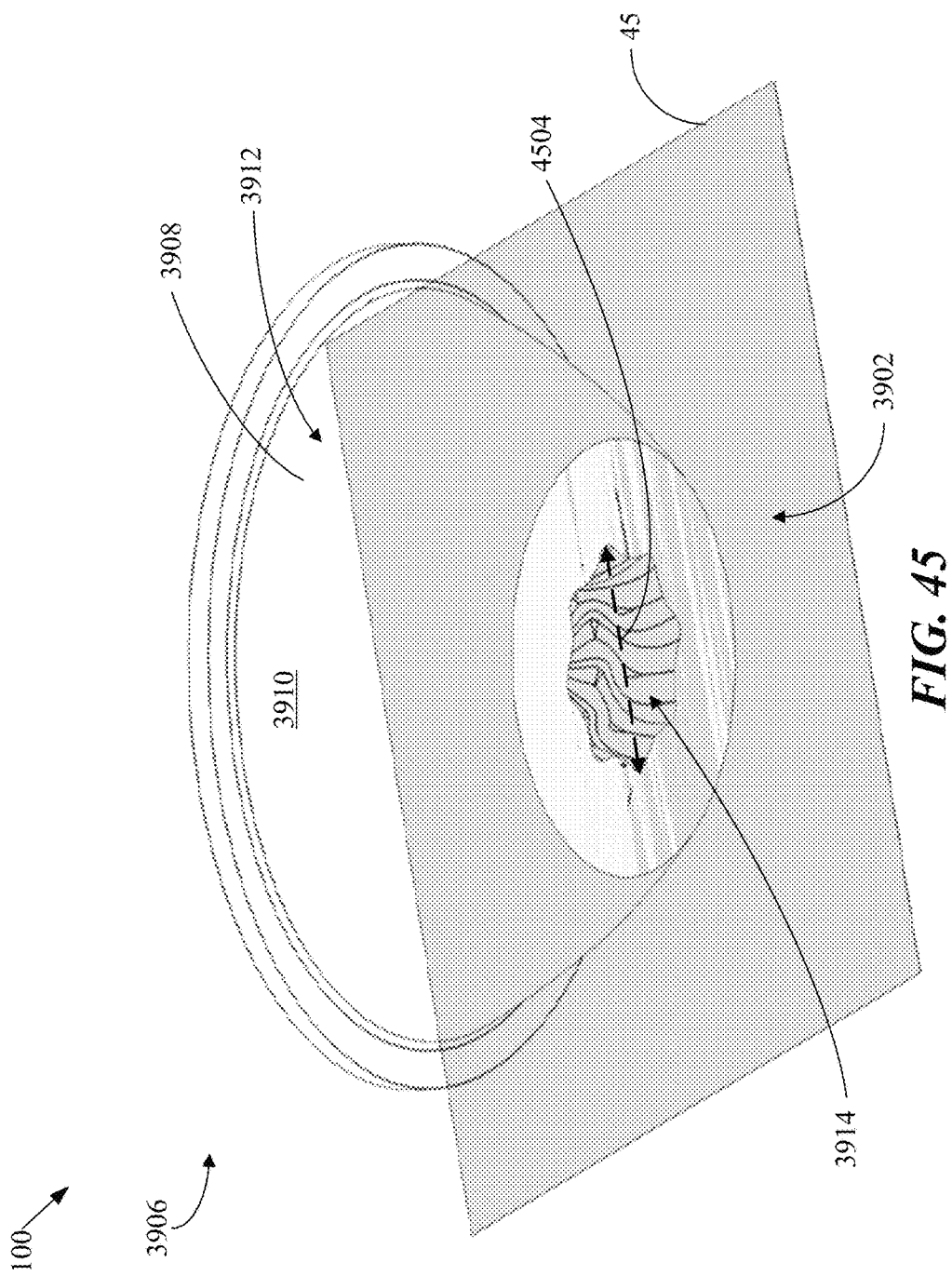
FIG. 45 is a cross-sectional perspective bottom view taken along the line 45-45, showing the another portion of the example [100] of the lighting system.
Figure 46:
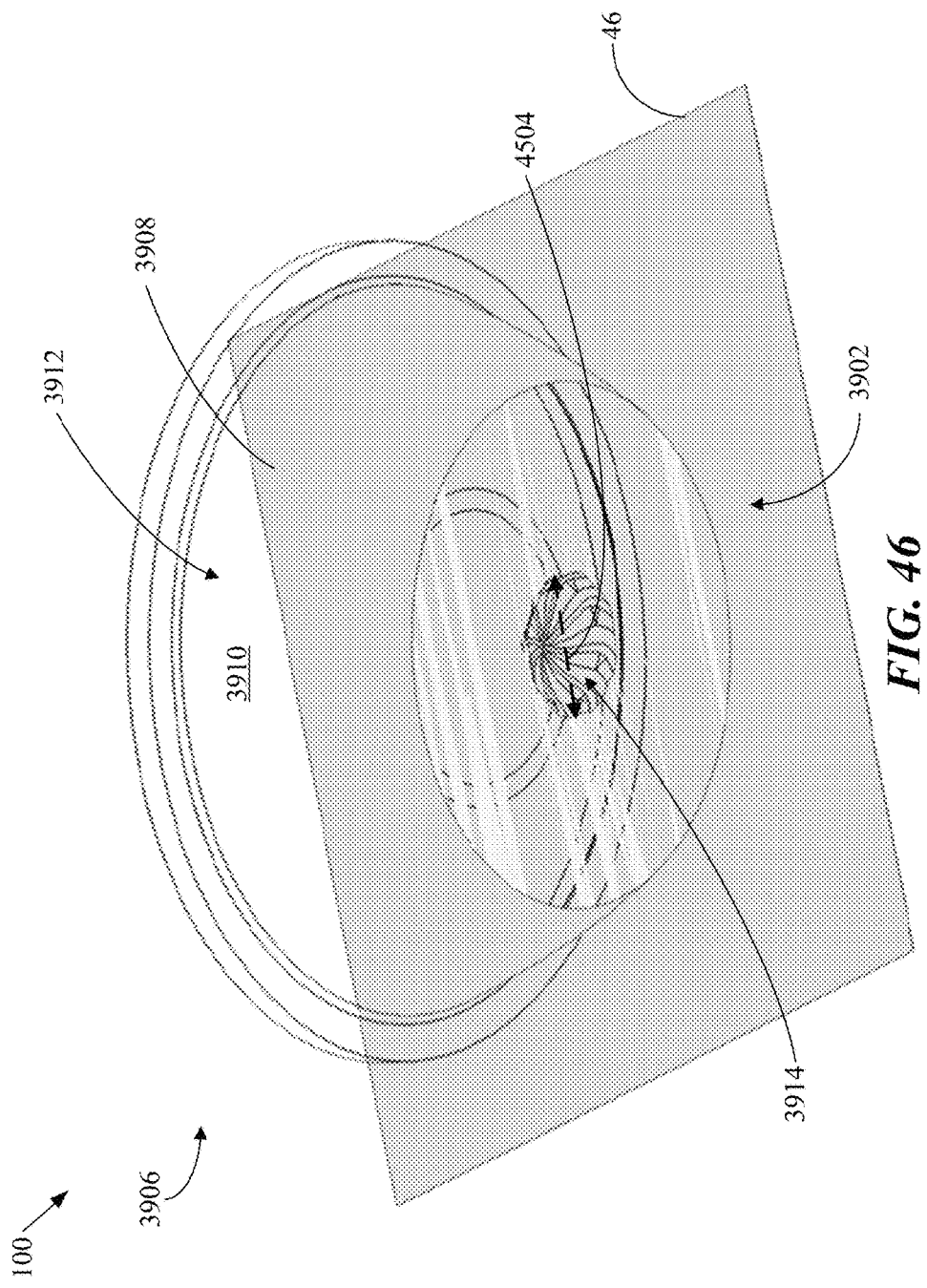
FIG. 46 is a cross-sectional perspective bottom view taken along the line 46-46, showing the another portion of the example [100] of the lighting system.
Figure 47:
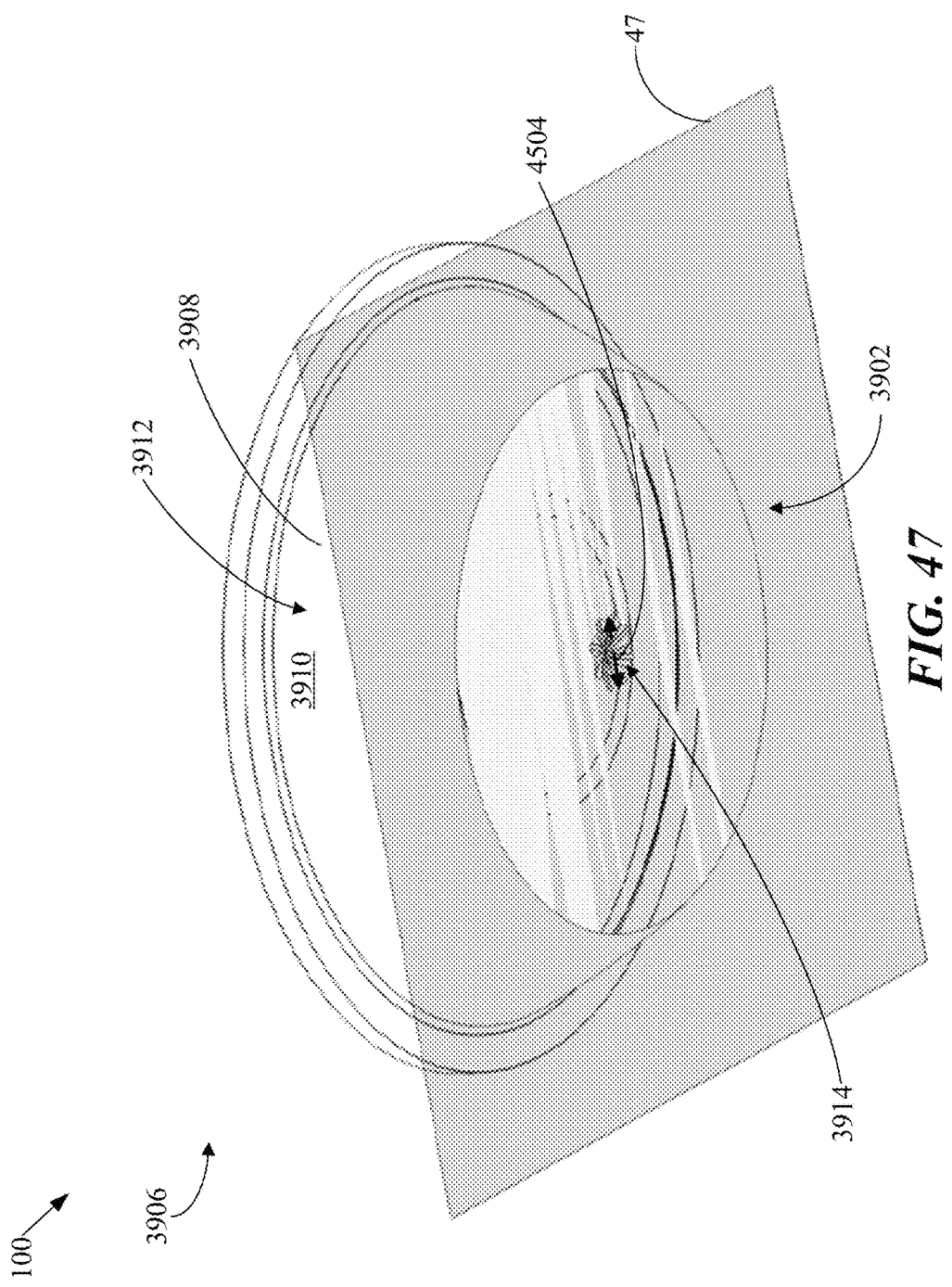
FIG. 47 is a cross-sectional perspective bottom view taken along the line 47-47, showing the another portion of the example [100] of the lighting system.

FIG. 39 is a perspective bottom view showing another portion of the example [100] of an implementation of a lighting system. FIG. 40 is a bottom view taken along the line 40, showing the another portion of the example [100] of the lighting system. FIG. 41 is a bottom close-up view also taken along the line 40, showing a central bottom region of the another portion of the example [100] of the lighting system. FIG. 42 is a close-up view also taken along the line 40, showing a portion of the central bottom region of the example [100] of the lighting system. FIG. 43 is another close-up view also taken along the line 40, showing a portion of the central bottom region of the example [100] of the lighting system. FIG. 44 is a cross-sectional side view taken along the line 44-44, showing the another portion of the example [100] of the lighting system. FIG. 45 is a cross-sectional perspective bottom view taken along the line 45-45, showing the another portion of the example [100] of the lighting system. FIG. 46 is a cross-sectional perspective bottom view taken along the line 46-46, showing the another portion of the example [100] of the lighting system. FIG. 47 is a cross-sectional perspective bottom view taken along the line 47-47, showing the another portion of the example [100] of the lighting system. As shown in FIGS. 39-47, the example [100] of the implementation of the lighting system further includes an example of a lens device [3906] that includes a converging lens [3908]. The converging lens [3908] of the example [100] of the lighting system has a light output surface [4414] being spaced apart along a lens axis [4416] from a light input surface [3902], the converging lens [3908] further having a total internal reflection side surface [3910] being spaced apart around the lens axis [4416] and having a frusto-conical shape [3912] extending between the light input surface [3902] and the light output surface [4414] of the converging lens [3908]. In some examples of the lens device [3906] of the example [100] of the lighting system, the light output surface [4414] of the converging lens [3908] may include a bowl-shaped cavity [4404]. In other examples of the lens device [3906] of the example [100] of the lighting system, the light output surface [4414] of the converging lens [3908] may include the bowl-shaped cavity [4404] as surrounding a central mound [4406] shaped as a portion of a spheroid. In the lens device [3906] of the example [100] of the lighting system, a portion [3904] of the light input surface [3902] of the converging lens [3908] includes a light input cavity [3914] being bounded by a perimeter [3916]. In the example [100] of the lighting system, the light input cavity [3914] of the lens device [3906] has a central axis [4402] and is generally shaped as a portion of a spheroid. FIGS. 45-47 show that the diameter [4504] of the light input cavity [3914] gradually decreases in an upward direction along the central axis [4402] shown in FIG. 44. Further in the lens device [3906] of the example [100] of the lighting system, the light input cavity [3914] has a plurality of grooves [3918], [3920], [3922], [4008], [4010], [4012], [4014], [4016] each respectively following a spline [4103], [4105], [4107], [4109], [4111], [4113], [4115], [4117] along the light input surface [3902] that intersects at a point [4018] with the central axis [4402] of the light input cavity [3914] and that intersects with a respective point [4102], [4104], [4106], [4108], [4110], [4112], [4114], [4116] on the perimeter [3916]. In the example [100] of the lighting system, the respective points [4102], [4104], [4106], [4108], [4110], [4112], [4114], [4116] may be mutually spaced apart around the perimeter [3916] of the light input cavity [3914]. In an example of the lens device [3906] of the example [100] of the lighting system, the plurality of the grooves [3918], [3920], [3922], [4008], [4010], [4012], [4014], [4016] may include four of the grooves [3918], [3922], [4010], [4014] that respectively intersect with four of the plurality of the points [4102], [4106], [4110], [4114] being mutually spaced apart around the perimeter [3916] of the light input cavity [3914]. In another example of the lens device [3906] of the example [100] of the lighting system, the plurality of the grooves [3918], [3920], [3922], [4008], [4010], [4012], [4014], [4016] may include more than four grooves, for example five grooves [3918], [3922], [4010], [4014], [4016] that respectively intersect with five of the plurality of the points [4102], [4106], [4110], [4114], [4116] being mutually spaced apart around the perimeter [3916] of the light input cavity [3914]. As a further example of the lens device [3906] of the example [100] of the lighting system, the plurality of the grooves [3918], [3920], [3922], [4008], [4010], [4012], [4014], [4016] may include eight or more grooves, for example eight grooves [3918], [3920], [3922], [4008], [4010], [4012], [4014], [4016] that respectively intersect with eight of the plurality of the points [4102], [4104], [4106], [4108], [4110], [4112], [4114], [4116] being mutually spaced apart around the perimeter [3916] of the light input cavity [3914]. As an additional example of the lens device [3906] of the example [100] of the lighting system, the plurality of the grooves [3918]-[4016] that respectively intersect with the plurality of the points [4102]-[4116] may be uniformly or non-uniformly spaced apart around the perimeter [3916] of the light input cavity [3914]. In a further example of the lens device [3906] of the example [100] of the lighting system, the plurality of the grooves may include: a first groove [3918] following a first spline [4103] that intersects at the point [4018] with the central axis [4402] of the light input cavity [3914] and with a first point [4102] on the perimeter [3916]; and a second groove [3922] following a second spline [4107] that intersects at the point [4018] with the central axis [4402] of the light input cavity [3914] and with a second point [4106] on the perimeter [3916]; and a third groove [4010] following a third spline [4111] that intersects at the point [4018] with the central axis [4402] of the light input cavity [3914] and with a third point [4110] on the perimeter [3916]; and a fourth groove [4014] following a fourth spline [4115] that intersects at the point [4018] with the central axis [4402] of the light input cavity [3914] and with a fourth point [4114] on the perimeter [3916]. In an example of the lens device [3906] of the example [100] of the lighting system, the splines [4103], [4105], [4107], [4109], [4111], [4113], [4115], [4117] being followed by each one of the plurality of the grooves [3918], [3920], [3922], [4008], [4010], [4012], [4014], [4016] may have the same shape as does the spline [4103]. Further in that example of the lens device [3906] of the example [100] of the lighting system, the spline [4103] may include four control points [4102], [4119], [4121], [4018]. Additionally in that example of the lens device [3906] of the example [100] of the lighting system, the spline [4103] may pass through each one of the four control points [4102], [4119], [4121], [4018]. Also in that example of the lens device [3906] of the example [100] of the lighting system, a first one of the four control points may be located at a one [4102] of the respective points [4102], [4104], [4106], [4108], [4110], [4112], [4114], [4116] on the perimeter [3916]; and a fourth one of the four control points may be located at the point [4018] on the central axis [4402] of the light input cavity [3914]; and a second one [4119] of the four control points may be adjacent to the first control point [4102]; and a third one [4121] of the four control points may be adjacent to the fourth control point [4018]. Further in that example of the lens device [3906] of the example [100] of the lighting system, the spline [4103] and likewise each of the splines [4103], [4105], [4107], [4109], [4111], [4113], [4115], [4117] may include a first inflection point and a second inflection point; and as an example, the first inflection point may be located at the second control point [4119], and the second inflection point may be located at the third control point [4121]. Additionally in that example of the lens device [3906] of the example [100] of the lighting system, the spline [4103], and likewise the splines [4105], [4107], [4109], [4111], [4113], [4115], [4117], may span a spline axis [4123] extending between the first control point [4102] and the fourth control point [4018]; and the first inflection point [4119] may be located on one side [4125] of the spline axis [4123]; and the second inflection point [4121] may be located on an opposite side [4127] of the spline axis [4123]. In one example of the lens device [3906] of the example [100] of the lighting system, the first inflection point may be located at the second control point [4119]; and a straight arrow [4202] originating at the first control point [4102] and passing through the second control point [4119] may extend away from the spline axis [4123] at an angle [4204] being within a range of about 10 degrees and about 20 degrees, or being about 15 degrees. In another example of the lens device [3906] of the example [100] of the lighting system, the second inflection point may be located at the third control point [4121]; and a straight arrow [4206] originating at the second control point [4119] and passing through the third control point [4121] may extend away from the spline axis [4123] at an angle [4208] being within a range of about 55 degrees and about 45 degrees, or being about 50 degrees. As an additional example of the lens device [3906] of the example [100] of the lighting system, the spline [4103], and likewise the splines [4103], [4105], [4107], [4109], [4111], [4113], [4115], [4117], may be Catmull-Rom splines. As another example of the lens device [3906] of the example [100] of the lighting system, the plurality of the grooves [3918]-[4016] may be mutually spaced apart around the perimeter [3916]. Further, for example, the plurality of the grooves [3918]-[4016] may be uniformly or non-uniformly spaced apart around the perimeter [3916]. In other examples of the lens device [3906] of the example [100] of the lighting system, each one of the plurality of the grooves [3918]-[4016] may intersect with the point [4018] on the central axis [4402] of the light input cavity [3914] and with the perimeter [3916]. As additional examples of the lens device [3906] of the example [100] of the lighting system, the light input cavity [3914] may include a plurality of un-grooved regions [4133], [4135], [4137], [4139], [4141], [4143], [4145], [4147] being mutually spaced apart around the perimeter [3916]; and each one of the plurality of the grooves [3918]-[4016] may be interposed between two of the plurality of the un-grooved regions [4133]-[4147] of the light input cavity [3914]. Further, for example, the light input cavity [3914] may include each one of the plurality of the un-grooved regions [4133]-[4147] as being a raised region, the raised regions [4133]-[4147] being mutually spaced apart around the perimeter [3916]; and each one of the plurality of the grooves [3918]-[4016] may be interposed between two of the plurality of the raised regions [4133]-[4147] of the light input cavity [3914]. In an example, each one of the raised regions [4133]-[4147] may intersect with the point [4018] on the central axis [4402] and with the perimeter [3916]. As another example, the groove [3918], and likewise each other one of the plurality of the grooves [3920]-[4016], may form a respective concave surface [4302] of the light input cavity [3914], the concave surface [4302] and each of the other respective concave surfaces (not shown) being generally shaped as a portion of an ellipse [4304] having an ellipse axis [4306] being extended along the spline [4103] and likewise along the other respective splines [4105], [4107], [4109], [4111], [4113], [4115], [4117]. Further, for example, the concave surface [4302] and each of the other respective concave surfaces (not shown) may be generally shaped with the ellipse [4304] as being a circle having a circle axis [4306] being extended along the spline [4103] and likewise along the other respective splines [4105]-[4117]. As additional examples of the lens device [3906] of the example [100] of the lighting system, the concave surface [4302] may have a radius [4308] and each of the other respective concave surfaces (not shown) may likewise have a respective radius; and the radius [4308] and the other respective radii may likewise have lengths that vary along the respective splines [4103], [4105], [4107], [4109], [4111], [4113], [4115], [4117]. Further, for example, a length of the radius [4308], and likewise of each of the other respective radii, at the intersections [4102], [4104], [4106], [4108], [4110], [4112], [4114], [4116] of the splines [4103]-[4117] with the perimeter [3916] may be greater than another length of the radius [4308], and likewise of each of the other respective radii, at the intersections of the splines [4103]-[4117] with the point [4018] on the central axis [4402] of the light input cavity [3914]. For example, the length of the radius [4308], and likewise the lengths of each of the other respective radii, may gradually decrease, from the intersections [4102]-[4116] of the splines [4103]-[4117] with the perimeter [3916], to the intersections of the splines [4103]-[4117] with the point [4018] on the central axis [4402] of the light input cavity [3914]. In one example, the lengths of each of the respective radii [4308] at the intersections [4102]-[4116] of the splines [4103]-[4117] with the perimeter [3916] may be within a length range of between about 2.5 millimeters and about 1.5 millimeters, or a length of about 2 millimeters; and the lengths of each of the respective radii [4308] at the intersections of the splines [4103]-[4117] with the point [4018] on the central axis [4402] of the light input cavity [3914] may be within a length range of between about 0.75 millimeter and about 0.25 millimeter, or a length of about 0.5 millimeters. In some examples of the example [100] of the lighting system, the lens device [3906] may be configured for emitting light having a full width half maximum beam width being within a range of between about 13 degrees and about 16 degrees, or being about 15 degrees.

Figure 48:
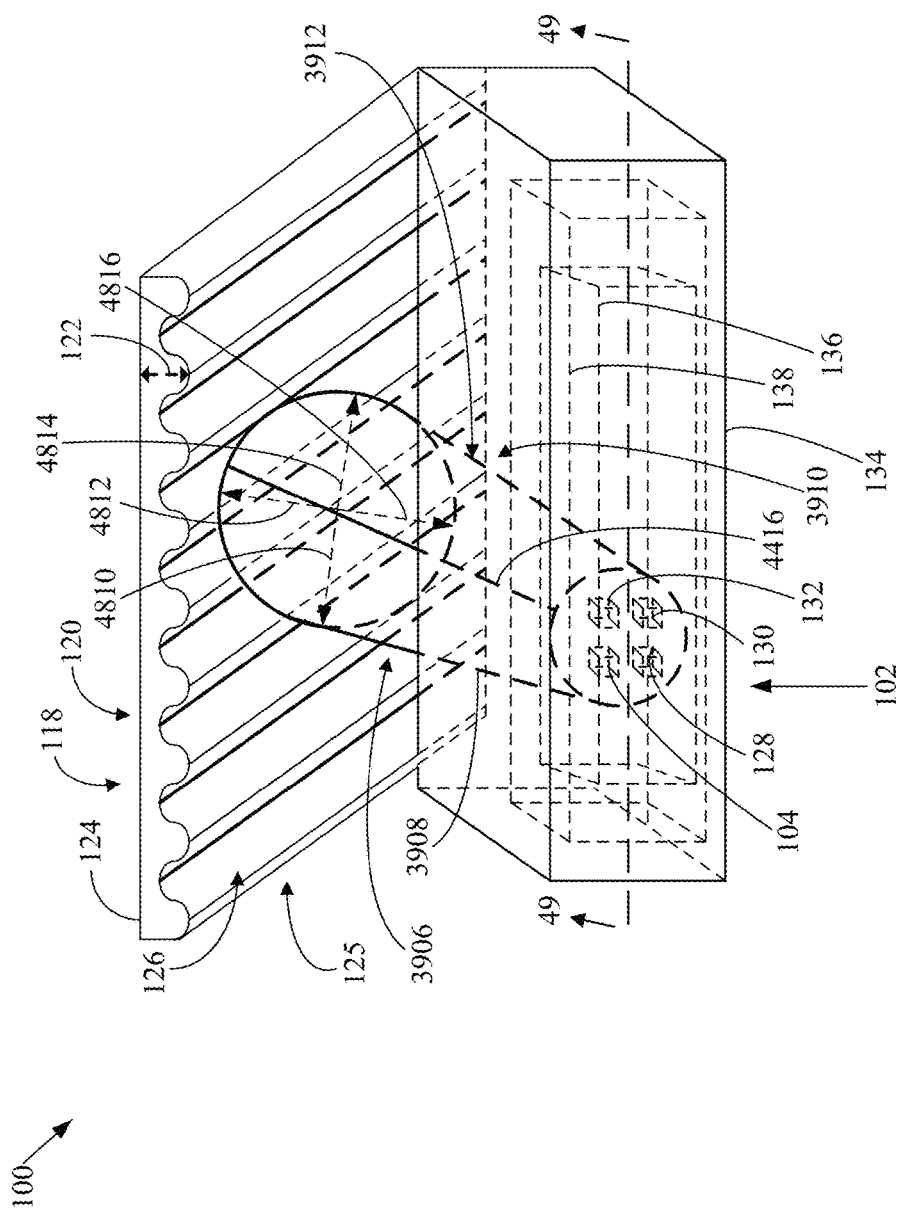
FIG. 48 is a perspective bottom view showing an additional portion of the example [100] of an implementation of a lighting system.
Figure 49:
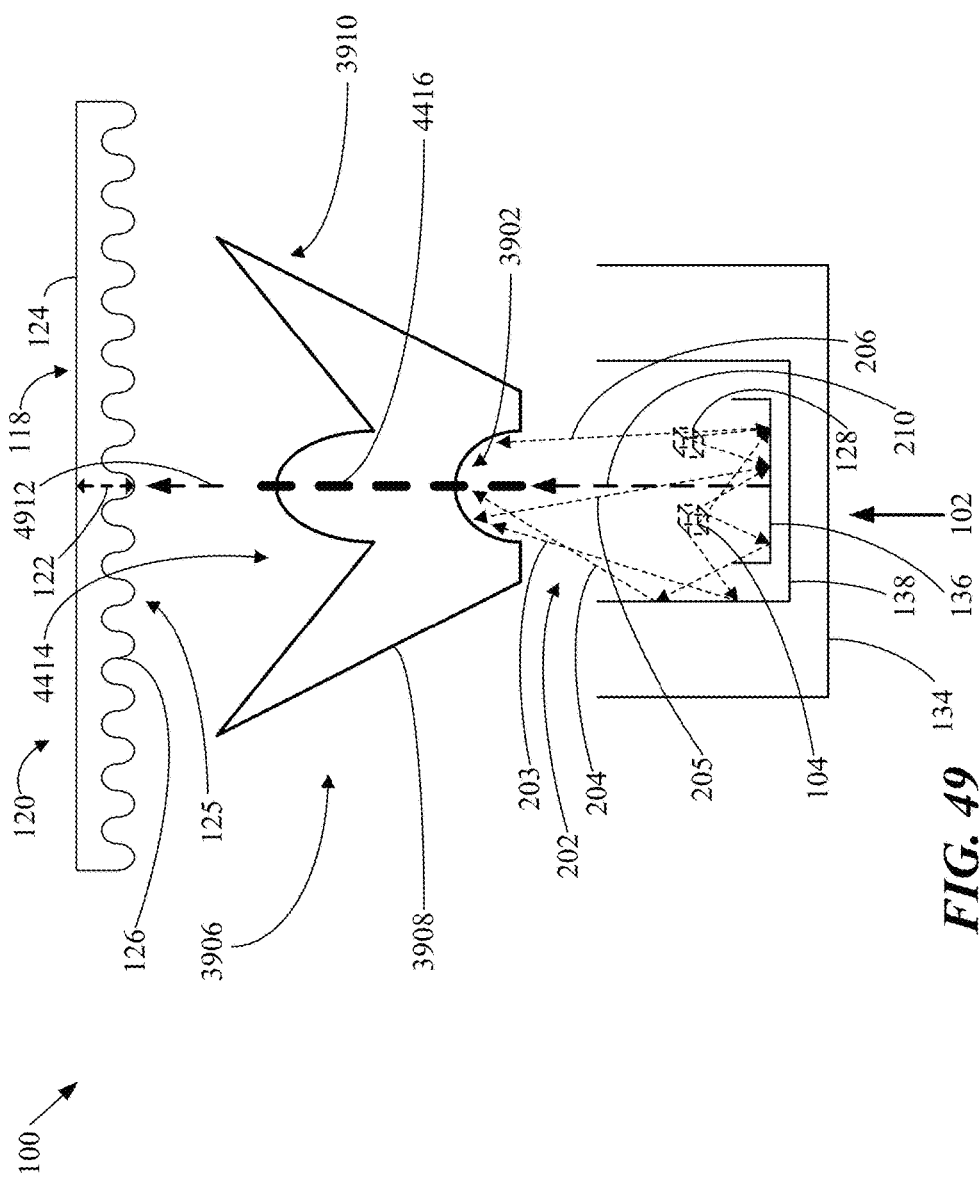
FIG. 49 is a cross-sectional side view taken along the line 49-49, showing the additional portion of the example [100] of the lighting system.

FIG. 48 is a perspective bottom view showing an additional portion of the example [100] of an implementation of a lighting system. FIG. 49 is a cross-sectional side view taken along the line 49-49, showing the additional portion of the example [100] of the lighting system. As shown in FIGS. 48 and 49, the example [100] of the implementation of the lighting system further includes the lens device [3906] as being a thirteenth lens module that includes the converging lens [3908]. The converging lens [3908] of the example [100] of the lighting system is configured for causing convergence of some of the light emissions [202] of the semiconductor light-emitting device [104] to form further converged light emissions [4912] along the central light emission axis [210] having a HWHM around the central light emission axis [210] as represented by each of the arrows [4810], [4812], [4814], [4816], the converging lens [3908] having the light output surface [4414] being spaced apart along the lens axis [4416] from the light input surface [3902], the converging lens [3908] further having the total internal reflection side surface [3910] being spaced apart around the lens axis [4416] and having the frusto-conical shape [3912] extending between the light input surface [3902] and the light output surface [4414] of the converging lens [3908]. In examples, the example [100] of the lighting system may be configured for detachably installing the thirteenth lens module [3906] in the first lighting module [102] between the semiconductor light-emitting device [104] and the third lens module [118]; and the example [100] of the lighting system may be configured for aligning the lens axis [4416] with the first central light emission axis [210] and with the lens axis [122]. Further, for example, the third lens module [118] may be replaced by another lens module, such as: an asymmetric twelfth lens module [3718]; or an asymmetric lens module (not shown) having bi-axial asymmetry; or a refractive lens module; or a diffuser plate. In other examples, the example [100] of the lighting system may be configured for detachably installing the thirteenth lens module [3906] in the first lighting module [102] over the semiconductor light-emitting device [104], and the example [100] of the lighting system may be configured for aligning the lens axis [4416] with the first central light emission axis [210]; and the third lens module [118] may be omitted.

Figure 50:
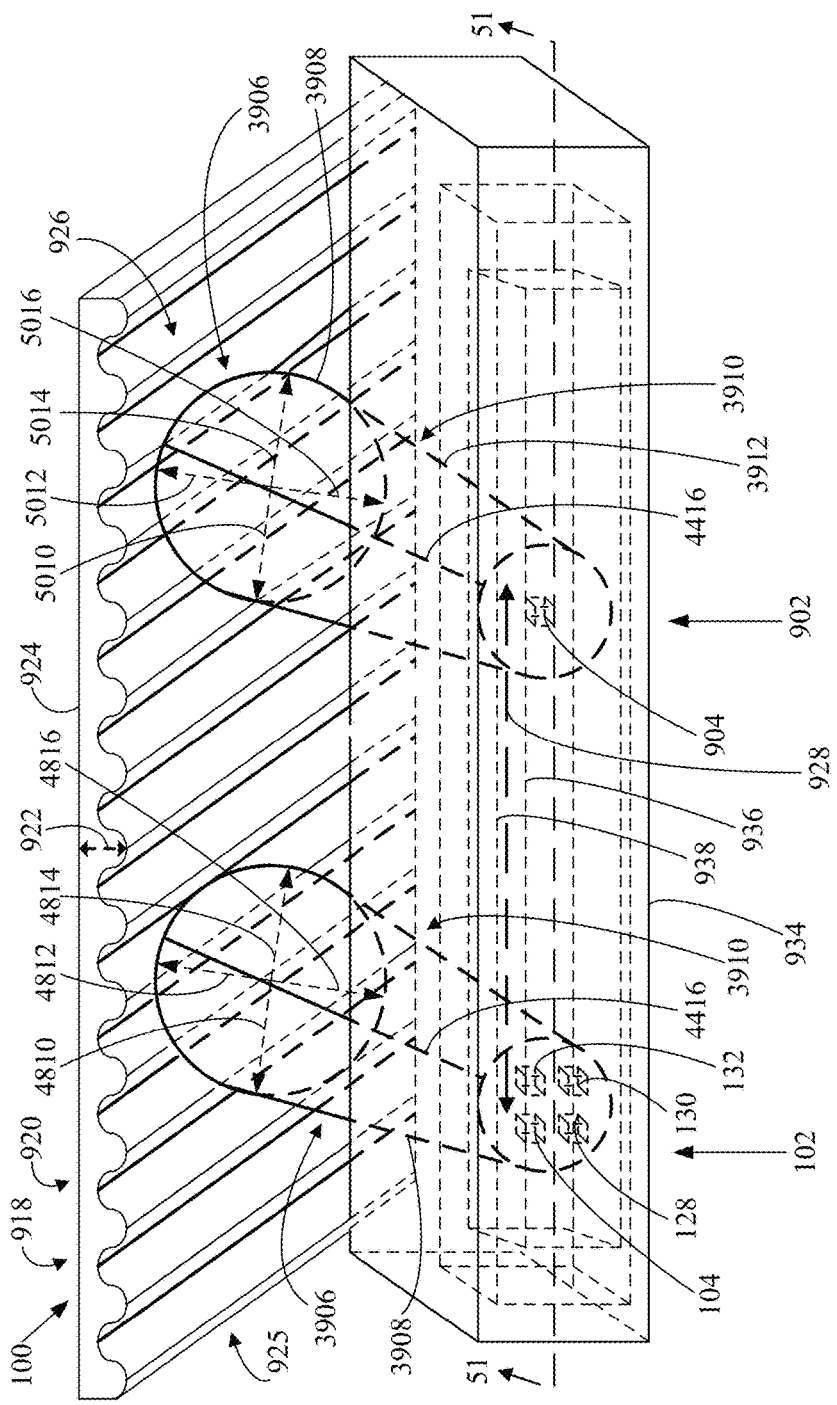
FIG. 50 is a perspective bottom view showing a further portion of the example [100] of an implementation of a lighting system.
Figure 51:
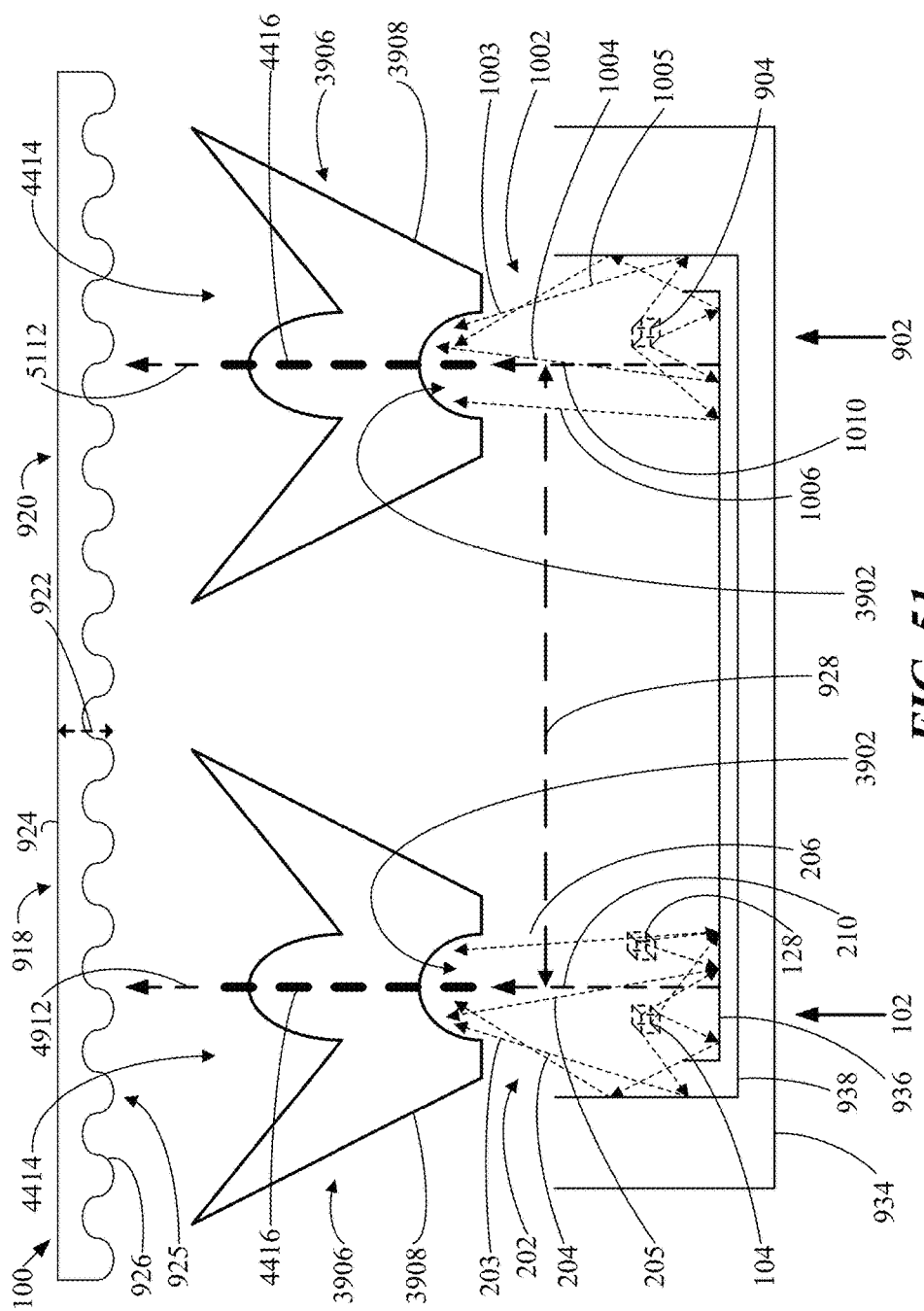
FIG. 51 is a cross-sectional side view taken along the line 51-51, showing the additional portion of the example [100] of the lighting system.

FIG. 50 is a perspective bottom view showing a further portion of the example [100] of an implementation of a lighting system. FIG. 51 is a cross-sectional side view taken along the line 51-51, showing the additional portion of the example [100] of the lighting system. As shown in FIGS. 50 and 51, the example [100] of the implementation of the lighting system further includes a second lens device [3906] as being a fourteenth lens module including an additional converging lens [3908]. The additional converging lens [3908] of the example [100] of the lighting system is configured for causing convergence of some of the light emissions [1002] of the semiconductor light-emitting device [904] to form further converged light emissions [5112] along the central light emission axis [1010], having a HWHM around the central light emission axis [1010] as represented by each of the arrows [5010], [5012], [5014], [5016], the additional converging lens [3908] having the light output surface [4414] being spaced apart along the lens axis [4416] from the light input surface [3902], the additional converging lens [3908] further having the total internal reflection side surface [3910] being spaced apart around the lens axis [4416] and having the frusto-conical shape [3912] extending between the light input surface [3902] and the light output surface [4414] of the converging lens [3908]. In examples, the example [100] of the lighting system may be configured for detachably installing the thirteenth lens module [3906] in the first lighting module [102] between the semiconductor light-emitting device [104] and the sixth lens module [918] and detachably installing the fourteenth lens module [3906] in the second lighting module [902] between the semiconductor light-emitting device [904] and the sixth lens module [918]; and the example [100] of the lighting system may be configured for aligning the lens axes [4416] of the thirteenth and fourteenth lens modules with the first and second central light emission axes [210], [1010] and with the lens axis [922]. In other examples, the example [100] of the lighting system may be configured for detachably installing the thirteenth lens module [3906] in the first lighting module [102] over the semiconductor light-emitting device [104] and detachably installing the fourteenth lens module [3906] in the second lighting module [902] over the semiconductor light-emitting device [904]; and the example [100] of the lighting system may be configured for aligning the lens axes [4416] of the thirteenth and fourteenth lens modules respectively with the first and second central light emission axes [210], [1010]; and the sixth lens module [918] may be omitted. In further examples [100] of the lighting system, two of the thirteenth lens modules [3906] may be integrated together, or additional ones of the thirteenth lens module [3906] may further be integrated together. In additional examples [100] of the lighting system (not shown), the plurality of thirteenth lens modules [3906] may collectively be integrated in a row, or in a plurality of rows, or in a circle, or in a cluster. As further examples [100] of the lighting system (not shown), a plurality of the fourteenth lens modules [3906], being within a range of between one and about twenty, or being within a range of between one and about one hundred, may be integrated together. Further, for example, each of the lighting modules [102], [902] may include a plurality of semiconductor light-emitting devices ("SLEDs") [104], [904], such as, for example, a cluster, ring, or pinwheel formation including 4-24 SLEDs.

The lens devices [3906] may be fabricated by using electrical discharge machining ("EDM") to fabricate a positive mold including the light input cavity [3914] that may then be used for injection molding of the lens devices [3906].

The examples [100] of lighting systems may generally be utilized in end-use applications where evenly-blended light generated by semiconductor light-emitting devices is needed. For example, the examples [100] of lighting systems including the lens devices [3906] may generate light having a more uniform intensity distribution and an evenly-illuminated appearance, without projected images of the semiconductor light-emitting devices themselves. Furthermore, the examples [100] of lighting systems including the lens devices [3906] may generate light having a more narrow beam angle than other systems utilizing microlenses or random lens surface texturing for purposes of blending output light to hide images of semiconductor light-emitting devices.

The examples of lens devices and lighting systems that are disclosed herein may also be fabricated and utilized together with the teachings disclosed in the following commonly-owned U.S. patent applications, the entireties of which are hereby incorporated herein by reference: U.S. patent application Ser. No. 14/526,504 filed on Oct. 28, 2014, entitled "Lighting Systems Having Multiple Light Sources"; U.S. patent application Ser. No. 14/636,204 filed on Mar. 3, 2015, entitled "Lighting Systems Including Lens Modules For Selectable Light Distribution"; U.S. patent application Ser. No. 14/617,849 filed on Feb. 9, 2015, entitled "Lighting Systems Generating Controlled and Wavelength-Converted Light Emissions"; U.S. patent application Ser. No. 14/702,800 filed on May 4, 2015, entitled "Lighting Systems Including Asymmetric Lens Modules For Selectable Light Distribution"; U.S. patent application Ser. No. 14/702,765 filed on May 4, 2015, entitled "Lighting System Having a Sealing System."; U.S. patent application Ser. No. 14/636,205 filed on Mar. 3, 2015, entitled "Low-Profile Lighting System Having Pivotable Lighting Enclosure."; and U.S. patent application Ser. No. 14/816,827 filed on Aug. 3, 2015, entitled "Lighting System Having a Mounting Device."

While the present invention has been disclosed in a presently defined context, it will be recognized that the present teachings may be adapted to a variety of contexts consistent with this disclosure and the claims that follow. For example, the lighting systems shown in the figures and discussed above can be adapted in the spirit of the many optional parameters described.

We claim:

1. A lens device, comprising:
   a converging lens having a light output surface being spaced apart along a lens axis from a light input surface, the converging lens further having a total internal reflection side surface being spaced apart around the lens axis and having a frusto-conical shape extending between the light input and output surfaces of the converging lens;
   wherein a portion of the light input surface of the converging lens includes a light input cavity being bounded by a perimeter, the light input cavity having a central axis and being generally shaped as a portion of a spheroid;
   wherein the light input cavity has a plurality of grooves each respectively following a spline along the light input surface that intersects with the central axis of the light input cavity and with a respective point on the perimeter; and wherein each of the respective points are mutually spaced apart around the perimeter of the light input cavity.

2. The lens device of claim 1, wherein the spline being followed by each one of the plurality of the grooves is the same spline, and wherein the spline includes four control points.

3. The lens device of claim 2, wherein the spline passes through each one of the four control points.

4. The lens device of claim 3, wherein the spline is a Catmull-Rom spline.

5. The lens device of claim 3, wherein a first one of the four control points is located at a one of the respective points on the perimeter; and wherein a fourth one of the four control points is located at the central axis of the light input cavity; and wherein a second one of the four control points is adjacent to the first control point; and wherein a third one of the four control points is adjacent to the fourth control point.

6. The lens device of claim 5, wherein the spline includes a first inflection point and a second inflection point.

7. The lens device of claim 6, wherein the first inflection point is located at the second control point; and wherein the second inflection point is located at the third control point.

8. The lens device of claim 7, wherein the spline spans a spline axis extending between the first control point and the fourth control point; and wherein the first inflection point is located on one side of the spline axis; and wherein the second inflection point is located on an opposite side of the spline axis.

9. The lens device of claim 8, wherein a straight arrow originating at the first control point and passing through the second control point extends away from the spline axis at an angle being within a range of about 10 degrees and about 20 degrees.

10. The lens device of claim 9, wherein a straight arrow originating at the second control point and passing through the third control point extends away from the spline axis at an angle being within a range of about 55 degrees and about 45 degrees.

11. The lens device of claim 1, wherein the plurality of the grooves are mutually spaced apart around the perimeter; and wherein each one of the plurality of the grooves intersects with the central axis of the light input cavity and with the perimeter; and wherein the light input cavity includes a plurality of un-grooved regions being mutually spaced apart around the perimeter; and wherein each one of the plurality of the grooves is interposed between two of the plurality of the un-grooved regions of the light input cavity.

12. The lens device of claim 11, wherein the light input cavity includes a plurality of raised regions being mutually spaced apart around the perimeter; and wherein each one of the plurality of the grooves is interposed between two of the plurality of the raised regions of the light input cavity.

13. The lens device of claim 12, wherein each one of the plurality of the raised regions intersects with the central axis and with the perimeter.

14. The lens device of claim 1, wherein each one of the plurality of the grooves forms a respective concave surface of the light input cavity, each of the respective concave surfaces being generally shaped as a portion of: an ellipse having an ellipse axis being extended along the spline; or a circle having a circle axis being extended along the spline.

15. The lens device of claim 14, wherein each of the respective concave surfaces has a respective radius, and wherein the respective radii have lengths that vary along the spline.

16. The lens device of claim 1, wherein the light output surface of the converging lens includes a bowl-shaped cavity surrounding a central mound shaped as a portion of a spheroid.

17. The lens device of claim 1, wherein the plurality of the grooves includes at least four of the grooves that respectively intersect with four of the plurality of the points being mutually spaced apart around the perimeter of the light input cavity.

18. The lens device of claim 1, wherein the plurality of the grooves includes at least five of the grooves that respectively intersect with five of the plurality of the points being mutually spaced apart around the perimeter of the light input cavity.

19. The lens device of claim 1, wherein the plurality of the grooves includes at least eight of the grooves that respectively intersect with eight of the plurality of the points being mutually spaced apart around the perimeter of the light input cavity.

20. The lens device of claim 1, wherein the plurality of the grooves includes: a first groove following a first spline that intersects with the central axis of the light input cavity and with a first point on the perimeter; and a second groove following a second spline that intersects with the central axis of the light input cavity and with a second point on the perimeter; and a third groove following a third spline that intersects with the central axis of the light input cavity and with a third point on the perimeter; and a fourth groove following a fourth spline that intersects with the central axis of the light input cavity and with a fourth point on the perimeter.

21. The lens device of claim 1, wherein the spline being followed by each one of the plurality of the grooves is the same spline.

22. The lens device of claim 1, wherein the plurality of the grooves are mutually spaced apart around the perimeter.

23. The lens device of claim 22, wherein each one of the plurality of the grooves intersects with the central axis of the light input cavity and with the perimeter.

24. The lens device of claim 1, wherein each one of the plurality of the grooves forms a respective concave surface of the light input cavity, each of the respective concave surfaces being generally shaped as a portion of an ellipse having an ellipse axis being extended along the spline.

25. The lens device of claim 1, wherein each one of the plurality of the grooves forms a respective concave surface of the light input cavity, each of the respective concave surfaces being generally shaped as a portion of a circle having a circle axis being extended along the spline.

26. The lens device of claim 25, wherein each of the respective concave surfaces has a respective radius; and wherein the respective radii have lengths that vary along the spline; and wherein a length of each of the respective radii at the intersection of the spline with the perimeter is greater than another length of each of the respective radii at the intersection of the spline with the central axis of the light input cavity.

27. The lens device of claim 26, wherein the lengths of each of the respective radii gradually decrease from the intersection of the spline with the perimeter to the intersection of the spline with the central axis of the light input cavity.

28. The lens device of claim 27, wherein the length of each of the respective radii at the intersection of the spline with the perimeter is within a range of between about 2 millimeters and about 1.5 millimeters; and wherein the another length of each of the respective radii at the intersection of the spline with the central axis of the light input cavity is within a range of between about 0.75 millimeter and about 0.25 millimeter.

29. The lens device of claim 1, wherein the light output surface of the first converging lens includes a bowl-shaped cavity.

30. The lens device of claim 1, being configured for emitting light having a full width half maximum beam width being within a range of between about 13 degrees and about 16 degrees.

31. The lens device of claim 1, being configured for emitting light having a full width half maximum beam width being about 15 degrees.

32. A lighting system, comprising:
a lighting module including a semiconductor light-emitting device configured for emitting light emissions along a central light emission axis;
a first lens module including a first converging lens having a light output surface being spaced apart along a lens axis from a light input surface, the first converging lens further having a total internal reflection side surface being spaced apart around the lens axis and having a frusto-conical shape extending between the light input and output surfaces of the first converging lens;
wherein a portion of the light input surface of the first converging lens includes a light input cavity being bounded by a perimeter, the light input cavity having a central axis and being generally shaped as a portion of a spheroid;
wherein the light input cavity has a plurality of grooves each respectively following a spline along the light input surface that intersects with the central axis of the light input cavity and with a respective point on the perimeter; and wherein each of the respective points are mutually spaced apart around the perimeter of the light input cavity; and
wherein the lighting system is configured for aligning the lens axis with the central light emission axis.

33. The lighting system of claim 32, including another lighting module including another semiconductor light-emitting device configured for emitting light emissions along another central light emission axis;
a second lens module including a second converging lens having another light output surface being spaced apart along another lens axis from another light input surface, the second converging lens further having a total internal reflection side surface being spaced apart around the another lens axis and having a frusto-conical shape extending between the another light input surface and the another light output surface of the second converging lens;
wherein a portion of the another light input surface of the second converging lens includes a second light input cavity being bounded by a second perimeter, the second light input cavity having another central axis and being generally shaped as a portion of a spheroid;
wherein the second light input cavity has a plurality of grooves each respectively following a spline along the another light input surface that intersects with the another central axis of the second light input cavity and with a respective second point on the second perimeter; and wherein each of the respective second points are mutually spaced apart around the second perimeter of the second light input cavity; and
wherein the lighting system is configured for aligning the another lens axis with the another central light emission axis.

34. A lighting system, comprising:
a lighting module including a semiconductor light-emitting device configured for emitting light emissions along a central light emission axis;
a first lens module including a first converging lens, the first converging lens being configured for causing convergence of some of the light emissions of the semiconductor light-emitting device to form converged light emissions along the central light emission axis having a first half-width-half-maximum (HWHM), the first converging lens having a first light output surface being spaced apart along a first lens axis from a first light input surface, the first converging lens further having a first total internal reflection side surface being spaced apart around the first lens axis and having a first frusto-conical shape extending between the first light input and output surfaces of the first converging lens;
a second lens module including a second converging lens, the second converging lens being configured for causing convergence of some of the light emissions of the semiconductor light-emitting device to form converged light emissions along the central light emission axis having a second HWHM being different than the first HWHM, the second converging lens having a second light output surface being spaced apart along a second lens axis from a second light input surface, the second converging lens further having a second total internal reflection side surface being spaced apart around the second lens axis and having a second frusto-conical shape extending between the second light input and output surfaces of the second converging lens; and
a third lens module including a first diverging lens having a third lens axis, the first diverging lens being configured for causing divergence of some of the converged light emissions away from the third lens axis by a third HWHM to form diverged light emissions that diverge away from the central light emission axis, the first diverging lens having a third light output surface being spaced apart along the third lens axis from a third light input surface, the third light input surface including a first lens screen having lenticular or microprismatic features;
wherein a portion of the first light input surface of the first converging lens includes a first light input cavity being bounded by a first perimeter, the first light input cavity having a first central axis and being generally shaped as a portion of a spheroid, the first light input cavity having a plurality of primary grooves each respectively following a primary spline along the first light input surface that intersects with the first central axis of the first light input cavity and with a respective primary point on the first perimeter, each of the respective primary points being mutually spaced apart around the first perimeter of the first light input cavity; and
wherein a portion of the second light input surface of the second converging lens includes a second light input cavity being bounded by a second perimeter, the second light input cavity having a second central axis and being generally shaped as a portion of another spheroid, the second light input cavity having a plurality of secondary grooves each respectively following a secondary spline along the second light input surface that intersects with the second central axis of the second light input cavity and with a respective secondary point on the second perimeter, each of the respective secondary points being mutually spaced apart around the second perimeter of the second light input cavity; and wherein the lighting system is configured for detachably installing the first lens module or the second lens module in the lighting module between the semiconductor light-emitting device and the third lens module; and wherein the lighting system is configured for aligning the first or second lens axis with the central light emission axis and the third lens axis.

35. The lighting system of claim 34, wherein the primary spline being followed by each one of the plurality of the primary grooves is the same primary spline, and wherein the primary spline includes four control points.

36. The lighting system of claim 35, wherein the primary spline passes through each one of the four control points.

37. The lighting system of claim 36, wherein the primary spline is a Catmull-Rom spline.

38. The lighting system of claim 36, wherein a first one of the four control points is located at a one of the respective primary points on the first perimeter; and wherein a fourth one of the four control points is located at the first central axis of the first light input cavity; and wherein a second one of the four control points is adjacent to the first control point; and wherein a third one of the four control points is adjacent to the fourth control point.

39. The lighting system of claim 38, wherein the primary spline includes a first inflection point and a second inflection point.

40. The lighting system of claim 39, wherein the first inflection point is located at the second control point; and wherein the second inflection point is located at the third control point.

41. The lighting system of claim 40, wherein the primary spline spans a first spline axis extending between the first control point and the fourth control point; and wherein the first inflection point is located on one side of the first spline axis; and wherein the second inflection point is located on an opposite side of the first spline axis.

42. The lighting system of claim 41, wherein a straight arrow originating at the first control point and passing through the second control point extends away from the first spline axis at an angle being within a range of about 10 degrees and about 20 degrees.

43. The lighting system of claim 42, wherein another straight arrow originating at the second control point and passing through the third control point extends away from the first spline axis at an angle being within a range of about 55 degrees and about 45 degrees.

44. The lighting system of claim 34, wherein the plurality of the primary grooves are mutually spaced apart around the first perimeter; and wherein each one of the plurality of the primary grooves intersects with the first central axis of the first light input cavity and with the first perimeter; and wherein the first light input cavity includes a plurality of un-grooved regions being mutually spaced apart around the first perimeter; and wherein each one of the plurality of the primary grooves is interposed between two of the plurality of the un-grooved regions of the first light input cavity.

45. The lighting system of claim 44, wherein the first light input cavity includes a plurality of raised regions being mutually spaced apart around the first perimeter; and wherein each one of the plurality of the primary grooves is interposed between two of the plurality of the raised regions of the first light input cavity.

46. The lighting system of claim 45, wherein each one of the plurality of the raised regions intersects with the first central axis and with the first perimeter.

47. The lighting system of claim 46, wherein each of the respective concave surfaces has a respective radius; and wherein the respective radii have lengths that vary along the primary spline; and wherein a length of each of the respective radii at the intersection of the primary spline with the first perimeter is greater than another length of each of the respective radii at the intersection of the primary spline with the first central axis of the first light input cavity.

48. The lighting system of claim 47, wherein the lengths of each of the respective radii gradually decrease from the intersection of the primary spline with the first perimeter to the intersection of the primary spline with the first central axis of the first light input cavity.

49. The lighting system of claim 48, wherein the length of each of the respective radii at the intersection of the primary spline with the first perimeter is within a range of between about 2 millimeters and about 1.5 millimeters; and wherein the another length of each of the respective radii at the intersection of the primary spline with the first central axis of the first light input cavity is within a range of between about 0.75 millimeter and about 0.25 millimeter.

50. The lighting system of claim 34, wherein each one of the plurality of the primary grooves forms a respective concave surface of the first light input cavity, each of the respective concave surfaces being generally shaped as a portion of: an ellipse having an ellipse axis being extended along the primary spline; or a circle having a circle axis being extended along the primary spline.

51. The lighting system of claim 50, wherein each of the respective concave surfaces has a respective radius, and wherein the respective radii have lengths that vary along the primary spline.

52. The lighting system of claim 34, wherein the first light output surface of the first converging lens includes a bowl-shaped cavity surrounding a central mound shaped as a portion of a spheroid.

53. The lighting system of claim 34, wherein the plurality of the primary grooves includes at least four of the primary grooves that respectively intersect with four of the plurality of the primary points being mutually spaced apart around the first perimeter of the first light input cavity.

54. The lighting system of claim 34, wherein the plurality of the primary grooves includes: a first primary groove following a first spline that intersects with the first central axis of the first light input cavity and with a first primary point on the first perimeter; and a second primary groove following a second spline that intersects with the first central axis of the first light input cavity and with a second primary point on the first perimeter; and a third primary groove following a third spline that intersects with the first central axis of the first light input cavity and with a third primary point on the first perimeter; and a fourth primary groove following a fourth spline that intersects with the first central axis of the first light input cavity and with a fourth primary point on the first perimeter.

55. The lighting system of claim 34, wherein the plurality of the primary grooves are mutually spaced apart around the first perimeter.

56. The lighting system of claim 55, wherein each one of the plurality of the primary grooves intersects with the first central axis of the first light input cavity and with the first perimeter.

57. The lighting system of claim 34, wherein the first light output surface of the first converging lens includes a bowl-shaped cavity.

58. The lighting system of claim 34, being configured for emitting light having a full width half maximum beam width being within a range of between about 13 degrees and about 16 degrees.

59. The lighting system of claim 34, being configured for emitting light having a full width half maximum beam width being about 15 degrees.

60. The lighting system of claim 34, wherein the lighting system further includes an additional lens module including an additional diverging lens having an additional lens axis, the additional diverging lens being configured for causing divergence of some of the converged light emissions away from the additional lens axis by an additional HWHM being different than the third HWHM to form additional diverged light emissions that diverge away from the central light emission axis, the additional diverging lens having an additional light output surface being spaced apart along the additional lens axis from an additional light input surface, the additional light input surface including an additional lens screen having lenticular or microprismatic features; and wherein the lighting system is configured for detachably installing the first lens module or the second lens module in the lighting module between the semiconductor light-emitting device and the additional lens module; and wherein the lighting system is configured for aligning the first or second lens axis with the central light emission axis and the additional lens axis.

61. The lighting system of claim 60, wherein the lighting system is configured for interchangeably installing either the first lens module or the second lens module in the lighting module between the semiconductor light-emitting device and either the third lens module or the additional lens module.

62. The lighting system of claim 34, further including a housing being configured for positioning the lighting module for emission of the light emissions from the semiconductor light-emitting device along the central light emission axis.

63. The lighting system of claim 62, further including a carrier being configured for positioning the first or second lens module in the housing with the first or second lens axis being aligned with the central light emission axis.

64. The lighting system of claim 63, further including a primary visible light reflector configured for being positioned between the housing and the carrier, wherein the primary visible light reflector is configured for redirecting some of the light emissions of the semiconductor light-emitting device along the central light emission axis.

65. The lighting system of claim 34, further including:
a second lighting module including a second semiconductor light-emitting device configured for emitting further light emissions along a second central light emission axis;
a fourth lens module including a third converging lens, the third converging lens being configured for causing convergence of some of the light emissions of the second semiconductor light-emitting device to form further converged light emissions along the second central light emission axis having a fourth HWHM, the third converging lens having a fourth light output surface being spaced apart along a fourth lens axis from a fourth light input surface, the third converging lens further having a third total internal reflection side surface being spaced apart around the fourth lens axis and having a third frusto-conical shape extending between the fourth light input and output surfaces of the third converging lens;
a fifth lens module including a fourth converging lens, the fourth converging lens being configured for causing convergence of some of the light emissions of the second semiconductor light-emitting device to form further converged light emissions along the second central light emission axis having a fifth HWHM being different than the fourth HWHM, the fourth converging lens having a fifth light output surface being spaced apart along a fifth lens axis from a fifth light input surface, the fourth converging lens further having a fourth total internal reflection side surface being spaced apart around the fifth lens axis and having a fourth frusto-conical shape extending between the fifth light input and output surfaces of the fourth converging lens; and a sixth lens module including a second diverging lens having a sixth lens axis, the second diverging lens being configured for causing divergence of some of the converged light emissions away from the sixth lens axis by a sixth HWHM to form diverged light emissions, the second diverging lens having a sixth light output surface being spaced apart along the sixth lens axis from a sixth light input surface, the sixth light input surface including a second lens screen having lenticular or microprismatic features;

wherein a portion of the fourth light input surface of the third converging lens includes a third light input cavity being bounded by a third perimeter, the third light input cavity having a third central axis and being generally shaped as a portion of a further spheroid, the third light input cavity having a plurality of tertiary grooves each respectively following a tertiary spline along the fourth light input surface that intersects with the third central axis of the third light input cavity and with a respective tertiary point on the third perimeter, each of the respective tertiary points being mutually spaced apart around the third perimeter of the third light input cavity; and wherein a portion of the fifth light input surface of the fourth converging lens includes a fourth light input cavity being bounded by a fourth perimeter, the fourth light input cavity having a fourth central axis and being generally shaped as a portion of an additional spheroid, the fourth light input cavity having a plurality of quaternary grooves each respectively following a quaternary spline along the fifth light input surface that intersects with the fourth central axis of the fourth light input cavity and with a respective quaternary point on the fourth perimeter, each of the respective quaternary points being mutually spaced apart around the fourth perimeter of the fourth light input cavity; and wherein the lighting system is configured for detachably installing the fourth lens module or the fifth lens module in the second lighting module between the second semiconductor light-emitting device and the sixth lens module; and wherein the lighting system is configured for aligning the fourth or fifth lens axis with the second central light emission axis and the sixth lens axis.

66. The lighting system of claim 65, wherein the lighting system is configured for positioning the semiconductor light-emitting device as being spaced apart on a longitudinal axis away from the second semiconductor light-emitting device for causing the central light emission axis to be spaced apart from the second central light emission axis.

67. The lighting system of claim 66, further including a housing, wherein the housing is configured for positioning the lighting module for emission of the light emissions from the semiconductor light-emitting device along the central light emission axis, and wherein the housing is configured for positioning the second lighting module for emission of the further light emissions from the second semiconductor light-emitting device along the second central light emission axis.

68. The lighting system of claim 67, further including a carrier, wherein the carrier is configured for positioning the first or second lens module in the housing with the first or second lens axis being aligned with the central light emission axis, and wherein the carrier is configured for positioning the fourth or fifth lens module in the housing with the fourth or fifth lens axis being aligned with the second central light emission axis.

69. The lighting system of claim 68, further including a primary visible light reflector configured for being positioned between the housing and the carrier, wherein the primary visible light reflector is configured for redirecting some of the light emissions of the semiconductor light-emitting device along the central light emission axis, and wherein the primary visible light reflector is configured for redirecting some of the further light emissions of the second semiconductor light-emitting device along the second central light emission axis.

70. The lighting system of claim 65, wherein the lighting system is configured for interchangeably installing either: the first lens module in the lighting module and the fourth lens module in the second lighting module; or the second lens module in the lighting module and the fifth lens module in the second lighting module.

71. The lighting system of claim 70, wherein the first lens module is integral with the fourth lens module, and wherein the second lens module is integral with the fifth lens module.

72. The lighting system of claim 65, wherein the lighting system further includes a seventh lens module including a third diverging lens having a seventh lens axis, the third diverging lens being configured for causing divergence of some of the converged light emissions away from the seventh lens axis by a seventh HWHM, being different than the third HWHM, to form additional diverged light emissions, the third diverging lens having a seventh light output surface being spaced apart along the seventh lens axis from a seventh light input surface, the seventh light input surface including a third lens screen having lenticular or microprismatic features; and wherein the lighting system is configured for detachably installing the first lens module or the second lens module in the lighting module between the semiconductor light-emitting device and the seventh lens module; and wherein the lighting system is configured for aligning the first or second lens axis with the central light emission axis and the seventh lens axis.

73. The lighting system of claim 72, wherein the lighting system further includes an eighth lens module including a fourth diverging lens having an eighth lens axis, the fourth diverging lens being configured for causing divergence of some of the further converged light emissions away from the eighth lens axis by an eighth HWHM, being different than the sixth HWHM, to form additional diverged light emissions, the fourth diverging lens having an eighth light output surface being spaced apart along the eighth lens axis from an eighth light input surface, the eighth light input surface including a fourth lens screen having lenticular or microprismatic features; and wherein the lighting system is configured for detachably installing the fourth lens module or the fifth lens module in the second lighting module between the second semiconductor light-emitting device and the eighth lens module; and wherein the lighting system is configured for aligning the fourth or fifth lens axis with the second central light emission axis and the eighth lens axis.

74. The lighting system of claim 73, wherein the lighting system is configured for interchangeably installing either: the third lens module in the lighting module and the sixth lens module in the second lighting module; or the seventh lens module in the lighting module and the eighth lens module in the second lighting module.

75. The lighting system of claim 74, wherein the third lens module is integral with the sixth lens module, and wherein the seventh lens module is integral with the eighth lens module.

76. The lighting system of claim 74, wherein the lighting system is configured for interchangeably installing either: the first lens module in the lighting module and the fourth lens module in the second lighting module; or the second lens module in the lighting module and the fifth lens module in the second lighting module.

77. The lighting system of claim 76, wherein the first lens module is integral with the fourth lens module, and wherein the second lens module is integral with the fifth lens module.

* * * * *